(12) United States Patent
Tsuyuki

(10) Patent No.: US 9,978,857 B2
(45) Date of Patent: May 22, 2018

(54) SEMICONDUCTOR DEVICE

(71) Applicant: Renesas Electronics Corporation, Tokyo (JP)

(72) Inventor: Hajime Tsuyuki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

(21) Appl. No.: 15/418,409

(22) Filed: Jan. 27, 2017

(65) Prior Publication Data
US 2017/0278956 A1    Sep. 28, 2017

(30) Foreign Application Priority Data

Mar. 23, 2016  (JP) ................ 2016-057948

(51) Int. Cl.
*H01L 29/739* (2006.01)
*H01L 29/66* (2006.01)

(52) U.S. Cl.
CPC .... *H01L 29/7396* (2013.01); *H01L 29/66348* (2013.01)

(58) Field of Classification Search
CPC ....... H01L 29/66; H01L 29/73; H01L 29/739; H01L 29/7396; H01L 29/66348; H01L 29/08; H01L 29/06; H01L 29/10; H01L 29/417
USPC ................................................. 257/139
See application file for complete search history.

(56) References Cited

U.S. PATENT DOCUMENTS

| 8,546,847 | B2 | 10/2013 | Watanabe et al. |
| 8,653,588 | B2 | 2/2014 | Watanabe et al. |
| 2012/0292662 | A1* | 11/2012 | Matsuura .......... H01L 29/66348 257/139 |

FOREIGN PATENT DOCUMENTS

| JP | 2011-119416 A | 6/2011 |
| JP | 2013-026365 A | 2/2013 |

* cited by examiner

*Primary Examiner* — Chuong A Luu
(74) *Attorney, Agent, or Firm* — McGinn IP Law Group, PLLC

(57) ABSTRACT

To improve the performance of a semiconductor device having an IGBT. A p$^+$-type collector layer is formed on the back surface side of a semiconductor substrate. A back electrode is formed over the back surface of the semiconductor substrate. Within the semiconductor substrate, an n$^-$-type drift region is formed over the p$^+$-type collector layer, and a first IGBT cell region and a second IGBT cell region are formed on the surface side of the semiconductor substrate. An embedded insulating film is formed on the surface side of the semiconductor substrate between the first IGBT cell region and the second IGBT cell region. An interlayer insulating film is formed over the first IGBT cell region, the second IGBT cell region, and the embedded insulating film. An emitter electrode is formed over the interlayer insulating film.

20 Claims, 37 Drawing Sheets

SEMICONDUCTOR DEVICE

CROSS-REFERENCE TO RELATED APPLICATIONS

The disclosure of Japanese Patent Application No. 2016-057948 filed on Mar. 23, 2016 including the specification, drawings and abstract is incorporated herein by reference in its entirety.

BACKGROUND

The present invention relates to a semiconductor device, and is suitably available to, for example, a semiconductor device having an IGBT (Insulated Gate Bipolar Transistor).

As a power semiconductor device, there is known a semiconductor device having an IGBT.

A technology related to a semiconductor device having an IGBT has been described in Japanese Unexamined Patent Application Publication No. 2011-119416 (Patent Document 1) and Japanese Unexamined Patent Application Publication No. 2013-26365 (Patent Document 2).

RELATED ART DOCUMENTS

Patent Documents

[Patent Document 1] Japanese Unexamined Patent Application Publication No. 2011-119416
[Patent Document 2] Japanese Unexamined Patent Application Publication No. 2013-26365

SUMMARY

Even in a semiconductor device having an IGBT, it is desirable to improve its performance as much as possible.

Other objects and novel features of the present invention will become apparent from the description of the present specification and the accompanying drawings.

According to one aspect of the present invention, a semiconductor device has a first IGBT cell region and a second IGBT cell region formed on the first main surface side of a semiconductor substrate and disposed apart from each other in a first direction in plan view, and an embedded insulating film formed on the first main surface side of the semiconductor substrate and disposed between the first IGBT cell region and the second IGBT cell region in plan view. The semiconductor device further has an interlayer insulating film formed over the first IGBT cell region, the second IGBT cell region, and the embedded insulating film, and an emitter electrode formed over the interlayer insulating film.

According to one aspect of the present invention, it is possible to improve the performance of a semiconductor device.

DETAILED DESCRIPTION

Figure 1:
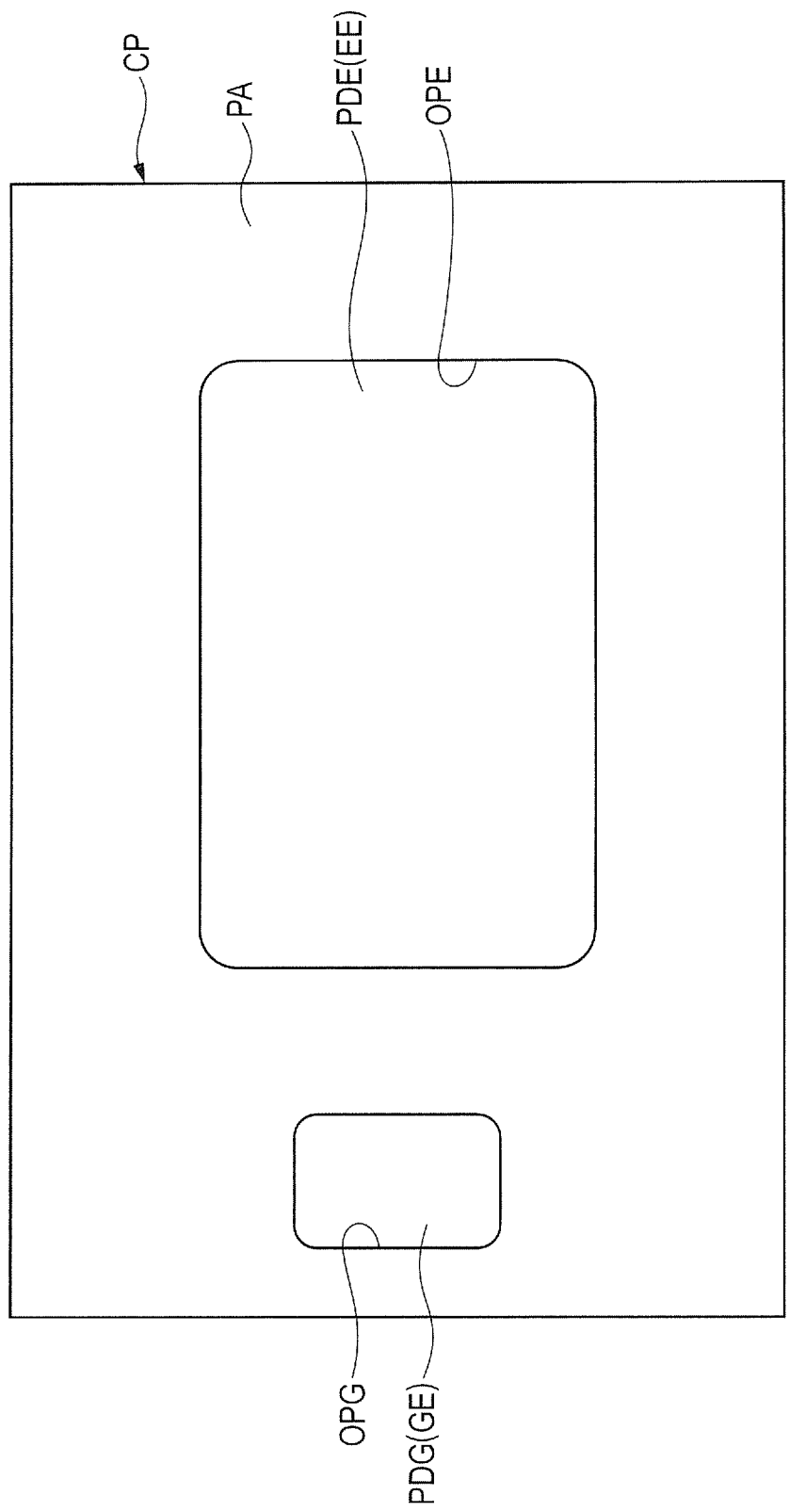
FIG. 1 is an overall plan diagram on the upper surface side of a semiconductor device according to one embodiment.

The invention will be described by being divided into a plurality of sections or embodiments whenever circumstances require it for convenience in the following embodiments. However, unless otherwise specified in particular, they are not irrelevant to one another. One thereof has to do with modifications, details, supplementary explanations, etc. of some or all of the other. Also, when reference is made to the number of elements or the like (including the number of pieces, numerical values, quantity, range, etc.) in the following embodiments, the number thereof is not limited to a specific number and may be greater than or less than or equal to the specific number except for where otherwise specified in particular and definitely limited to the specific number in principle, etc. It is further needless to say that in the following embodiments, components (also including element steps, etc.) employed therein are not always essential except for where otherwise specified in particular and considered to be definitely essential in principle, etc. Similarly, when reference is made to the shapes, positional relations and the like of the components or the like in the following embodiments, they will include ones substantially analogous or similar to their shapes or the like except for where otherwise specified in particular and considered not to be definitely so in principle, etc. This is similarly applied even to the above-described numerical values and range.

Preferred embodiments will hereinafter be described in detail based on the accompanying drawings. Incidentally, in all of the drawings for explaining the embodiments, the same reference numerals are respectively attached to components having the same function, and their repetitive description will be omitted. In the following embodiments, the description of the same or like parts will not be repeated in principle except for when required in particular.

Also, in the drawings used in the embodiments, even sectional diagrams may be hatched to make the drawings easy to be seen. Further, even plan diagrams may be hatched to make the drawings easy to be seen.

Embodiment 1

<Overall Structure of Semiconductor Device>

A semiconductor device according to the present embodiment will be described with reference to the accompanying drawings.

Figure 2:
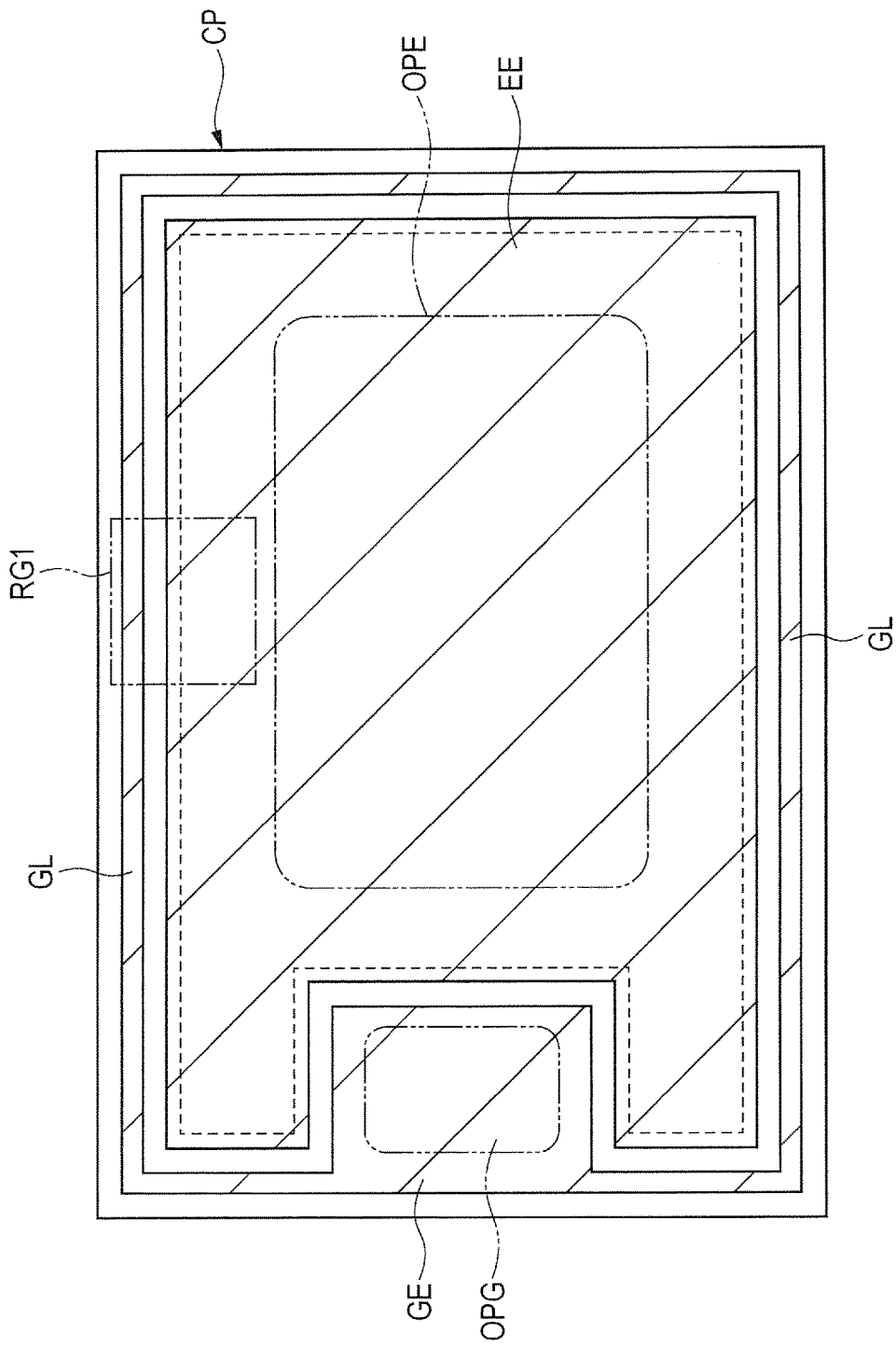
FIG. 2 is a plan perspective diagram of the semiconductor device according to the one embodiment.
Figure 3:
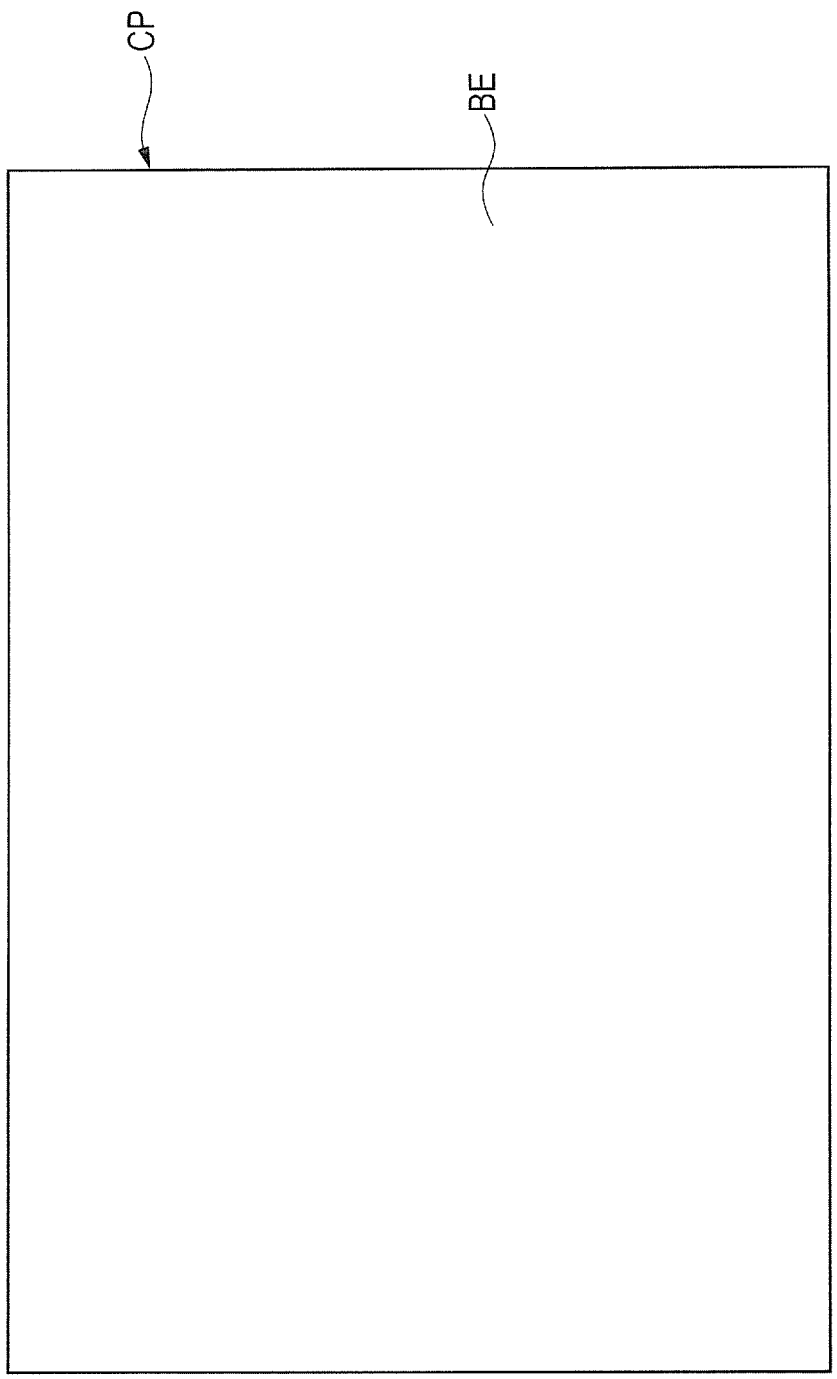
FIG. 3 is an overall plan diagram on the back surface side of the semiconductor device according to the one embodiment.

FIG. 1 is an overall plan diagram of the semiconductor device (semiconductor chip) CP according to the present embodiment. The overall plan diagram on the upper surface side of the semiconductor device CP is shown therein. FIG. 2 is a plan perspective diagram of the semiconductor device CP according to the present embodiment. There is shown in FIG. 1, a plan diagram through which an insulating film PA being a surface protection film is seen. FIG. 3 is an overall plan diagram of the semiconductor device CP according to the present embodiment. The overall plan diagram on the back surface side of the semiconductor device CP is shown therein.

As shown in FIGS. 1 through 3, the semiconductor device CP according to the present embodiment has an upper surface being one main surface and a back surface (lower surface) being a main surface on the side opposite to the upper surface. The upper surface side of the semiconductor device CP is shown in FIGS. 1 and 2. The back surface side of the semiconductor device CP is shown in FIG. 3. The insulating film PA is, however, seen through in FIG. 2.

As shown in FIG. 2, an emitter electrode (electrode for the emitter) EE, a gate electrode (electrode for the gate) GE, and a gate wiring (wiring for the gate) GL are formed in the main surface of the semiconductor device CP. The emitter electrode EE, the gate electrode GE, and the gate wiring GL are formed in the same layer as each other and formed over an interlayer insulating film (corresponding to an interlayer insulating film IL to be described later) formed over a semiconductor substrate SS. Incidentally, the semiconductor substrate SS which configures the semiconductor device CP is not illustrated in FIGS. 1 through 3, but shown in FIGS. 6 and 7 to be described later. The emitter electrode EE, the gate electrode GL, and the gate wiring GL are respectively comprised of, for example, a metal film comprised mainly of aluminum (Al). That is, the emitter electrode EE, the gate electrode GE, and the gate wiring GL can be formed by patterning a common metal film.

A cell forming region CR formed with an IGBT (Insulated Gate Bipolar Transistor) is provided in a main portion of an active part (active region) of the semiconductor substrate SS configuring the semiconductor device CP. The emitter electrode EE is disposed over the cell forming region CR so as to cover the entire cell forming region CR. The emitter electrode EE is electrically coupled to the emitter of the IGBT formed in the cell forming region CR.

The emitter electrode EE and the gate electrode GE are separated from each other, and the emitter electrode EE and the gate wiring GL are separated from each other. On the other hand, the gate electrode GE and the gate wiring GL are formed integrally with each other. Thus, the gate electrode GE and the gate wiring GL are electrically coupled to each other. The width of the gate electrode GE is larger than that of the gate wiring GL. In the case of FIG. 2, in plan view, the gate wiring GL is dispose so as to circulate along the outer periphery of the semiconductor device CP and surround the periphery of the emitter electrode EE. The gate wiring GL is electrically coupled to the gate (corresponding to a trench gate electrode TG1 to be described later) of the IGBT formed in the cell forming region CR. Thus, the gate electrode GE is electrically coupled via the gate wiring GL to the gate of the IGBT formed in the cell forming region CR.

Incidentally, when a reference is made to a "plan view" or "as viewed in a planar manner", or the like, it refers to when seen in a plane parallel to the main surface of the semiconductor substrate SS.

The insulating film PA as the surface protection film is formed at the top layer on the upper surface side of the semiconductor device CP. The emitter electrode EE is partly (centrally) exposed from an opening OPE for the emitter defined in the insulating film PA. A pad PDE for the emitter being a bonding pad for the emitter is formed by the exposed portion of the emitter electrode EE. Also, the gate electrode GE is partly (centrally) exposed from an opening OPG for the gate defined in the insulating film PA. A pad PDG for the gate being a bonding pad for the gate is formed by the exposed portion of the gate electrode GE. Further, as can be seen even from FIG. 3, the top layer on the back surface side of the semiconductor device CP corresponds to a back electrode BE, and the back electrode BE is formed over the entire back surface of the semiconductor device CP.

Therefore, the semiconductor device CP has the pad PDE as a first terminal and the pad PDG as a control terminal on the upper surface side as shown in FIG. 1. Further, the semiconductor device CP has the back electrode BE as a second terminal on the back surface side as shown in FIG. 3. The pad PDE, the pad PDG, and the back electrode BE can function as external coupling terminals of the semiconductor device CP. When the semiconductor device CP is packaged, a conductive coupling member such as a bonding wire or a metal plate or the like can be coupled to the pads PDG and PDE of the semiconductor device.

The IGBT is formed in the semiconductor substrate SS configuring the semiconductor device CP as a semiconductor element which controls conduction between the first terminal (pad PDE) formed on the upper surface side of the semiconductor device CP and the second terminal (back electrode BE) formed on the back surface side of the semiconductor device CP. Therefore, the semiconductor device CP is configured in such a manner that the IGBT formed in the semiconductor substrate SS is controlled to control conduction between the first terminal on the upper surface side and the second terminal on the back surface side and thereby cause a current to flow between the first terminal and the second terminal. Therefore, the semiconductor device CP can be used as, for example, a switching element through which a large current flows. The pad PDG functions as a terminal for control which controls conduction between the first terminal and the second terminal.

<Concerting Internal Structure of Semiconductor Device>

An internal structure of the semiconductor device CP will next be described with reference to the accompanying drawings.

Figure 4:
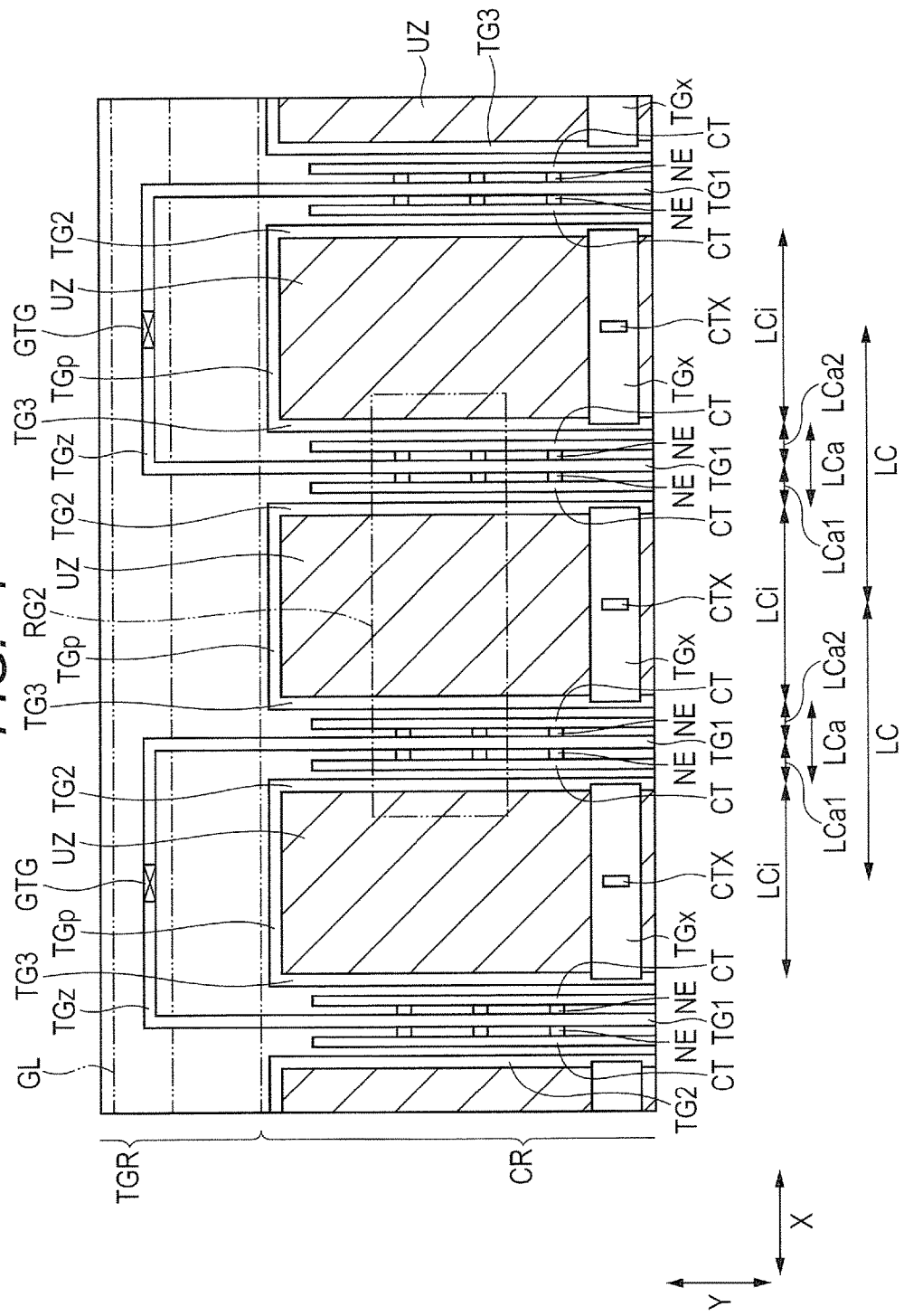
FIG. 4 is a fragmentary plan diagram of the semiconductor device according to the one embodiment.
Figure 5:
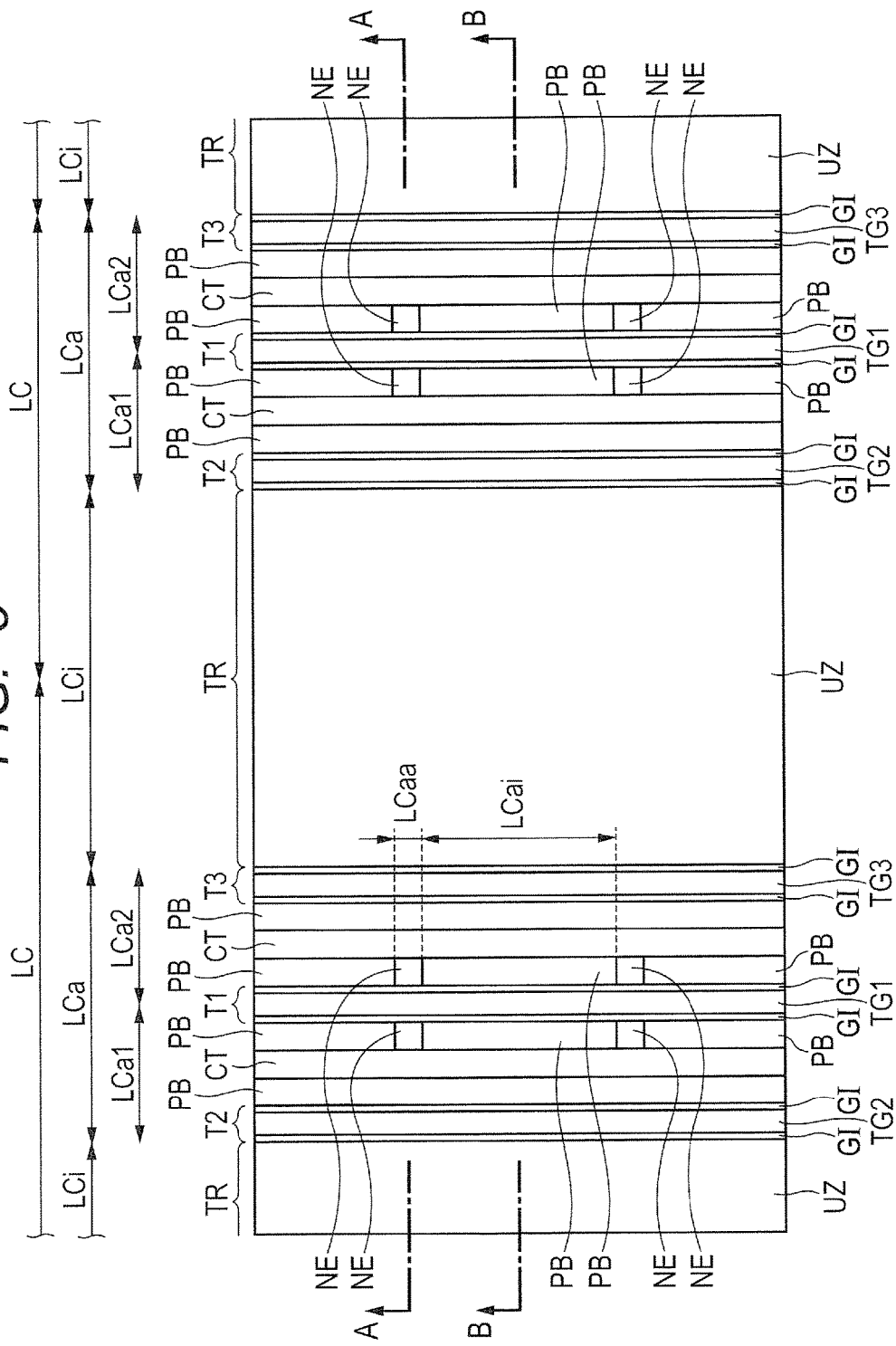
FIG. 5 is a fragmentary plan diagram of the semiconductor device according to the one embodiment.
Figure 6:
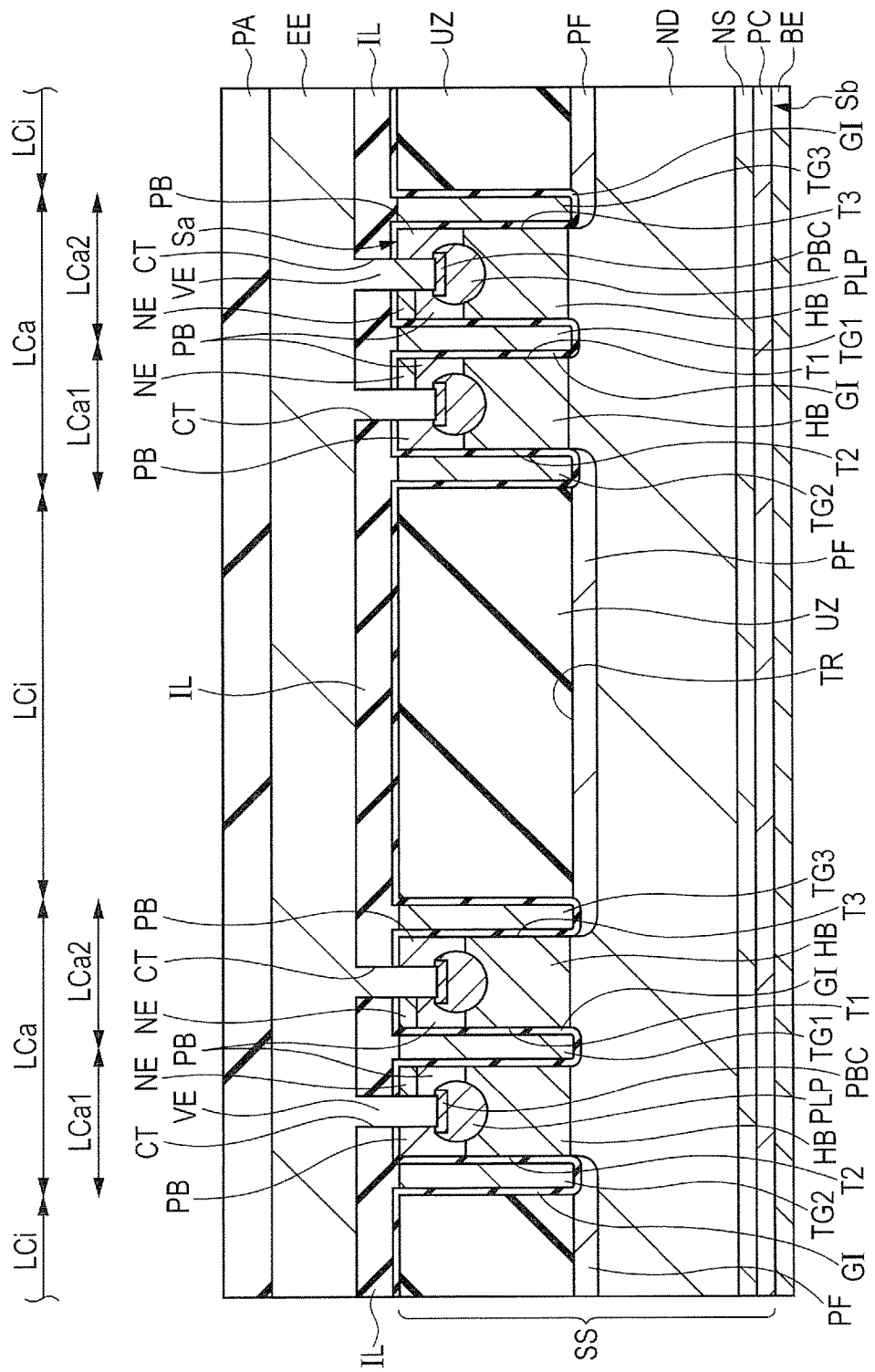
FIG. 6 is a fragmentary sectional diagram of the semiconductor device according to the one embodiment.
Figure 7:
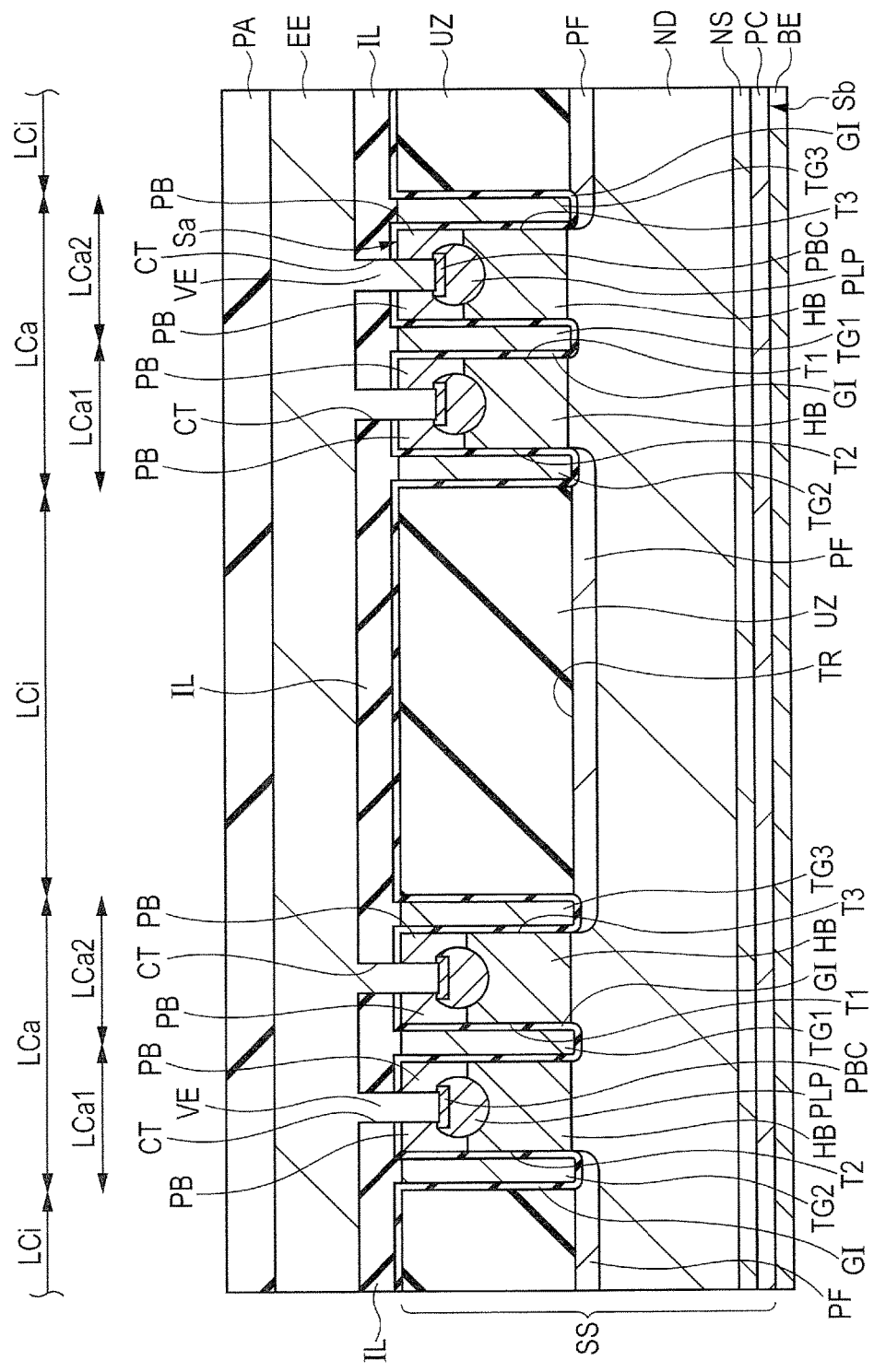
FIG. 7 is a fragmentary sectional diagram of the semiconductor device according to the one embodiment.

FIGS. 4 and 5 are fragmentary plan diagrams of the semiconductor device CP according to the present embodiment, and FIGS. 6 and 7 are fragmentary sectional diagrams of the semiconductor device CP according to the present embodiment. A partly enlarged plan diagram showing a region RG1 shown in FIG. 2 in an enlarged form is illustrated in FIG. 4. Further, a partly enlarged plan diagram showing a region RG2 in an enlarged form is illustrated in FIG. 5. While FIG. 4 is a plan diagram, an embedded insulating film UZ is hatched to make the drawing easy to be seen. Further, FIG. 6 corresponds to a sectional diagram at a position taken along line A-A of FIG. 5, and FIG. 7 corresponds to a sectional diagram at a position taken along line B-B of FIG. 5.

As shown in FIGS. 4 and 5, unit cell regions (linear unit cell regions) LC are periodically arranged in the cell forming region CR in an X direction. That is, the unit cell regions LC are repeated in plural form in the X direction to configure the cell forming region CR. That is, the unit cell regions LC are unit cells of repeating units.

Each of the unit cell regions LC has an EGE type (emitter-gate-emitter type) active cell region (IGBT cell region) LCa and two inactive cell regions LCi. The two inactive cell regions LCi are disposed on both sides with the active cell region LCa interposed therebetween in the X direction. When viewed from another angle, the two active cell regions LCa are disposed on both sides with the inactive cell region LCi interposed therebetween in the X direction. The active cell regions LCa and the inactive cell regions LCi respectively extend in a Y direction in plan view. The active cell region LCa is a region which functions as an IGBT (IGBT cell) and can be assumed to be an IGBT cell region.

Each of the unit cell regions LC is configured of a central active cell region LCa and a pair of half-width inactive cell regions LCi interposing the central active region LCa therebetween in the X direction. Thus, the two unit cell regions LC adjacent to each other in the X direction share one inactive cell region LCi. The half (half width) of the inactive cell region LCi belongs to one unit cell region LC, and the remaining half (half width) thereof belongs to the other unit cell region LC. However, even though the inactive cell region LCi is divided into the half width which belongs to one unit cell region LC and the other half width which belongs to the other unit cell region LC, the boundary or the like does not exist between those. They are merely divided virtually.

Thus, in the cell forming region CR, the unit cell regions LC are repeatedly disposed in plural numbers in the X direction. Viewed from another angle, the active cell regions LCa are periodically disposed in plural form at intervals in the X direction in the cell forming region CR, and the inactive cell region LCi (embedded insulating film UZ) is disposed between the active cell regions LCa adjacent to each other in the X direction. The active cell regions LCa adjacent to each other in the X direction are separated from each other in the X direction through the inactive cell region LCi (embedded insulating film UZ) interposed therebetween. Further, when viewed from another angle, the active cell regions LCa and the inactive cell regions LCi (embedded insulating films UZ) are alternately arranged (disposed) in the X direction in the cell forming region CR. Each inactive cell region LCi (embedded insulating film UZ) is disposed between the two active cell regions LCa adjacent to each other in the X direction through the inactive cell region LCi.

The active cell region LCa has a trench gate electrode TG1, a trench gate electrode (trench electrode) TG2, and a trench gate electrode (trench electrode) TG3. The trench gate electrode TG1, the trench gate electrode TG2, and the trench gate electrode TG3 respectively extend in the Y direction. The trench gate electrode TG1 is electrically coupled to the gate wiring GL and electrically coupled to the gate electrode GE through the gate wiring GL. The trench gate electrode TG2 and the trench gate electrode TG3 are not electrically coupled to the gate electrode GE but to the emitter electrode EE.

In each active cell region LCa, the trench gate electrode TG2 extending in the Y direction is disposed on one end side thereof in the X direction, the trench gate electrode TG3 extending in the Y direction is disposed on the other end side thereof in the X direction, and the trench gate electrode TG1 extending in the Y direction is disposed in the central part thereof in the X direction.

Incidentally, the Y direction is a direction crossing the X direction. Preferably, the Y direction is a direction perpendicular to the X direction. The X direction is a direction in which the unit cell regions LC are repeated, and the Y direction is a longitudinal direction (long-side direction, extending direction) of each of the unit cell region LC, the active cell region LCa, the inactive cell region LCi, and trenches T1, T2, and T3. Therefore, any of the unit cell region LC, the active cell region LCa, the inactive cell region LCi, and the trenches T1, T2, and T3 extends in the Y direction. The planar shape of the semiconductor device CP is substantially rectangular. The semiconductor device CP has a side substantially parallel to the X direction and a side substantially parallel to the Y direction.

The trench gate electrode TG1 is embedded via insulating films GI in the trench T1 formed in the semiconductor substrate SS. The trench gate electrode TG2 is embedded via the insulating films GI in the trench T2 formed in the semiconductor substrate SS. The trench gate electrode TG3 is embedded via the insulating films GI in the trench T3 formed in the semiconductor substrate SS. Therefore, the trenches T1, T2, and T3 and the trench gate electrodes TG1, TG2, and TG3 respectively extend in the Y direction. In each active cell region LCa, the trench T1 (trench gate electrode TG1) extending in the Y direction is disposed between the trench T2 (trench gate electrode TG2) extending in the Y direction and the trench T3 (trench gate electrode TG3) extending in the Y direction.

In each active cell region LCa, a contact trench (opening) CT extending in the Y direction is disposed between the trench T1 (trench gate electrode TG1) extending in the Y direction and the trench T2 (trench gate electrode TG2) extending in the Y direction. Further, in each active cell region LCa, a contact trench CT extending in the Y direction is disposed between the trench T1 (trench gate electrode TG1) extending in the Y direction and the trench T3 (trench gate electrode TG3) extending in the Y direction. The contact trench CT penetrates the interlayer insulating film IL and digs a part of the semiconductor substrate SS.

The embedded insulating film UZ embedded into the semiconductor substrate SS is provided in the inactive cell region LCi. A p-type semiconductor region (p-type floating region) PF is formed below the embedded insulating film UZ. The embedded insulating film UZ is formed in the whole of each inactive cell region LCi. Therefore, the trench T2 is adjacent to the embedded insulating film UZ on the side opposite to the side facing the trench T1. Further, the trench T3 is adjacent to the embedded insulating film UZ on the side opposite to the side facing the trench T1. When viewed from another angle, the trench gate electrode TG2 is adjacent to the embedded insulating film UZ on the side opposite to the side facing the trench gate electrode TG1. Further, the trench gate electrode TG3 is adjacent to the embedded insulating film UZ on the side opposite to the side facing the trench gate electrode TG1.

With the center of the trench gate electrode TG1 as a boundary, the active cell region LCa can be divided into an active sub cell region LCa1 being a region on the trench gate electrode TG2 side as viewed from the center of the trench gate electrode TG1, and an active sub cell region LCa2 being a region on the trench gate electrode TG3 side as viewed from the center of the trench gate electrode TG1. However, the boundary does not actually exist between the active sub cell region LCa1 and the active sub cell region LCa2, and the active cell region LCa is merely divided virtually into the two. The trench gate electrode TG1 is disposed in the center (center in the X direction) of the active cell region LCa.

In each of the active sub cell regions LCa1 and LCa2, a plurality of $n^+$-type emitter regions NE are provided above a p-type body region PB. In each of the active sub cell regions LCa1 and LCa2, the p-type body region PB is continuously formed in the Y direction in plan view. The $n^+$-type emitter regions NE are disposed at intervals from each other in the Y direction.

In the active sub cell regions LCa1 and LCa2, a region (plane region) formed with $n^+$-type emitter regions NE, i.e., an active section LCaa, and a region (plane region) formed with no $n^+$-type emitter regions NE, i.e., an inactive section LCai are alternately provided periodically in the Y direction. FIG. 6 corresponds to the cross section of the active section LCaa, and FIG. 7 corresponds to the cross section of the inactive section LCai. The active section LCaa in the active sub cell region LCa1, and the active section LCaa in the active sub cell region LCa2 are adjacent to each other in the X direction. The inactive section LCai in the active sub cell region LCa1 and the inactive section LCai in the active sub cell region LCa2 are adjacent to each other in the X direction.

Further, the gate wiring GL is disposed at a peripheral outside portion (gate drawing region TGR) of the cell forming region CR. The trench gate electrode TG1 extends from within the cell forming region CR to the gate wiring GL. Therefore, the trench gate electrode TG1 principally extends within the cell forming region CR in the Y direction, but further extends to the peripheral outside portion of the cell forming region CR. Further, at the peripheral outside portion of the cell forming region CR, the ends (ends in the Y direction) of the two trench gate electrodes TG1 adjacent to each other are coupled by an end coupling trench gate electrode TGz formed integrally with their ends and extending in the X direction. The end coupling trench gate electrode TGz is embedded into a trench coupled to the trench T1 and extending in the X direction.

The end coupling trench gate electrode TGz overlaps with the gate wiring GL in plan view. Further, the end coupling trench gate electrode TGz is electrically coupled to the gate wiring GL through a coupling portion GTG provided at a position where it overlaps with the end coupling trench gate electrode TGz in plan view. The coupling portion GTG is comprised of a contact hole formed in the interlayer insulating film IL and the gate wiring GL to be a portion embedded into the contact hole. That is, the gate wiring GL corresponding to the portion embedded into the contact hole defined in the interlayer insulating film IL is coupled to the end coupling trench gate electrode TGz, so that the trench gate electrode TG1 is electrically coupled to the gate wiring GL.

The trench gate electrode TG2 and the trench gate electrode TG3 are disposed on both sides of the inactive cell region LCi (embedded insulating film UZ) with the inactive cell region LCi interposed therebetween. The trench gate electrode TG2 and the trench gate electrode TG3 disposed on both sides of the inactive cell region LCi (embedded insulating film UZ) with the inactive cell region LCi interposed therebetween are coupled by an end coupling trench gate electrode TGp formed integrally with them and extending in the X direction. The end coupling trench gate electrode TGp is embedded into a trench coupled to the trenches T2 and T3 and extending in the X direction. Further, the trench gate electrode TG2 and the trench gate electrode TG3 disposed on both sides of the inactive cell region LCi (embedded insulating film UZ) with the inactive cell region LCi interposed therebetween are coupled by an emitter coupling portion TGx formed integrally with them and overriding over the embedded insulating film UZ to extend in the X direction. Since the emitter coupling portion TGx extends over the embedded insulating film UZ, the embedded insulating film UZ exists even below the emitter coupling portion TGx in FIG. 4. Further, the emitter coupling portion TGx is electrically coupled to the emitter electrode EE through a coupling portion CTX provided at a position where it overlaps with the emitter coupling portion TGx in plan view. The coupling portion CTX is comprised of a contact hole formed in the interlayer insulating film IL and the emitter electrode EE to be a portion embedded into the contact hole. That is, the emitter electrode EE corresponding to the portion embedded in the contact hole formed in the interlayer insulating film IL is coupled to the emitter coupling portion TGx, so that the emitter electrode EE is electrically coupled to the emitter coupling portion TGx. Accordingly, the emitter electrode EE is electrically coupled to the trench gate electrodes TG2 and TG3 through the emitter coupling portion TGx.

Thus, the trench gate electrodes TG1 respectively included in the unit cell regions LC formed in the cell forming region CR are electrically coupled to the common gate wiring GL and thereby electrically coupled to each other. Further, the trench gate electrodes TG1 are electrically coupled to the gate electrode GE through the gate wiring GL. Besides, the trench gate electrodes TG2 and TG3 respectively included in the unit cell regions LC formed in the cell forming region CR are electrically coupled to the common emitter electrode EE and thereby electrically coupled to each other.

Next, a sectional structure of the semiconductor device CP will further be described with reference to FIGS. 6 and 7.

As shown even in FIGS. 6 and 7, the semiconductor substrate SS configuring the semiconductor device CP is comprised of n-type single crystal silicon or the like introduced with an n-type impurity such as phosphorus (P) or the like. The semiconductor substrate SS has a surface Sa being one main surface, and a back surface Sb being a main surface on the side opposite to the surface Sa.

A p$^+$-type collector layer (p$^+$-type collector region, p$^+$-type semiconductor region) PC having a prescribed thickness is formed at the bottom of the semiconductor substrate SS, i.e., on the back surface Sb side of the semiconductor substrate SS. The p$^+$-type collector layer PC is of a p-type semiconductor region (semiconductor layer) introduced with a p-type impurity and can be formed over the entire back surface Sb of the semiconductor substrate SS. Then, the back electrode BE is formed over the entire back surface Sb of the semiconductor substrate SS so as to contact the p$^+$-type collector layer PC. The back electrode BE is a collector electrode.

Further, in the semiconductor substrate SS, an n-type field stop layer (n-type semiconductor region) NS is formed on the side, which is opposite to the side adjacent to the back electrode BE, of the p$^+$-type collector layer PC so as to contact the p$^+$-type collector layer PC. The n-type field stop layer NS is of an n-type semiconductor region (semiconductor layer) introduced with an n-type impurity and has an impurity concentration higher than that of an n$^-$-type drift region (n$^-$-type drift layer) ND. Therefore, the p$^+$-type collector layer PC is adjacent to the back electrode BE and adjacent to the n-type field stop layer NS on the side opposite to the side adjacent to the back electrode BE. A laminated structure of the p$^+$-type collector layer PC and the n-type field stop layer NS can be formed over the entire back surface Sb of the semiconductor substrate SS.

Since the n-type field stop layer NS can function as a field stop layer which prevents a depletion layer extending from the surface side of the semiconductor substrate SS from reaching the p$^+$-type collector layer PC, although it can also be omitted, the n-type field stop layer NS is more preferably formed. When the n-type field stop layer NS is omitted, the upper surface (surface on the side opposite to the side adjacent to the back electrode BE) of the p$^+$-type collector layer PC is brought into contact with the n$^-$-type drift region ND.

The back electrode BE can be formed of, for example, a laminated film of an aluminum (Al) layer, a titanium (Ti) layer, a nickel (Ni) layer, and a gold (Au) layer in order from the back surface Sb of the semiconductor substrate SS, etc. The back electrode BE is in contact with the p$^+$-type collector layer PC, and the back electrode BE and the p$^+$-type collector layer PC are electrically coupled to each other.

As shown in FIGS. 6 and 7, the main part of the semiconductor substrate SS is occupied by the n$^-$-type drift region ND as the n-type semiconductor region. That is, the n$^-$-type drift region ND is formed in a region other than lower and upper layer portions in the semiconductor substrate SS. The n$^-$-type drift region ND corresponds to a region (i.e., a region in which an n-type or p-type impurity is not nearly injected in the process of manufacturing the semiconductor device) of the semiconductor substrate SS, in which an n-type state at the formation thereof as an n-type semiconductor substrate is substantially maintained. An impurity concentration of the n$^-$-type drift region ND is lower than an impurity concentration of each of the n-type field stop layer NS, n$^+$-type emitter region NE, and n-type hole barrier region HB. An upper surface (surface on the side opposite to the side adjacent to the p$^+$-type collector layer PC) of the n-type field stop layer NS is adjacent to the bottom face (lower surface) of the n$^-$-type drift region ND. That is, the n-type field stop layer NS is interposed between the n$^-$-type drift region ND and the p$^+$-type collector layer PC. Incidentally, in the present application, the "bottom face" can also be read as the "lower surface".

Each p-type body region (p-type semiconductor region, p-type semiconductor layer, channel forming region) PB is formed on the surface Sa side of the semiconductor substrate SS, i.e., at the upper layer portion of the semiconductor substrate SS. The p-type body region PB is a p-type semiconductor region (semiconductor layer) introduced with a p-type impurity.

In the cell forming region CR, the p-type body region PB is formed at the upper layer portion of the semiconductor substrate SS in the active cell region LCa. That is, the p-type body region PB is formed at the upper layer portion of the semiconductor substrate SS over the entire active cell region LCa. Since, however, the embedded insulating film UZ exists in the inactive cell region LCi, the p-type body region PB is not formed in the semiconductor substrate SS in the inactive cell region LCi. The depth (depth position) of the bottom face of the p-type body region PB is shallower than the depth (depth position) of the bottom face of each of the trenches T1, T2, and T3.

Incidentally, the "depth" or "depth position" corresponds to a distance (distance in the direction perpendicular to the main surface of the semiconductor substrate SS) from the surface Sa of the semiconductor substrate SS with the surface Sa of the semiconductor substrate SS as a reference surface. Further, the side close to the surface Sa of the semiconductor substrate SS is assumed to be a shallow side, and the side (in other words, the side close to the back surface Sb of the semiconductor substrate SS) far from the surface Sa of the semiconductor substrate SS is assumed to be a deep side.

The trenches T1, T2, and T3 extending in the depth direction (thickness direction) of the semiconductor substrate SS from the surface Sa of the semiconductor substrate SS are formed in the semiconductor substrate SS. The trench gate electrodes (trench electrodes) TG1, TG2, and TG3 are respectively embedded into the trenches T1, T2, and T3 through the insulating film GI. That is, the trench gate electrode TG1 is formed within the trench T1 through the insulating film (gate insulating film) GI. The trench gate electrode TG2 is formed within the trench T2 through the insulating film (gate insulating film) GI. The trench gate electrode TG3 is formed within the trench T3 through the insulating film (gate insulating film) GI. The trenches T1, T2, and T3 are formed on the surface Sa side of the semiconductor substrate SS and do not penetrate the semiconductor substrate SS. The bottom faces of the trenches T1, T2, and T3 are positioned in the middle of the thickness of the semiconductor substrate SS. The depth of the bottom face of the trench T1, the depth of the bottom face of the trench T2, and the depth of the bottom face of the trench T3 are almost the same with each other. The depths of the trenches T1, T2, and T3 can respectively be assumed to be about 3 µm, for example.

The insulating film GI comprised of an insulating film such as a silicon oxide film is formed at the bottom faces and side surfaces of the trenches T1, T2, and T3 formed in the semiconductor substrate SS. Therefore, the insulating film GI is interposed between each of the trench gate electrodes TG1, TG2, and TG3 embedded into the trenches T1, T2, and T3 and the semiconductor substrate SS, and the trench gate electrodes TG1, TG2, and TG3 and the semiconductor substrate SS are not brought into contact with each other. The trench gate electrodes TG1, TG2, and TG3 are respectively comprised of a conductive film embedded into each of the trenches T1, T2, and T3 of the semiconductor substrate SS and comprised of, for example, a doped polysilicon film (e.g., doped polysilicon film introduced with phosphorus or the like).

In each active cell region LCa, the trench T2 and the trench gate electrode TG2 embedded into the trench T2 are disposed on one end side thereof in the X direction. The trench T3 and the trench gate electrode TG3 embedded into the trench T3 are disposed on the other end side thereof in the X direction. The trench T1 and the trench gate electrode TG1 embedded into the trench T1 are disposed in the center thereof in the X direction. The trench gate electrodes TG1, TG2, and TG3 embedded into the trenches T1, T2, and T3 extend in the Y direction in plan view as shown in FIG. 5. That is, in each active cell region LCa, the trench T1 (trench gate electrode TG1) extending in the Y direction is disposed between the trench T2 (trench gate electrode TG2) extending in the Y direction and the trench T3 (trench gate electrode TG3) extending in the Y direction. In each active cell region LCa, parts of the semiconductor substrate SS respectively exist between the trench T1 extending in the Y direction and the trench T2 extending in the Y direction and between the trench T1 extending in the Y direction and the trench T3 extending in the Y direction. The trench gate electrode TG1 is electrically coupled to the gate wiring GL and the gate electrode GE as described above. The trench gate electrode TG2 and the trench gate electrode TG3 are electrically coupled to the emitter electrode EE as described above.

The trench gate electrode TG1 functions as a gate electrode of a field effect transistor (corresponding to a field effect transistor FE to be described later), but the trench gate electrodes TG2 and TG3 do not function as the gate electrode of the field effect transistor, which are so-called dummy trench gate electrodes. Since the trench gate electrodes TG2 and TG3 are respectively embedded into the trenches T2 and T3, they can be assumed to be trench electrodes.

The insulating film GI interposed between the trench gate electrode TG1 and the semiconductor substrate SS can function as a gate insulating film. The insulating film GI interposed between the trench gate electrode TG2 and the semiconductor substrate SS can function as an insulating film for electrically separating (insulating) the trench gate electrode TG2 and the semiconductor substrate SS. Further, the insulating film GI interposed between the trench gate electrode TG3 and the semiconductor substrate SS can function as an insulating film for electrically separating (insulating) the trench gate electrode TG3 and the semiconductor substrate SS.

In the active cell region LCa, the p-type body regions PB are formed at the upper portion (surface Sa side) of the semiconductor substrate SS to be a portion positioned between the trenches T1 and T2 and the upper portion (surface Sa side) of the semiconductor substrate SS to be a portion positioned between the trenches T1 and T3. The p-type body regions PB formed at the upper portion of the semiconductor substrate SS to be the portion positioned between the trenches T1 and T2 are in contact with the insulating film GI formed at the side surface of the trench T1 and the insulating film GI formed at the side surface of the trench T2. Further, the p-type body regions PB formed at the upper portion of the semiconductor substrate SS to be the portion positioned between the trenches T1 and T3 are in contact with the insulating film GI formed at the side surface of the trench T1 and the insulating film GI formed at the side surface of the trench T3.

In the semiconductor substrate SS to be the portion positioned between the trenches T1 and T2, each $n^+$-type emitter region ($n^+$-type semiconductor region) NE is formed on the surface Sa side of the semiconductor substrate SS. Further, in the semiconductor substrate SS to be the portion positioned between the trenches T1 and T3, each $n^+$-type emitter region NE is formed on the surface Sa side of the semiconductor substrate SS. That is, each $n^+$-type emitter region NE is formed at an upper portion (upper layer portion) of the p-type body region PB. The $n^+$-type emitter region NE is an n-type semiconductor region introduced with an n-type impurity.

However, in the semiconductor substrate SS to be the portion positioned between the trenches T1 and T2, the $n^+$-type emitter region NE is formed only on the trench T1 side, but not formed on the trench T2 side. That is, in the semiconductor substrate SS to be the portion positioned between the trenches T1 and T2, the $n^+$-type emitter region NE is formed at a position adjacent to the trench T1, but not formed at a position adjacent to the trench T2. Further, in the semiconductor substrate SS to be the portion positioned between the trenches T1 and T3, $n^+$-type emitter region NE is formed only on the trench T1 side, but not formed on the trench T3 side. That is, in the semiconductor substrate SS to be the portion positioned between the trenches T1 and T3, the n$^+$-type emitter region NE is formed at a position adjacent to the trench T1, but not formed at a position adjacent to the trench T3.

As described above, in the active section LCaa in the active cell region LCa, the n$^+$-type emitter regions NE are formed (refer to FIG. 5), whereas in the inactive section LCai in the active cell region LCa, no n$^+$-type emitter region NE is formed (refer to FIG. 5). That is, in the active section LCaa in the active cell region LCa, as shown in FIG. 6, each n$^+$-type emitter region NE is formed at the position adjacent to the trench T1 at the upper portion of each p-type body region PB in each of the semiconductor substrate SS to be the portion positioned between the trenches T1 and T2 and the semiconductor substrate SS to be the portion positioned between the trenches T1 and T3. Meanwhile, in the inactive section LCai in the active cell region LCa, as shown in FIG. 7, no n$^+$-type emitter region NE is formed in each of the semiconductor substrate SS to be the portion positioned between the trenches T1 and T2 and the semiconductor substrate SS to be the portion positioned between the trenches T1 and T3.

In the active sub cell region LCa1, i.e., the semiconductor substrate SS to be the portion positioned between the trenches T1 and T2, the n$^+$-type emitter regions NE are disposed along the Y direction at intervals from each other in plan view. Further, in the active sub cell region LCa2, i.e., the semiconductor substrate SS to be the portion positioned between the trenches T1 and T3, the n$^+$-type emitter regions NE are disposed along the Y direction at intervals from each other in plan view. The n$^+$-type emitter region NE in the active sub cell region LCa1 and the n$^+$-type emitter region NE in the active sub cell region LCa2 are adjacent to each other in the X direction through the trench T1 in which the trench gate electrode TG1 is embedded.

Each n$^+$-type emitter region NE is in contact with the insulating film GI formed at the side surface of the trench T1. Specifically, the side surface of the n$^+$-type emitter region NE on the side adjacent to the trench T1 is brought into contact with the insulating film GI formed at the side surface of the trench T1, and the lower surface of the n$^+$-type emitter region NE is brought into contact with the p-type body region PB. The side surface of the n$^+$-type emitter region NE on the side opposite to the side adjacent to the trench T1 is in contact with the emitter electrode EE (i.e., coupling electrode VE) to be the portion embedded into the contact trench CT.

The interlayer insulating film IL comprised of the silicon oxide film or the like is formed over the surface Sa of the semiconductor substrate SS substantially throughout the surface Sa of the semiconductor substrate SS. The trench gate electrodes TG1, TG2, and TG3 and the embedded insulating film UZ are covered with the interlayer insulating film IL. The emitter electrode EE is comprised of, for example, the metal film comprised mainly of aluminum (Al) is formed over the interlayer insulating film IL. The gate wiring GL and the gate electrode GE are also formed over the interlayer insulating film IL in the same layer as the emitter electrode EE, but are not illustrated in the cross sections of FIGS. 6 and 7. The insulating film PA to be the surface protection film is formed over the interlayer insulating film IL so as to cover the emitter electrode EE, the gate wiring GL and the gate electrode GE. The insulating film PA is comprised of, for example, a polyimide-based organic insulating film (resin film) or the like. Incidentally, as shown in FIGS. 1 and 2, a part of the emitter electrode EE is exposed from the opening OPE defined in the insulating film PA. Further, a part of the gate electrode GE is exposed from the opening OPG defined in the insulating film PA.

The contact trench CT penetrates through the interlayer insulating film IL and further digs a part of the semiconductor substrate SS. In the active cell region LCa, the contact trench CT is formed between the trenches T1 and T2 adjacent to each other in the X direction and also formed between the trenches T1 and T3 adjacent to each other in the X direction. Thus, the contact trench CT is formed between the trench gate electrode TG1 and the trench gate electrode TG2 adjacent to each other in the X direction and formed between the trench gate electrode TG1 and the trench gate electrode TG3 adjacent to each other in the X direction. The depth (depth position) of the bottom face of the contact trench CT is shallower than the depth (depth position) of the bottom face of each of the trenches T1, T2, and T3.

In the semiconductor substrate SS in each of the active sub cell region LCa1 and the active sub cell region LCa2, a p$^+$-type body contact region PBC is formed at a position adjacent to the bottom face of the contact trench CT, i.e., below the bottom face of the contact trench CT. A p$^+$-type latch-up preventing region PLP is formed below the p$^+$-type body contact region PBC so as to contact the p$^+$-type body contact region PBC. In each of the active sub cell region LCa1 and the active sub cell region LCa2, the p$^+$-type body contact region PBC, the p$^+$-type latch-up preventing region PLP, and the p-type body region PB are electrically coupled to one another.

The p$^+$-type body contact region PBC and the p$^+$-type latch-up preventing region PLP are respectively a p-type semiconductor region introduced with a p-type impurity. An impurity concentration of the p$^+$-type latch-up preventing region PLP is higher than that of the p-type body region PB. Further, an impurity concentration of the p$^+$-type body contact region PBC is higher than that of the p$^+$-type latch-up preventing region PLP.

Incidentally, the p$^+$-type latch-up preventing region PLP and the p-type body region PB are of the same conductivity type, and the p$^+$-type latch-up preventing region PLP is higher in impurity concentration than the p-type body region PB. This means that the p$^+$-type latch-up preventing region PLP is higher in effective impurity concentration (i.e., charge density of impurity) than the p-type body region PB. When the n-type impurity and the p-type impurity are mixed, they are canceled (compensated) each other, and only the difference in impurity concentration therebetween can function as an effective impurity (donor or acceptor). Therefore, when the n-type impurity and the p-type impurity are mixed, the difference between the concentration of the n-type impurity and the concentration of the p-type impurity can be an effective impurity concentration. In the present embodiment, when reference is made to the impurity concentration, it basically corresponds to the effective impurity concentration.

While reflecting each n$^+$-type emitter region NE being formed in the active section LCaa in the active cell region LCa, the p$^+$-type body contact region PBC is exposed at the bottom face of the contact trench CT, and the p-type body region PB and the n$^+$-type emitter region NE are exposed at the side surface of the contact trench CT. Therefore, in the active section LCaa in the active cell region LCa, the coupling electrode VE embedded in the contact trench CT is brought into contact with the p-type body region PB and the n$^+$-type emitter region NE and electrically coupled to them at the side surface of the contact trench CT. The coupling electrode VE is electrically coupled to the p$^+$-type body contact region PBC in contact therewith at the bottom face of the contact trench CT.

That is, the contact trench CT disposed between the trenches T1 and T2 penetrates through the interlayer insulating film IL and digs a part of the semiconductor substrate SS to be a portion interposed between the trenches T1 and T2. The coupling electrode VE embedded in the contact trench CT is brought into contact with each p-type body region PB and the n$^+$-type emitter region NE formed in the semiconductor substrate SS to be the portion interposed between the trenches T1 and T2 and is electrically coupled to them. Further, the contact trench CT disposed between the trenches T1 and T3 penetrates through the interlayer insulating film IL and is formed by digging in a part of the semiconductor substrate SS to be a portion interposed between the trenches T1 and T3. The coupling electrode VE embedded into the contact trench CT is brought into contact with each p-type body region PB and the n$^+$-type emitter region NE formed in the semiconductor substrate SS to be the portion interposed between the trenches T1 and T3 and is electrically coupled to them.

Incidentally, the emitter electrode EE to be the portion embedded into the contact trench CT formed in the active cell region LCa is assumed to be called a coupling electrode VE. The coupling electrode VE is embedded into the contact trench CT formed in the active cell region LCa. The coupling electrode VE is formed integrally with the emitter electrode EE. Therefore, the coupling electrode VE is electrically coupled to the emitter electrode EE.

As another form, the coupling electrode VE and the emitter electrode EE can be formed separately. In such a case, however, the upper surface of the coupling electrode VE is in a state in contact with the lower surface of the emitter electrode EE. In any case, the coupling electrode VE is electrically coupled to the emitter electrode EE.

Further, while reflecting each n$^+$-type emitter region NE being not formed in the inactive section LCai in the active cell region LCa, the p$^+$-type body contact region PBC is exposed at the bottom face of the contact trench CT, and the p-type body region PB is exposed at the side surface of the contact trench CT. Therefore, in the inactive section LCai in the active cell region LCa, the coupling electrode VE embedded into the contact trench CT is electrically coupled to the p-type body region PB in contact therewith at the side surface of the contact trench CT and electrically coupled to the p$^+$-type body contact region PBC in contact therewith at the bottom face of the contact trench CT.

Further, in the active cell region LCa, the coupling electrode VE is electrically coupled to the p$^+$-type body contact region PBC in low resistance in contact therewith at its bottom face and electrically coupled to the p-type body region PB through the p$^+$-type body contact region PBC and the p$^+$-type latch-up preventing region PLP brought into contact with the p$^+$-type body contact region PBC.

Thus, in the active cell region LCa, the coupling electrode VE is electrically coupled to the n$^+$-type emitter region NE formed in the active section LCaa and electrically coupled to the p$^+$-type body contact region PBC, the p$^+$-type latch-up preventing region PLP, and the p-type body region PB formed over the active section LCaa and the inactive section LCai. Therefore, the n$^+$-type emitter region NE and the p-type body region PB formed in the active cell region LCa are electrically coupled to the coupling electrode VE and electrically coupled to the emitter electrode EE through the coupling electrode VE. Incidentally, the p$^+$-type body contact region PBC and the p$^+$-type latch-up preventing region PLP are preferably formed, but the formation of one or both thereof may also be omitted.

In the semiconductor substrate SS in each of the active sub cell region LCa1 and the active sub cell region LCa2, the n-type hole barrier region (n-type semiconductor region) HB is formed below the p$^+$-type latch-up preventing region PLP and the p-type body region PB. That is, in the active sub cell region LCa1, the n-type hole barrier region HB is formed in the semiconductor substrate SS to be the portion positioned between the trenches T1 and T2. In the active sub cell region LCa2, the n-type hole barrier region HB is formed in the semiconductor substrate SS to be the portion positioned between the trenches T1 and T3. The n$^-$-type drift region ND exists below the n-type hole barrier region HB, and the bottom face (lower surface) of the n-type hole barrier region HB is in contact with the n$^-$-type drift region ND. The upper surface of the n-type hole barrier region HB is in contact with the p$^+$-type latch-up preventing region PLP and the p-type body region PB. The side surface of the n-type hole barrier region HB formed in the active sub cell region LCa1 is in contact with the insulating film GI formed at the inner surface of the trench T1 and the insulating film GI formed at the inner surface of the trench T2. Further, the side surface of the n-type hole barrier region HB formed in the active sub cell region LCa2 is in contact with the insulating film GI formed at the inner surface of the trench T1 and the insulating film GI formed at the inner surface of the trench T3.

The n-type hole barrier region HB is an n-type semiconductor region introduced with an n-type impurity. An impurity concentration of the n-type hole barrier region HB is higher than that of the n$^-$-type drift region ND below the n-type hole barrier region HB and lower than that of the n$^+$-type emitter region NE. The depth of the bottom face of the n-type hole barrier region HB is approximately the same as that of the bottom face of each of the trenches T1, T2, and T3.

In the inactive cell region LCi, each trench TR is formed in the semiconductor substrate SS, and the embedded insulating film UZ is embedded in the trench TR as an insulating film. The trench TR is formed on the surface Sa side of the semiconductor substrate SS and does not penetrate through the semiconductor substrate SS. A bottom face (i.e., bottom face of embedded insulating film UZ) of the trench TR is positioned in the middle of the thickness of the semiconductor substrate SS. The depth of the bottom face of the trench TR, i.e., the depth of the bottom face of the embedded insulating film UZ is preferably substantially the same as the depth of the bottom face of each of the trenches T1, T2, and T3.

The embedded insulating film UZ is formed over the entire inactive cell region LCi. That is, in plan view, the embedded insulating film UZ is disposed over almost the whole of the region between the active cell regions LCa adjacent to each other in the X direction.

Therefore, the trench T2 in each active cell region LCa is adjacent to the trench TR in the inactive cell region LCi. The trench T2 in the active cell region LCa and the trench TR in the inactive cell region LCi are coupled to each other. Further, the trench T3 in each active cell region LCa is adjacent to the trench TR in the inactive cell region LCi. The trench T3 in the active cell region LCa and the trench TR in the inactive cell region LCi are coupled to each other. Therefore, the trench T3 in each active cell region LCa is adjacent to the embedded insulating film UZ.

Incidentally, there is shown in FIGS. 6 and 7, the case where the insulating film GI is formed over the entire inner surfaces of the trenches T1, T2, and T3. In this case, the insulating film GI is interposed even between the embedded insulating film UZ and the trench gate electrode TG2 embedded into the trench T2 adjacent thereto. Further, the insulating film GI is interposed between the embedded insulating film UZ and the trench gate electrode TG3 embedded into the trench T3 adjacent thereto.

However, depending on the method of forming the insulating film GI, the insulating film GI may not be formed between the embedded insulating film UZ and the trench gate electrode TG2 adjacent thereto and between the embedded insulating film UZ and the trench gate electrode TG3 adjacent thereto. In this case, one side surface of the embedded insulating film UZ comes in contact with the side surface of the trench gate electrode TG2, and the other side surface (side surface on the side opposite to the one side surface) of the embedded insulating film UZ comes in contact with the trench gate electrode TG3. Even in such a case, however, the insulating film GI is interposed between the trench gate electrode TG2 and the semiconductor substrate SS and between the trench gate electrode TG3 and the semiconductor substrate SS. Since the embedded insulating film UZ is an insulator, a failure can be avoided even if the trench gate electrodes TG2 and TG3 is in contact with the embedded insulating film UZ.

Further, while the trench gate electrode TG2 and the trench gate electrode TG3 interpose the embedded insulating film UZ therebetween in the X direction, the trench gate electrode TG2 and the trench gate electrode TG3 interposing the embedded insulating film UZ therebetween in the X direction do not correspond to the trench gate electrode TG2 and the trench gate electrode TG3 which belong to the same active cell region LCa. The trench gate electrode TG2 and the trench gate electrode TG3 interposing the embedded insulating film UZ therebetween in the X direction correspond to the trench gate electrode TG2 which belongs to one of the two active cell regions LCa positioned on both sides of the embedded insulating film UZ, and the trench gate electrode TG3 which belongs to the other active cell region LCa.

As viewed in plan, the embedded insulating film UZ is surrounded by the trench gate electrode TG2 extending in the Y direction, the trench gate electrode TG3 extending in the Y direction, and the end coupling trench gate electrode TGp extending in the X direction. That is, the embedded insulating film UZ has two side surfaces parallel to the Y direction, and two side surfaces parallel to the X direction. Further, the two side surfaces parallel to the Y direction that the embedded insulating film UZ has are positioned on the sides opposite to each other in the X direction. One of the two side surfaces is adjacent to the trench gate electrode TG2, and the other thereof is adjacent to the trench gate electrode TG3. Further, the two side surfaces parallel to the X direction that the embedded insulating film UZ has are positioned on the sides opposite to each other in the Y direction. One of the two side surfaces is adjacent to the end coupling trench gate electrode TGp shown in FIG. 4, and the other thereof is adjacent to the end coupling trench gate electrode TGp (not shown in FIG. 4) on the side opposite to the end coupling trench gate electrode TGp shown in FIG. 4.

The embedded insulating film UZ is one by forming the trench TR in the semiconductor substrate SS and embedding the insulating film therein. Therefore, the upper surface of the embedded insulating film UZ is approximately flat and at the substantially same height position as the upper surface of the semiconductor substrate SS in the active cell region LCa. That is, the upper surface of the embedded insulating film UZ is at the substantially same height position as the upper surface of the semiconductor substrate SS to be the portion positioned between the trenches T1 and T2, and the upper surface of the semiconductor substrate SS to be the portion positioned between the trenches T1 and T3. Therefore, the thickness of the embedded insulating film UZ substantially coincides with the depth of the trench TR.

The p-type semiconductor region (p-type floating region) PF is formed below the embedded insulating film UZ. The p-type semiconductor region PF is a p-type semiconductor region introduced with a p-type impurity. The n$^-$-type drift region ND exists below the p-type semiconductor region PF. The bottom face (lower surface) of the p-type semiconductor region PF is in contact with the n$^-$-type drift region ND. The upper surface of the p-type semiconductor region PF is in contact with the bottom face (lower surface) of the embedded insulating film UZ. The p-type semiconductor region PF is formed below the entire embedded insulating film UZ. The active cell regions LCa adjacent to each other in the X direction through the inactive cell region LCi are adjacent to each other in the X direction through the embedded insulating film UZ and the p-type semiconductor region PF provided therebelow.

Incidentally, the p-type semiconductor region PF is principally formed below the embedded insulating film UZ, but projected to the active cell region LCa side than the side surface of the embedded insulating film UZ. That is, the p-type semiconductor region PF is formed below the embedded insulating film UZ and below the bottom faces of the trenches T2 and T3 on both sides of the embedded insulating film UZ. Therefore, the bottom faces of the trenches T2 and T3 on both sides of the embedded insulating film UZ are covered with the p-type semiconductor region PF. That is, the bottom face of the trench T1 is not covered with the p-type semiconductor region PF, but the bottom face of the trench T2 is covered with the p-type semiconductor region PF extending below the embedded insulating film UZ adjacent to the trench T2. Further, the bottom face of the trench T3 is covered with the p-type semiconductor region PF extending below the embedded insulating film UZ adjacent to the trench T3. The distance (depth) from the bottom face (or bottom face of trench T3) of the trench T2 to the bottom face of the p-type semiconductor region PF, i.e., the thickness of the p-type semiconductor region PF to be a portion which covers the bottom face (or bottom face of trench T3) of the trench T2 can be made to be about 500 nm, for example. Further, an impurity concentration (p-type impurity concentration) of the p-type semiconductor region PF can be made to be about $1 \times 10^{15}$ to $5 \times 10^{16}$/cm$^3$.

The embedded insulating film UZ is covered with the interlayer insulating film IL. That is, the interlayer insulating film IL is formed over the surface Sa of the semiconductor substrate SS so as to cover the trench gate electrodes TG1, TG2, and TG3 and the embedded insulating film UZ. The emitter electrode EE is formed over the interlayer insulating film IL throughout the cell forming region CR. Therefore, the emitter electrode EE is continuously formed even over the interlayer insulating film IL in the active cell region LCa and the interlayer insulating film IL in the inactive cell region LCi. While the emitter electrode EE exists above the embedded insulating film UZ, the interlayer insulating film IL is interposed between the embedded insulating film UZ and the emitter electrode EE. Therefore, the interlayer insulating film IL and the embedded insulating film UZ are interposed between a substrate region below the embedded insulating film UZ and the emitter electrode EE above the embedded insulating film UZ. Further, since the upper surface of the embedded insulating film UZ is substantially flat as described above, the upper surface of the interlayer insulating film IL positioned above the embedded insulating film UZ is also substantially flat, and the lower surface of the emitter electrode EE positioned in the interlayer insulating film IL above the embedded insulating film UZ is also substantially flat.

Incidentally, there is shown in FIGS. 6 and 7, the case where an insulating film (e.g., insulating film corresponding to an insulating film IF to be described later) thinner than the interlayer insulating film IL is interposed between the interlayer insulating film IL and the embedded insulating film UZ. However, other insulating films (insulating film IF and the like to be described later) may not be interposed between the interlayer insulating film IL and the embedded insulating film UZ depending on a manufacturing process. In such a case, the upper surface of the embedded insulating film UZ comes into contact with the lower surface of the interlayer insulating film IL.

<Manufacturing Process of Semiconductor Device>

A process of manufacturing the semiconductor device according to the present embodiment will next be described with reference to FIGS. 8 through 29. FIGS. 8 through 29 are fragmentary sectional diagrams in the process of manufacturing the semiconductor device according to the present embodiment. Cross sections of regions corresponding to FIG. 6 are shown in FIGS. 8 through 29.

Figure 8:
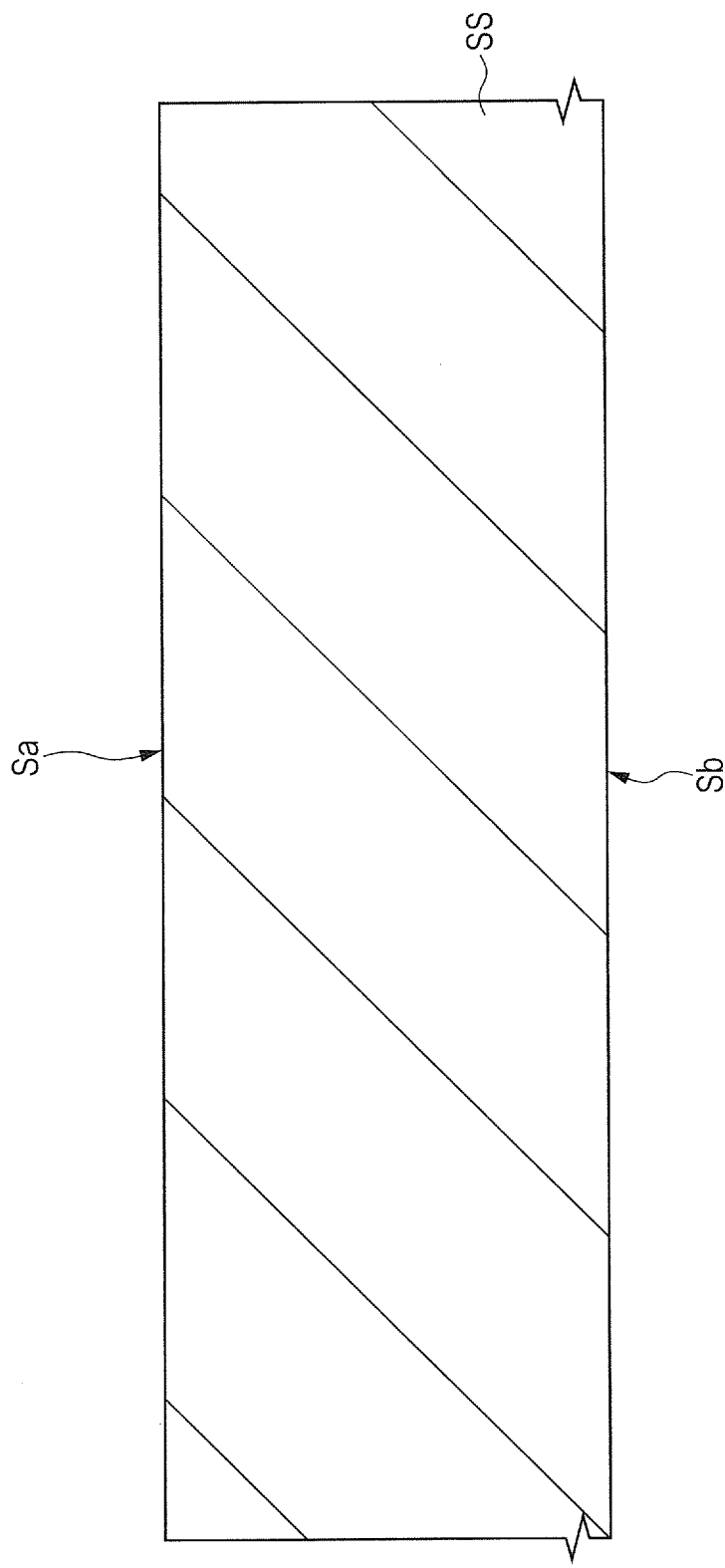
FIG. 8 is a fragmentary sectional diagram in the process of manufacturing the semiconductor device according to the one embodiment.

In order to manufacture the semiconductor device, a semiconductor substrate SS (semiconductor wafer) comprised of n-type single crystal silicon introduced with, for example, an n-type impurity such as phosphor (P) is first provided as shown in FIG. 8. The semiconductor substrate SS has a surface Sa which is one main surface, and a back surface Sb which is a main surface on the side opposite to the surface Sa.

An impurity concentration of the n-type impurity in the semiconductor substrate SS can be made to be about $2 \times 10^{14}$ $cm^{-3}$, for example. In this stage, the semiconductor substrate SS is a thin plate of a semiconductor having an approximately circular planar shape, which is referred to as a wafer. The thickness of the semiconductor substrate SS can be made to be about 450 μm to 1000 μm, for example.

Figure 9:
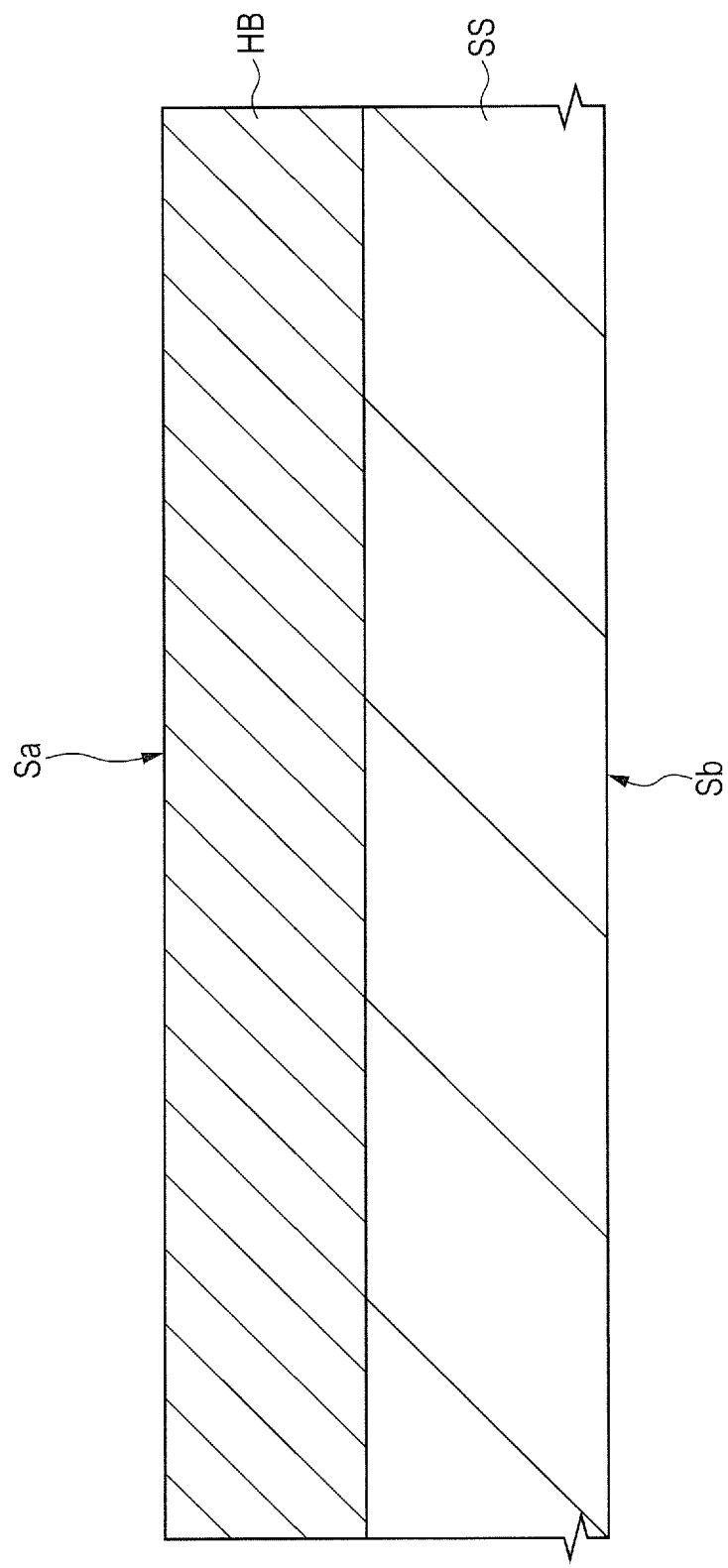
FIG. 9 is a fragmentary sectional diagram following FIG. 8 in the manufacturing process of the semiconductor device.

Next, the n-type impurity (phosphor (P), for example) is introduced from the surface Sa side of the semiconductor substrate SS to an upper layer portion of the semiconductor substrate SS by, for example, an ion implantation method. Thereafter, heat treatment is applied thereto to thermally diffuse (drive-in diffuse) the n-type impurity introduced into the upper layer portion of the semiconductor substrate SS in its depth direction, thereby forming an n-type hole barrier region HB in the semiconductor substrate SS as shown in FIG. 9. The n-type hole barrier region HB is formed from the surface Sa of the semiconductor substrate SS to a prescribed depth.

Figure 10:
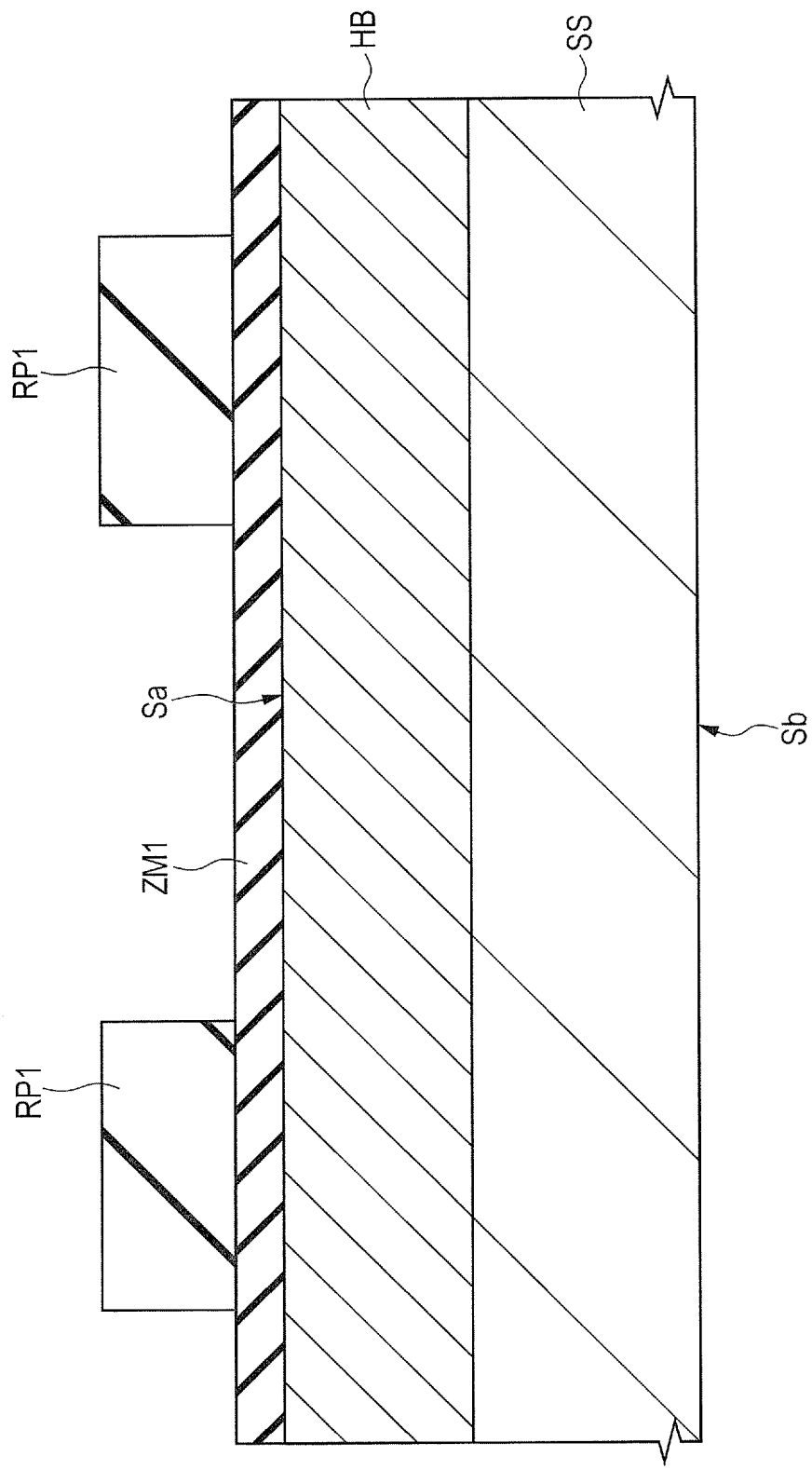
FIG. 10 is a fragmentary sectional diagram following FIG. 9 in the manufacturing process of the semiconductor device.

Next, as shown in FIG. 10, an insulating film ZM1 is formed over the surface Sa of the semiconductor substrate SS. The insulating film ZM1 is comprised of, for example, an HLD film or the like. Incidentally, the HLD film corresponds to a silicon oxide film formed by an HLD (High temperature Low pressure Deposition) method.

Next, as shown in FIG. 10, a resist pattern RP1 is formed over the insulating film ZM1 by using a photolithography technique. The resist pattern RP1 has an opening in a trench TR forming scheduled region. Incidentally, the photolithography technique is a technique of forming a resist film (photoresist film) over the entire main surface of the semiconductor substrate by a coating method or the like and thereafter patterning the resist film by exposure and development, thereby obtaining a desired resist pattern (photoresist pattern).

Figure 11:
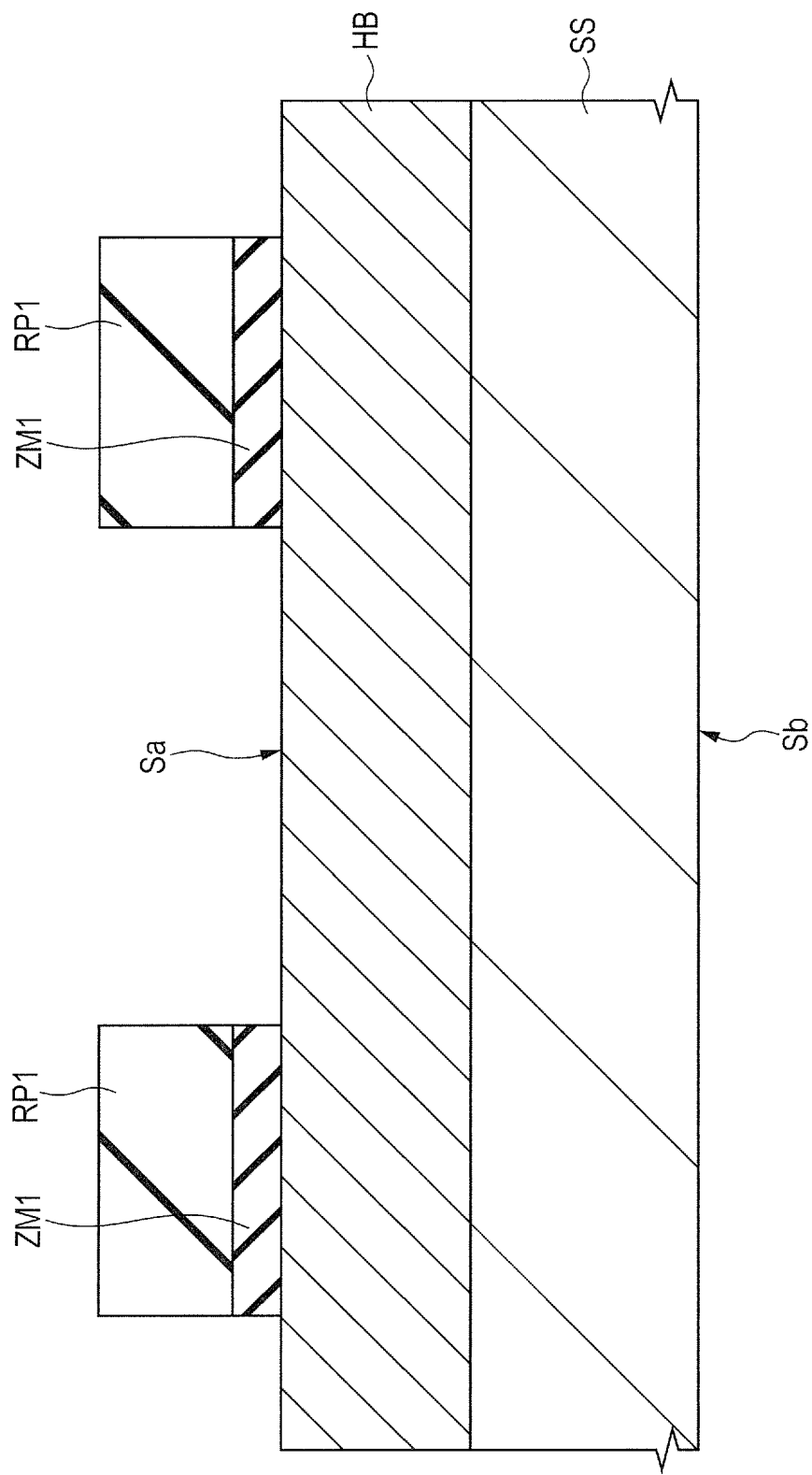
FIG. 11 is a fragmentary sectional diagram following FIG. 10 in the manufacturing process of the semiconductor device.

Next, the insulating film ZM1 is etched using the resist pattern RP1 as an etching mask. Thus, as shown in FIG. 11, the insulating film ZM1 is patterned into the same planar shape as the resist pattern RP1, and the insulating film ZM1 becomes a state having an opening in a trench TR forming scheduled region.

Figure 12:
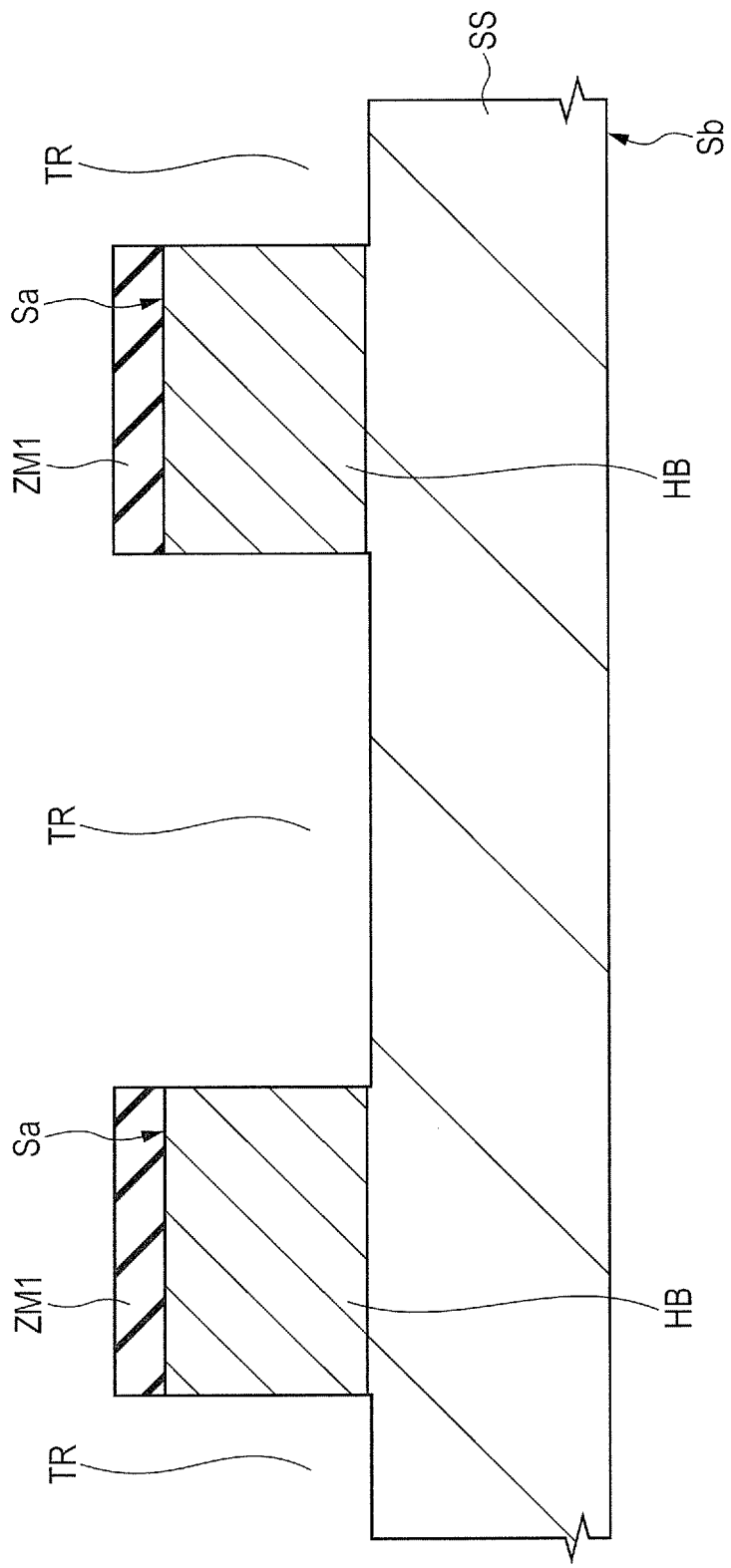
FIG. 12 is a fragmentary sectional diagram following FIG. 11 in the manufacturing process of the semiconductor device.

Next, the semiconductor substrate SS is etched (anisotropically-etched, for example) by using the resist pattern RP1 as an etching mask to thereby form a trench TR in the semiconductor substrate SS. At this time, the semiconductor substrate SS exposed from a laminated film of the resist pattern RP1 and the insulating film ZM1 is selectively etched to form the trench TR in the semiconductor substrate SS. Thereafter, the resist pattern RP1 is removed, and this stage is shown in FIG. 12. As another form, the trench TR can also be formed in the semiconductor substrate SS by eliminating the resist pattern RP1 after patterning of the insulating film ZM1 and thereafter etching the semiconductor substrate SS using the insulating film ZM1 as an etching mask.

The depth of the bottom face of the trench TR can be made to be substantially the same as that of the bottom face of the n-type hole barrier region HB or to be deeper than the bottom face of the n-type hole barrier region HB. Therefore, the n-type hole barrier region HB is not formed below the bottom face of the trench TR and becomes a state of being formed substantially over the whole of the semiconductor substrate SS to be a portion interposed between the trenches TR adjacent to each other.

Figure 13:
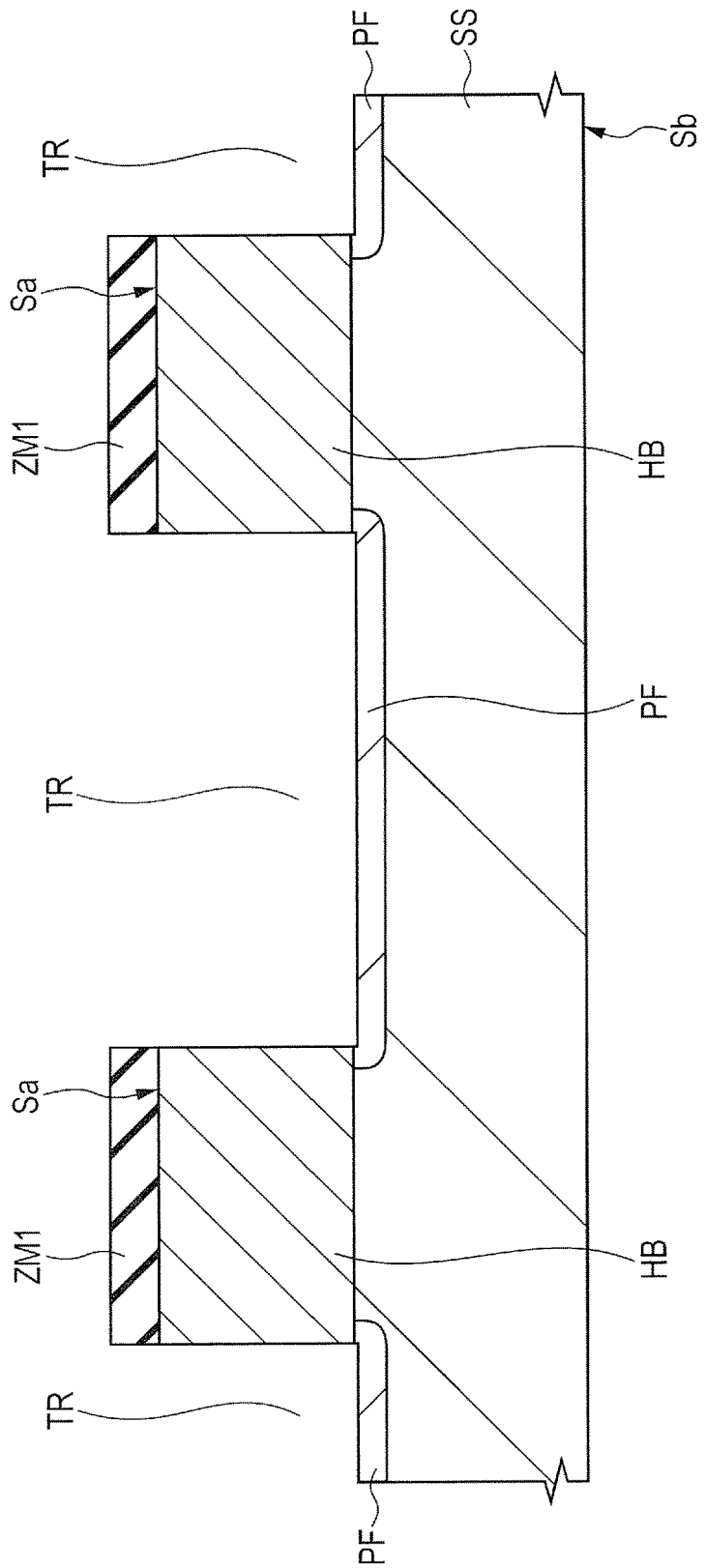
FIG. 13 is a fragmentary sectional diagram following FIG. 12 in the manufacturing process of the semiconductor device.

Next, a p-type impurity (e.g., phosphor (P) or the like) is ion-implanted from the surface Sa side of the semiconductor substrate SS into the semiconductor substrate SS. Thus, as shown in FIG. 13, the p-type impurity is introduced into the semiconductor substrate SS at the bottom of the trench TR to form a p-type semiconductor region PF. The p-type semiconductor region PF is formed in a region adjacent to the bottom face of the trench TR from the bottom face of the trench TR to a prescribed depth. While the p-type impurity is injected into the semiconductor substrate SS exposed at the bottom face of the trench TR in this ion implantation process, the surface Sa of the semiconductor substrate SS is covered with the insulating film ZM1 outside the trench TR and the insulating film ZM1 function as a mask for obstructing ion implantation, thereby making it possible to prevent the p-type impurity from being injected. Therefore, the p-type semiconductor region PF is selectively formed in the region adjacent to the bottom face of the trench TR.

Incidentally, after execution of the ion implantation process for forming the p-type semiconductor region PF, various heating processes (processes in which the semiconductor substrate SS is heated) exist until the semiconductor device is completed. Therefore, after the p-type semiconductor region PF is formed by ion implantation, the impurity (p-type impurity) in the p-type semiconductor region PF is thermally diffused even laterally, so that the p-type semiconductor region PF is expanded in a transverse direction (direction substantially parallel to the main surface of the semiconductor substrate SB). Therefore, since the final (post-thermal diffusion) forming region of the p-type semiconductor region PF is illustrated in FIG. 13 in consideration of a subsequent thermal diffusion too, the p-type semiconductor region PF is made slightly wider than the trench TR.

Figure 14:
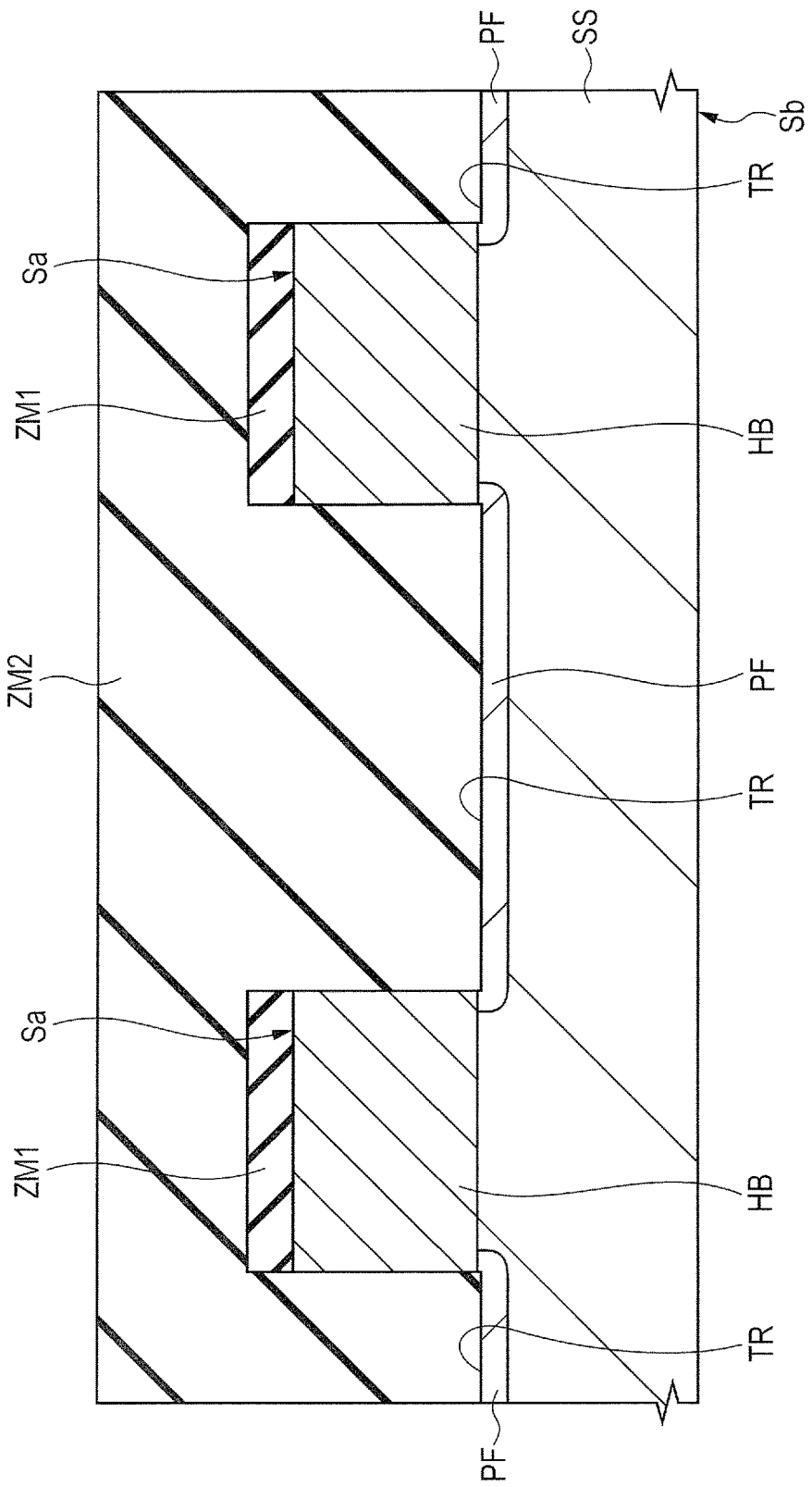
FIG. 14 is a fragmentary sectional diagram following FIG. 13 in the manufacturing process of the semiconductor device.

Next, as shown in FIG. 14, an insulating film ZM2 is formed over the surface Sa of the semiconductor substrate SS including within the trench TR. The insulating film ZM2 is formed over the surface Sa of the semiconductor substrate SS so as to fill the trench TR. Thus, the insulating film ZM2 is embedded within the trench TR, and the insulating film ZM2 is placed in a state of being formed over the insulating film ZM1 lying over the surface Sa of the semiconductor substrate SS outside the trench TR.

The insulating film ZM2 is comprised of a silicon oxide film or the like and can be formed by using a CVD (Chemical Vapor Deposition) method or the like. For example, an HLD film can be used as the insulating film ZM2. Further, as another form, a thin thermal oxide film (not shown) is formed at the inner surface (side surface and bottom face) of the trench TR before forming the insulating film ZM2, and thereafter the insulating film ZM2 can also be formed over the surface Sa of the semiconductor substrate SS including within the trench TR. If the thin thermal oxide film is formed at the inner surface of the trench TR before the insulating film ZM2 is formed, the trench TR can be more appropriately filled with the thermal oxide film and the insulating film ZM2.

Figure 15:
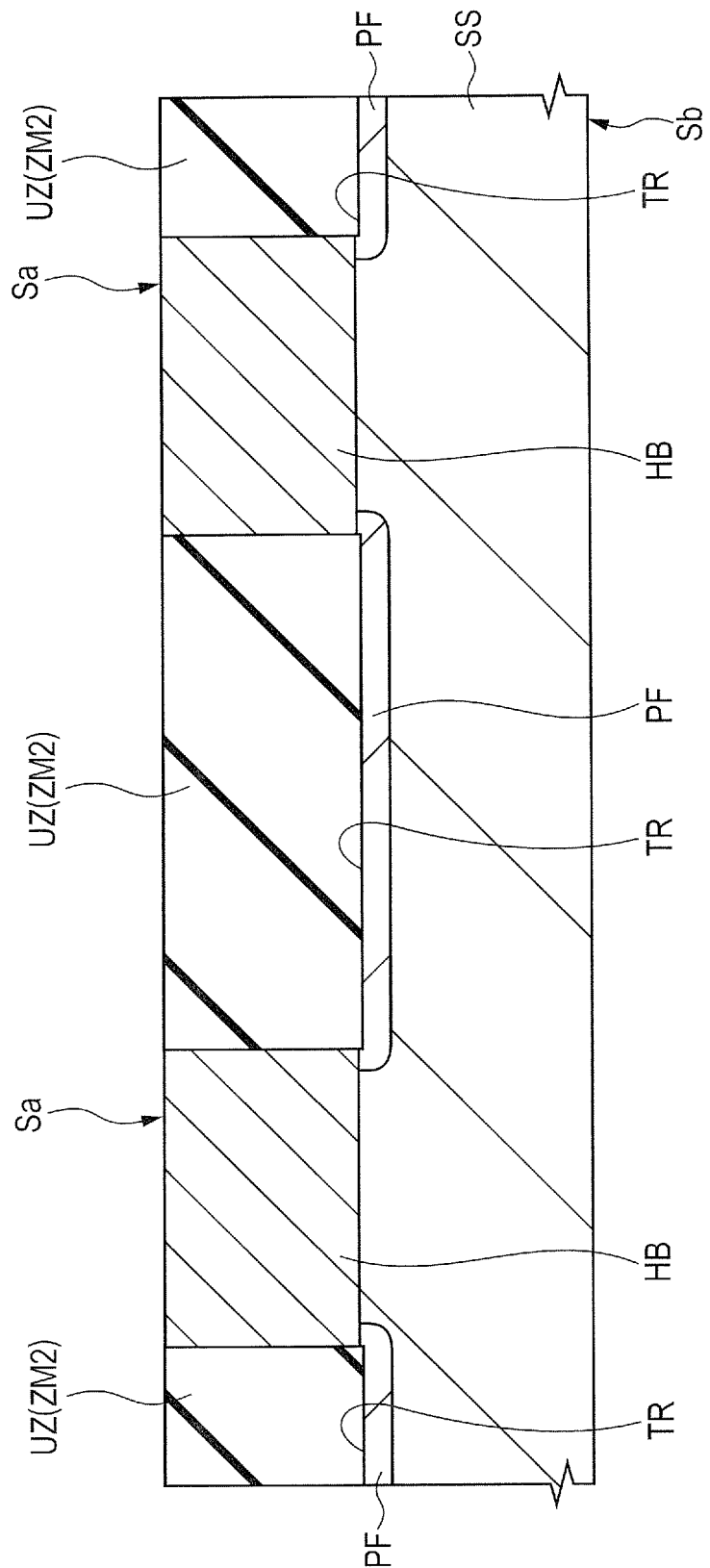
FIG. 15 is a fragmentary sectional diagram following FIG. 14 in the manufacturing process of the semiconductor device.

Next, as shown in FIG. 15, the insulating film ZM2 and the insulating film ZM1 outside the trench TR are removed by a CMP (Chemical Mechanical Polishing) method or the like to leave the insulating film ZM2 within the trench TR. Thus, the surface Sa of the semiconductor substrate SS is exposed and the insulating film ZM2 is left within the trench TR, and hence an embedded insulating film UZ is formed by the insulating film ZM2 left within the trench TR. The embedded insulating film UZ is placed in a state of being embedded within the trench TR. The upper surface of the embedded insulating film UZ is substantially flat and at the substantially same height position as the surface Sa of the semiconductor substrate SS. The p-type semiconductor region PF is adjacent to the bottom face of the embedded insulating film UZ.

Further, though a single-layer insulating film is used as the insulating film ZM2 here, a laminated film comprised of a plurality of insulating films can also be used as the insulating film ZM2 as another form. When the laminated film is used as the insulating film ZM2, the embedded insulating film UZ is also comprised of the laminated film comprised of the insulating films.

Figure 16:
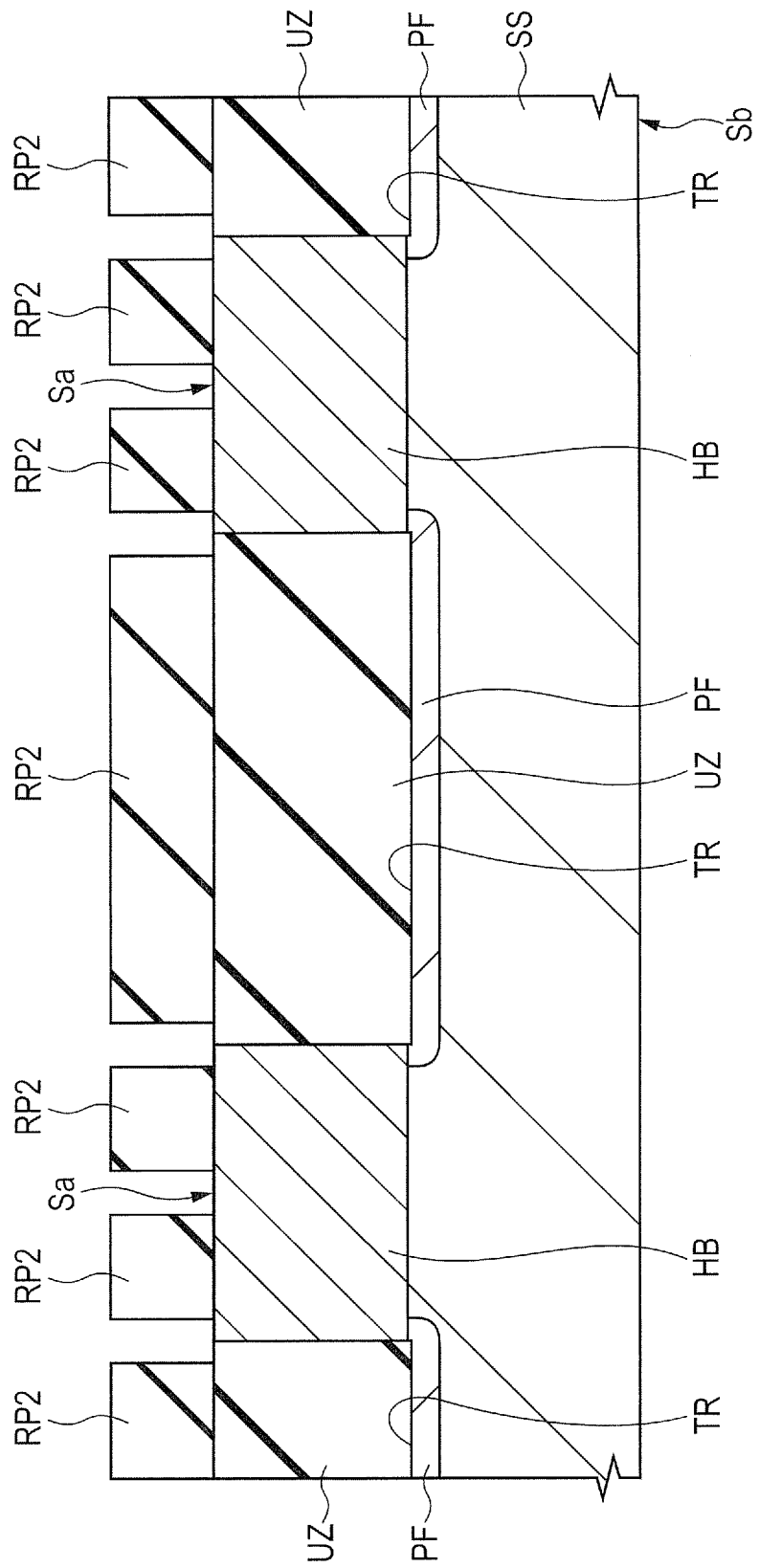
FIG. 16 is a fragmentary sectional diagram following FIG. 15 in the manufacturing process of the semiconductor device.

Next, as shown in FIG. 16, a resist pattern RP2 is formed over the surface Sa of the semiconductor substrate SS embedded with the embedded insulating film UZ by using the photolithography technique. The resist pattern RP2 has openings in scheduled regions for forming trenches T1, T2, and T3.

Figure 17:
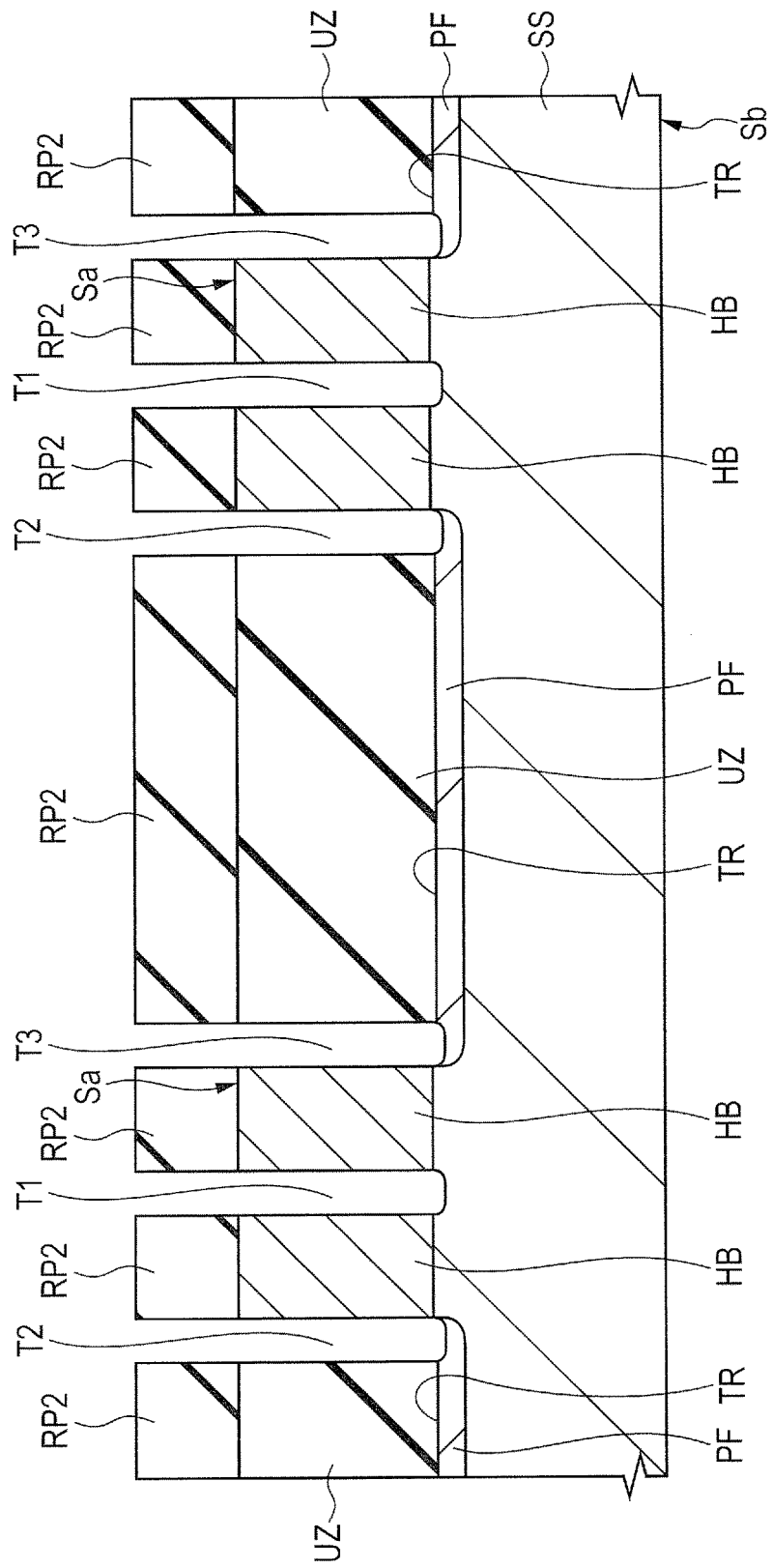
FIG. 17 is a fragmentary sectional diagram following FIG. 16 in the manufacturing process of the semiconductor device.

Next, as shown in FIG. 17, the semiconductor substrate SS is etched (anisotropically-etched, for example) using the resist pattern RP2 as an etching mask to thereby form the trenches T1, T2, and T3 in the semiconductor substrate SS. Thereafter, the resist pattern RP2 is removed.

Here, the trenches T2 and T3 are disposed on both sides of the trench T1 and respectively adjacent to the embedded insulating film UZ. That is, in terms of the trench T2, the semiconductor substrate SS is exposed at the side surface of the trench T2 on the side opposite to the trench T1 and the bottom face of the trench T2, but the embedded insulating film UZ is exposed at the side surface of the trench T2 on the side opposite to the side opposed to the trench T1. Also, in terms of the trench T3, the semiconductor substrate SS is exposed at the side surface of the trench T3 on the side opposite to the trench T1 and the bottom face of the trench T3, but the embedded insulating film UZ is exposed at the side surface of the trench T3 on the side opposite to the side opposed to the trench T1. Further, the semiconductor substrate SS is exposed at both side surfaces of the trench T1 and its bottom. That is, the trenches T2 and T3 are respectively adjacent to the embedded insulating film UZ, but the semiconductor substrate SS is not interposed between the trench T2 and the embedded insulating film UZ adjacent thereto. Further, the semiconductor substrate SS is not interposed between the trench T3 and the embedded insulating film UZ adjacent thereto. Therefore, when forming the trenches T1, T2, and T3, the trenches T1, T2, and T3 may be formed in such a manner that the trenches T2 and T3 respectively partly overlap with the side surface and side end of the embedded insulating film UZ. In this case, in the etching process using the resist pattern RP2 as the etching mask, the semiconductor substrate SS and the embedded insulating film UZ exposed from each opening of the resist pattern RP2 are etched. When the trenches T1, T2, and T3 are formed, the n-type hole barrier region HB becomes a state of being formed substantially over the whole of the semiconductor substrate SS to be a portion interposed between the trenches T1 and T2 and the semiconductor substrate SS to be a portion interposed between the trenches T1 and T3.

Figure 18:
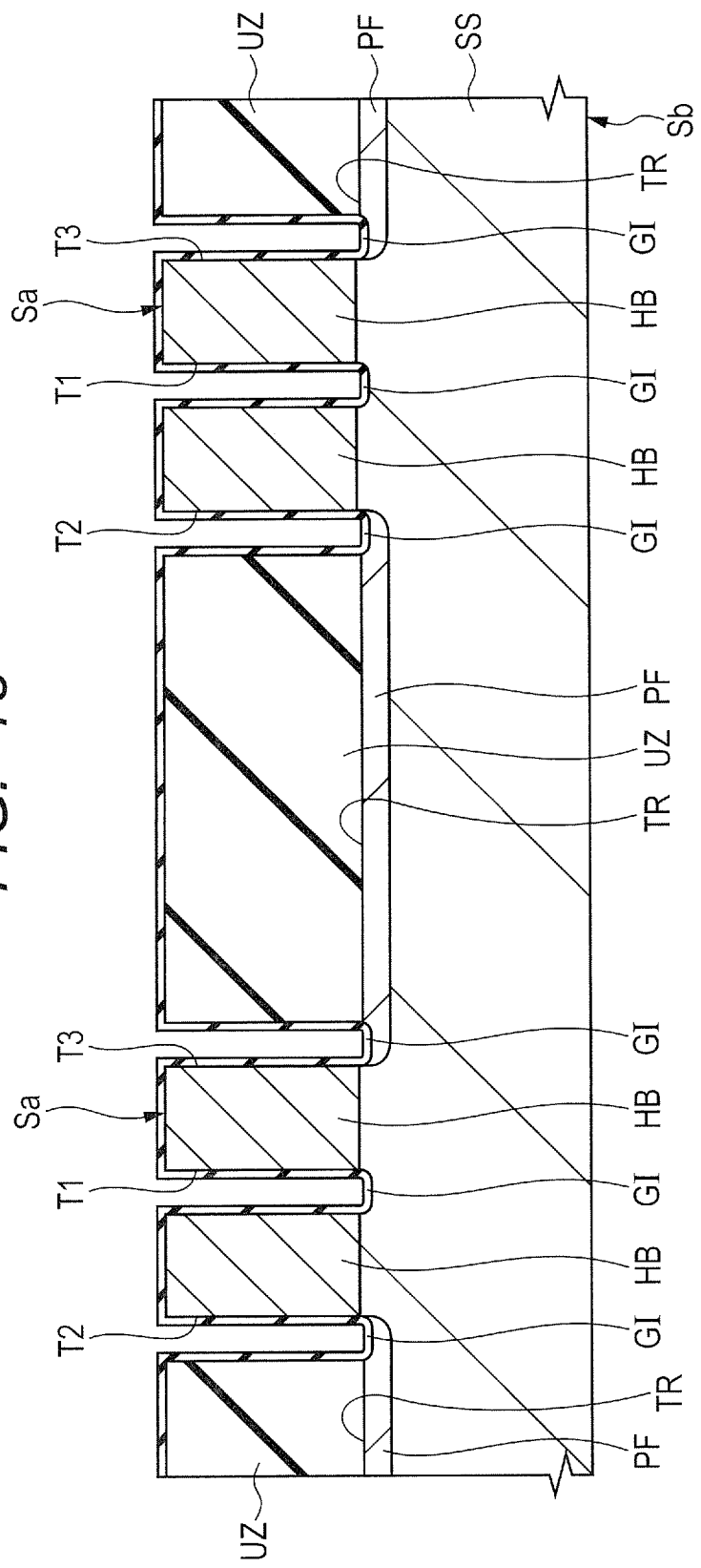
FIG. 18 is a fragmentary sectional diagram following FIG. 17 in the manufacturing process of the semiconductor device.

Next, as shown in FIG. 18, an insulating film GI comprised of, for example, silicon oxide is formed over the surface Sa of the semiconductor substrate SS and at the respective inner surfaces (side surfaces and bottom faces) of the trenches T1, T2, and T3.

When the insulting film GI is formed by, for example, a CVD method, the insulating film GI is formed over the surface Sa of the semiconductor substrate SS, the entire inner surfaces of the trenches T1, T2, and T3, and the embedded insulating film UZ. In this case, in the manufactured semiconductor device, the insulating film GI is interposed even between the embedded insulating film UZ and the trench gate electrode TG2 and between the embedded insulting film UZ and the trench gate electrode TG3.

On the other hand, when the insulting film GI is formed by a thermal oxidation method, it is as follows. That is, since the insulating film GI is formed over the surface Sa of the semiconductor substrate SS, and the semiconductor substrate SS is exposed at the bottom face and both side surfaces of the trench T1, the exposed surfaces of the semiconductor substrate SS are oxidized and thereby the insulating film GI is formed at the bottom face and both side surfaces of the trench T1. Further, since the semiconductor substrate SS is exposed at the side surfaces and bottom faces of the trenches T2 and T3 on the sides opposite to the trench T1, the exposed surfaces of the semiconductor substrate SS are oxidized to form the insulating film GI. Since, however, the embedded insulating film UZ is exposed at the side surfaces of the trenches T2 and T3 on the sides adjacent to the embedded insulating film UZ, the insulating film GI may not be formed. Further, the insulating film GI may not be formed even over the embedded insulating film UZ. In this case, in the manufactured semiconductor device, the insulating film GI is not interposed between the embedded insulating film UZ and the trench gate electrode TG2 and between the embedded insulating film UZ and the trench gate electrode TG3. One side surface of the embedded insulating film UZ comes into contact with the trench gate electrode TG2, and the other side surface of the embedded insulating film UZ comes into contact with the trench gate electrode TG3.

Figure 19:
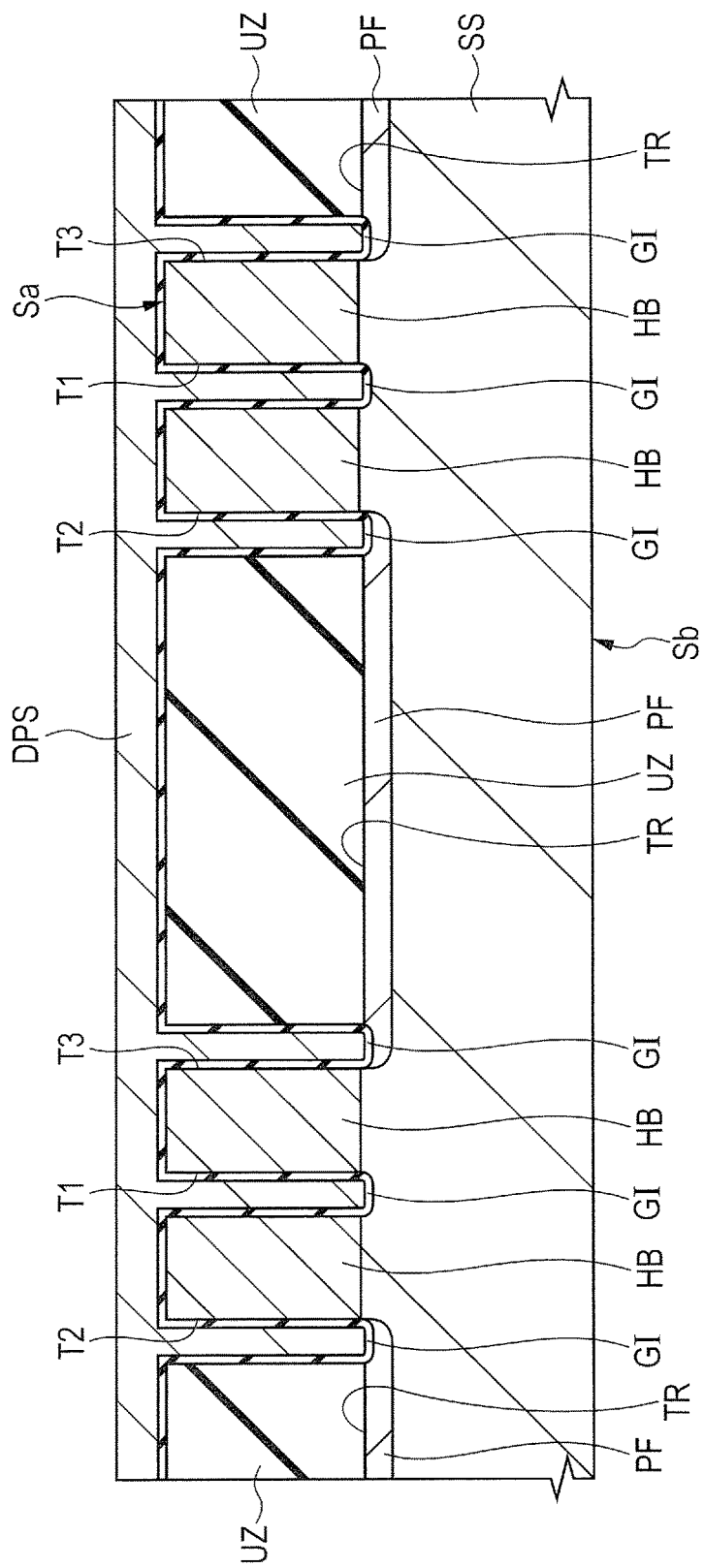
FIG. 19 is a fragmentary sectional diagram following FIG. 18 in the manufacturing process of the semiconductor device.

Next, as shown in FIG. 19, a doped polysilicon film DPS is formed over the surface Sa of the semiconductor substrate SS as a conductive film so as to fill in the trenches T1, T2, and T3 by using, for example, the CVD method or the like.

Figure 20:
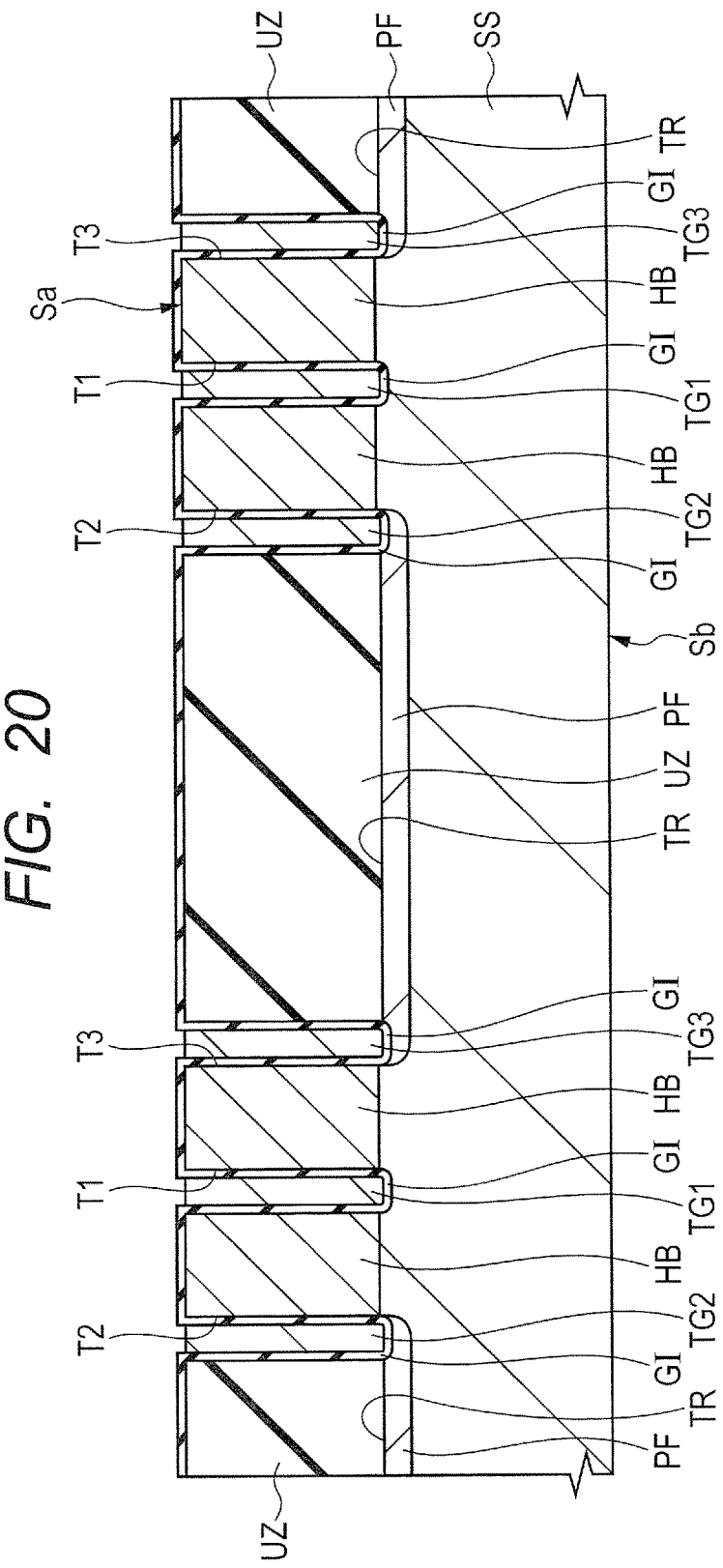
FIG. 20 is a fragmentary sectional diagram following FIG. 19 in the manufacturing process of the semiconductor device.

Next, as shown in FIG. 20, the doped polysilicon film DPS is etched back by, for example, dry etching or the like. Thus, the doped polysilicon film DPS outside the trenches T1, T2, and T3 is removed, and the doped polysilicon film DPS is left within the trenches T1, T2, and T3 to form the trench gate electrodes TG1, TG2, and TG3. The trench gate electrode TG1 is comprised of the doped polysilicon film DPS embedded within the trench T1 through the insulating film GI. The trench gate electrode TG2 is comprised of the doped polysilicon film DPS embedded within the trench T2 through the insulating film GI. The trench gate electrode TG3 is comprised of the doped polysilicon film DPS embedded within the trench T3 through the insulating film GI.

Figure 21:
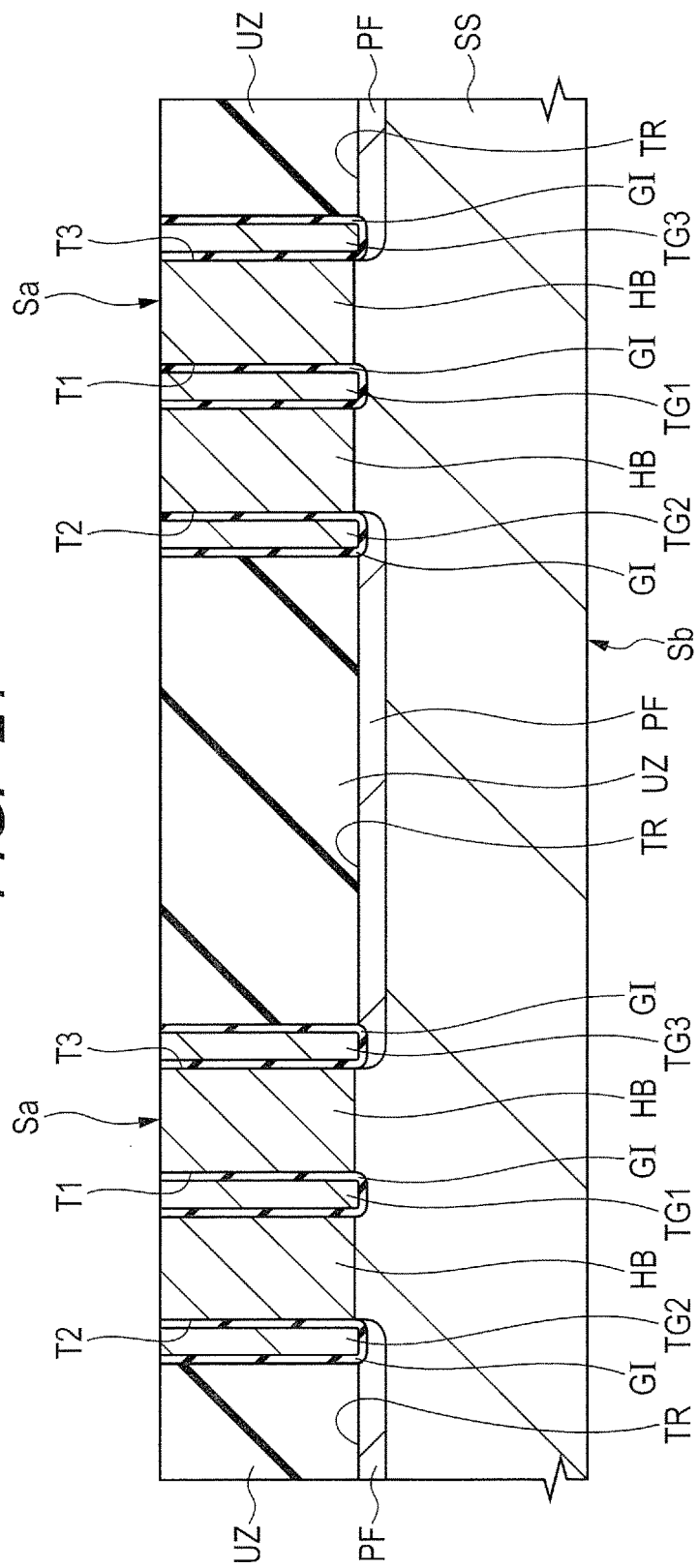
FIG. 21 is a fragmentary sectional diagram following FIG. 20 in the manufacturing process of the semiconductor device.

Next, as shown in FIG. 21, the insulating film GI lying outside each of the trenches T1, T2, and T3 is removed by etching (for example, wet etching). Further, upon this etching, the insulating film GI lying inside each of the trenches T1, T2, and T3, i.e., the insulating film GI interposed between each of the trench gate electrodes TG1, TG2, and TG3 and the semiconductor substrate SS is left without being etched.

Figure 22:
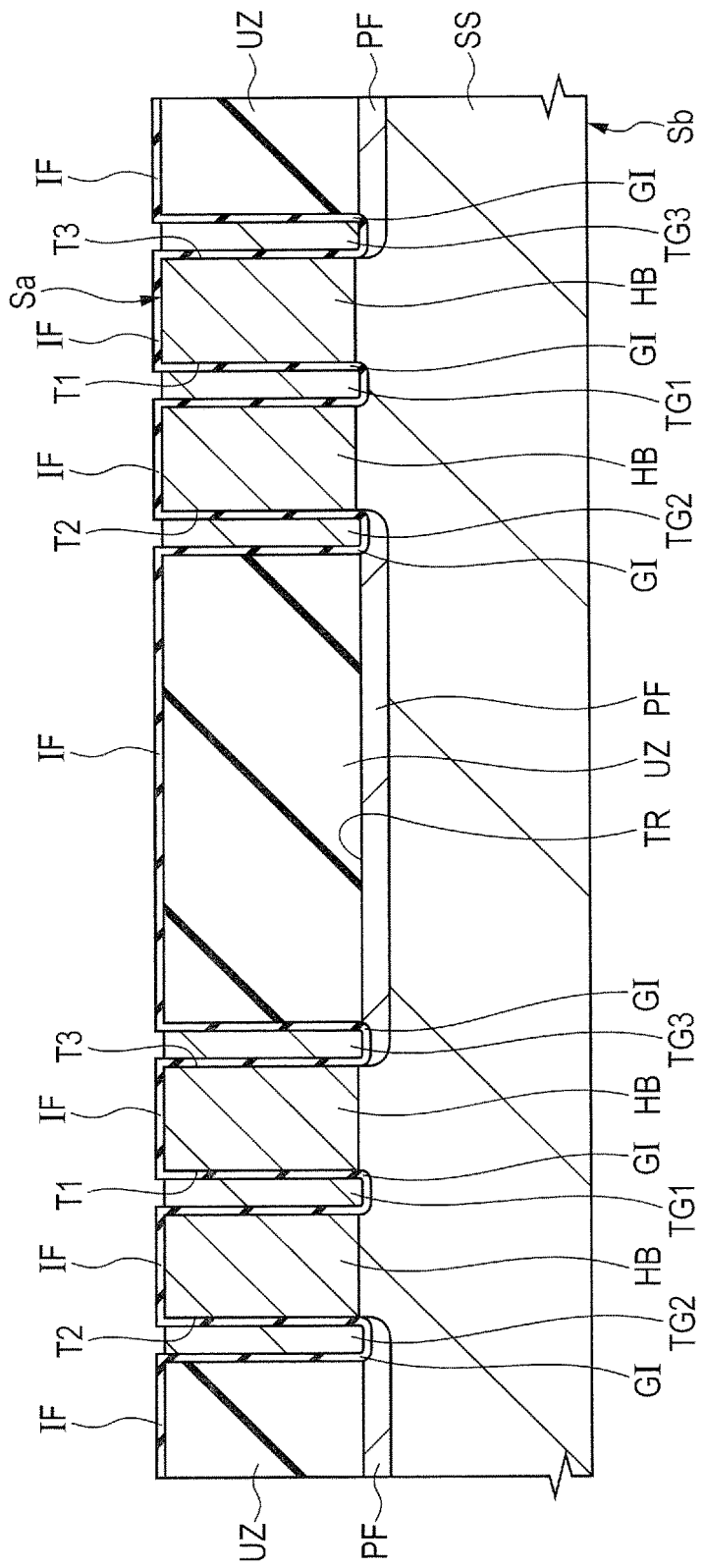
FIG. 22 is a fragmentary sectional diagram following FIG. 21 in the manufacturing process of the semiconductor device.

Next, as shown in FIG. 22, an insulating film IF comprised of a relatively thin silicon oxide film for ion implantation to be performed later is formed over the surface Sa of the semiconductor substrate SS. The insulating film IF is thinner than an interlayer insulating film IL to be formed later and has, for example, a thickness equal to that of the insulating film GI. As the insulating film IF, for example, an HLD film can be used. In that case, the insulating film IF is formed over the surface Sa of the semiconductor substrate SS and the embedded insulating film UZ. The formation of the insulating film IF can also be omitted if it is unnecessary. When the insulating film IF is formed, the insulating film IF may be interposed between the embedded insulating film UZ and the interlayer insulating film IL in the manufactured semiconductor device.

Figure 23:
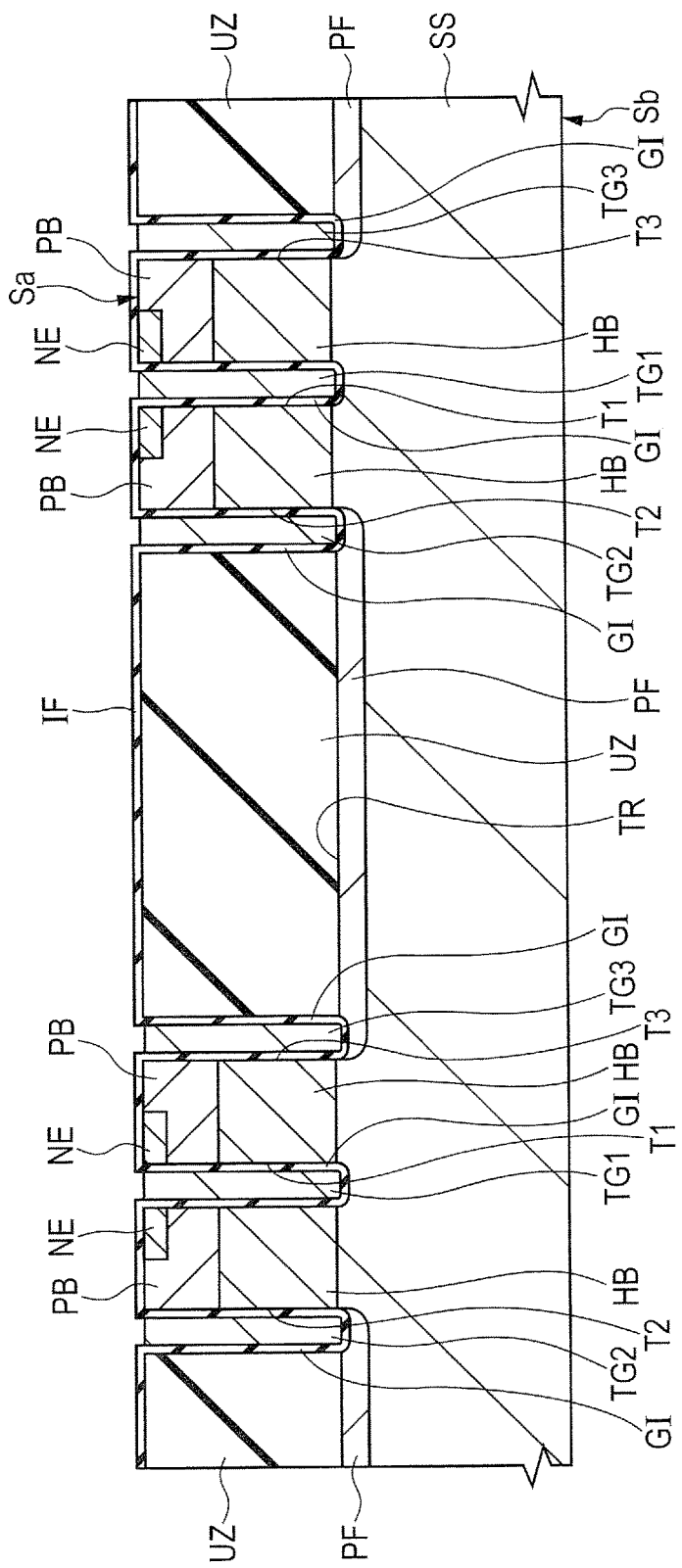
FIG. 23 is a fragmentary sectional diagram following FIG. 22 in the manufacturing process of the semiconductor device.

Next, a resist pattern (not shown here) for formation of a p-type body region PB is formed over the surface Sa of the semiconductor substrate SS by using a photolithography technique. Then, a p-type impurity (e.g., boron (B)) is introduced into the entire surface of a cell forming region CR and other required portions in the semiconductor substrate SS by, for example, an ion implantation method, using the resist pattern as a mask to form the p-type body region PB as shown in FIG. 23. Thus, in the semiconductor substrate SS to be the portion interposed between the trenches T1 and T2, and the semiconductor substrate SS to be the portion interposed between the trenches T1 and T3, the p-type body region PB is formed at the upper portion (upper layer portion) of the n-type hole barrier region HB.

Next, a resist pattern (not shown) for formation of an $n^+$-type emitter region NE is formed over the surface Sa of the semiconductor substrate SS by the photolithography technique. Then, an n-type impurity (e.g., arsenic (As)) is introduced into the semiconductor substrate SS by, for example, the ion implantation method, using the resist pattern as a mask to form the $n^+$-type emitter region NE as shown in FIG. 23. In the semiconductor substrate SS to be the portion interposed between the trenches T1 and T2, the $n^+$-type emitter region NE is formed at the upper portion (upper layer portion) of the p-type body region PB and a position adjacent to the trench T1. Further, in the semiconductor substrate SS to be the portion interposed between the trenches T1 and T3, the $n^+$-type emitter region NE is formed at the upper portion (upper layer portion) of the p-type body region PB and a position adjacent to the trench T1. The $n^+$-type emitter region NE comes into contact with the trench T1 but does not contact the trenches T2 and T3, and are separated from the trenches T2 and T3. As described above, the $n^+$-type emitter region NE is formed in an active section LCaa, but not formed in an inactive section LCai.

Figure 24:
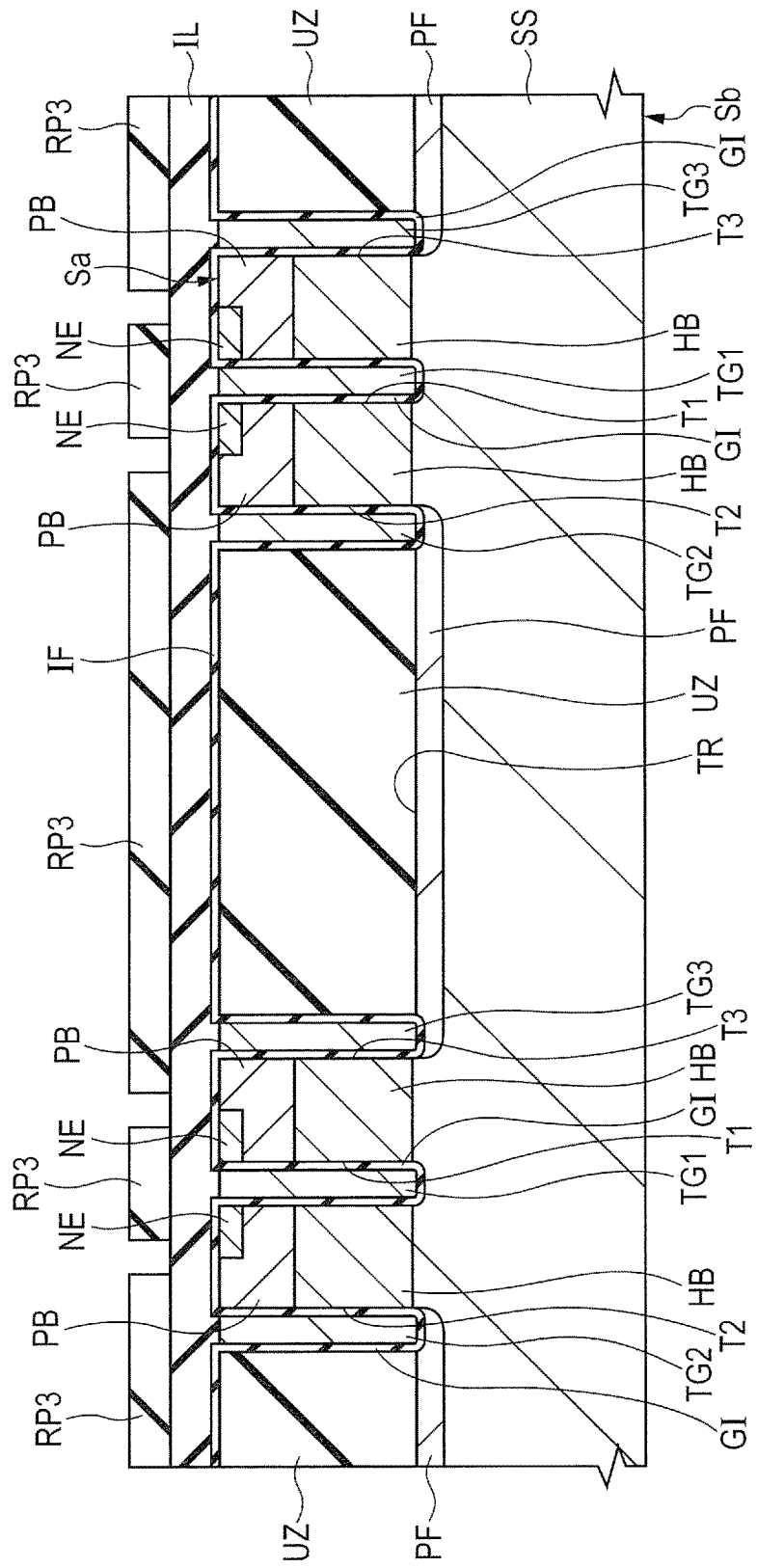
FIG. 24 is a fragmentary sectional diagram following FIG. 23 in the manufacturing process of the semiconductor device.

Next, as shown in FIG. 24, the interlayer insulating film IL is formed over the surface Sa of the semiconductor substrate SS so as to cover the trench gate electrodes TG1, TG2, and TG3 and the embedded insulating film UZ. The interlayer insulating film IL is comprised of a silicon oxide film or the like and can be formed by using the CVD method or spin coat method or the like. For example, a PSG (Phospho Silicate Glass) film or an SOG (Spin On Glass) film or the like can suitably be used.

Next, as shown in FIG. 24, a resist pattern RP3 is formed over the interlayer insulating film IL by using the photolithography technique. The resist pattern RP3 has an opening in each scheduled region for forming a contact trench CT.

Figure 25:
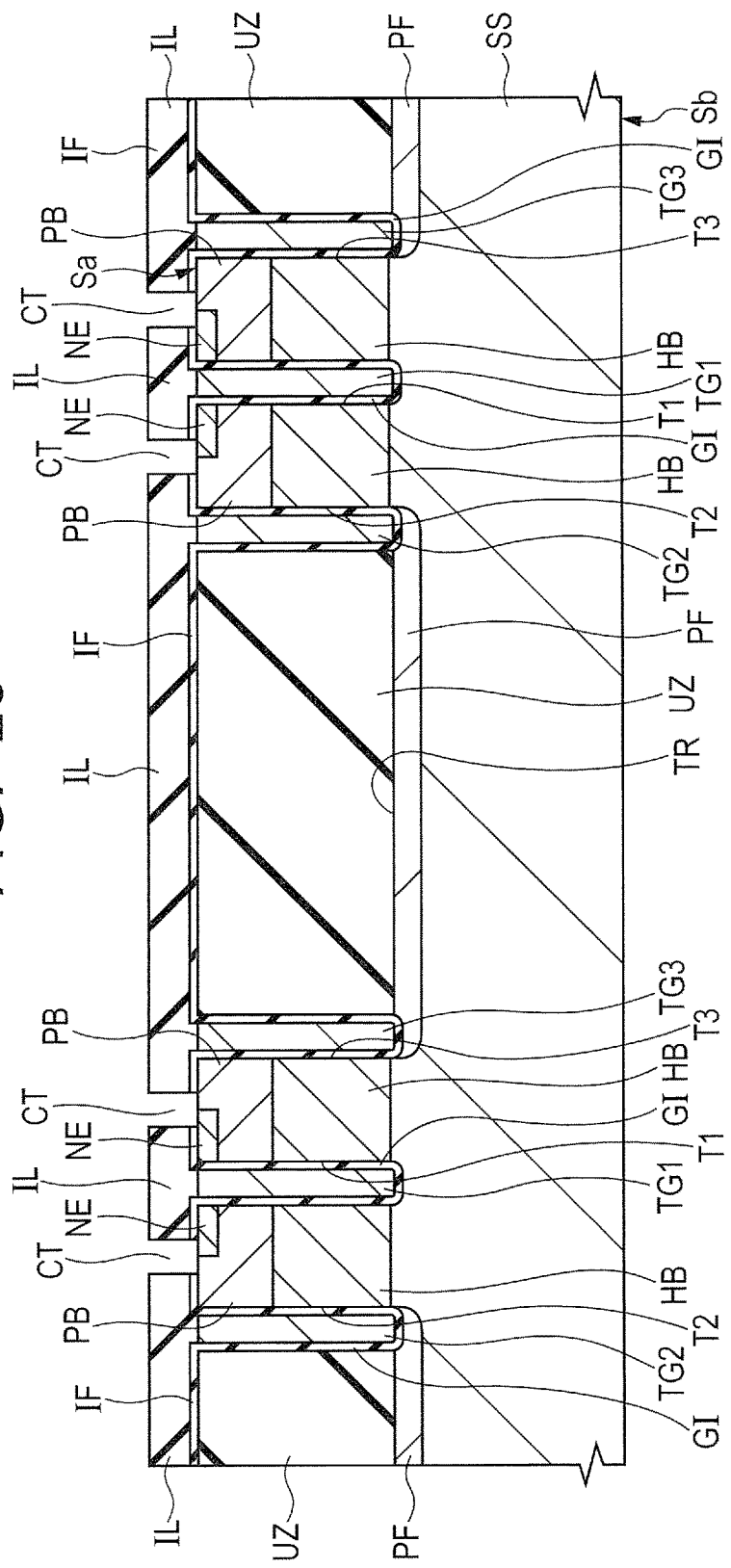
FIG. 25 is a fragmentary sectional diagram following FIG. 24 in the manufacturing process of the semiconductor device.

Next, the interlayer insulating film IL is etched (anisotropically dry-etched, for example) using the resist pattern RP3 as an etching mask to form each contact trench CT in the interlayer insulating film IL. Thereafter, the unwanted resist pattern RP3 is removed, and this stage is shown in FIG. 25.

Figure 26:
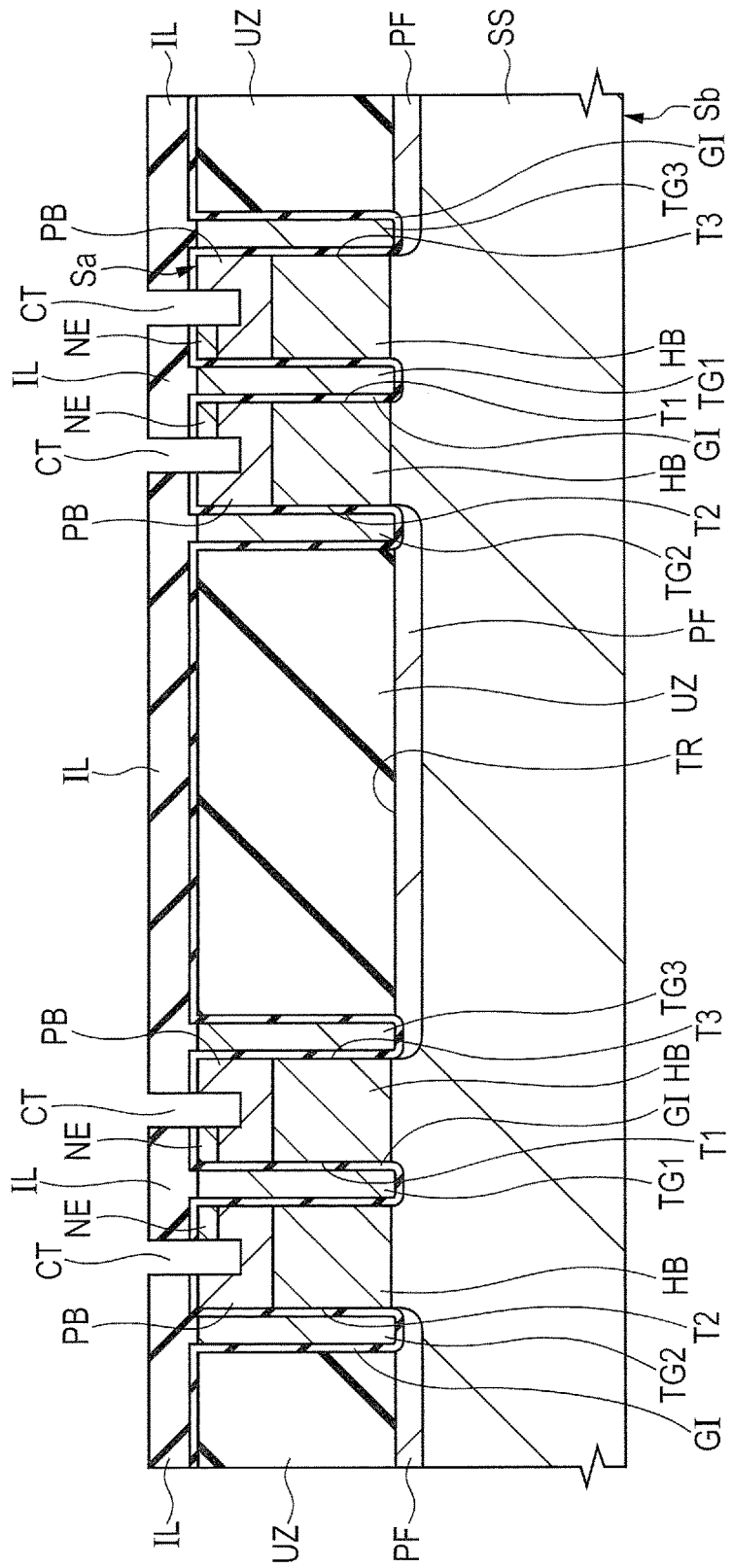
FIG. 26 is a fragmentary sectional diagram following FIG. 25 in the manufacturing process of the semiconductor device.

Next, as shown in FIG. 26, the contact trench CT is extended into the semiconductor substrate SS by digging the semiconductor substrate SS at the bottom face of the contact trench CT by, for example, anisotropic dry etching. Thus, the contact trench CT penetrates through the interlayer insulating film IL and becomes a state of reaching halfway up to the thickness of the p-type body region PB. The depth of the bottom face of the contact trench CT is deeper than that of the bottom face of the $n^+$-type emitter region NE and shallower than that of the bottom face of the p-type body region PB. At the bottom face of the contact trench CT, the p-type body region PB is exposed, and the p-type body region PB and the $n^+$-type emitter region NE are exposed at the side surface of the contact trench CT.

Figure 27:
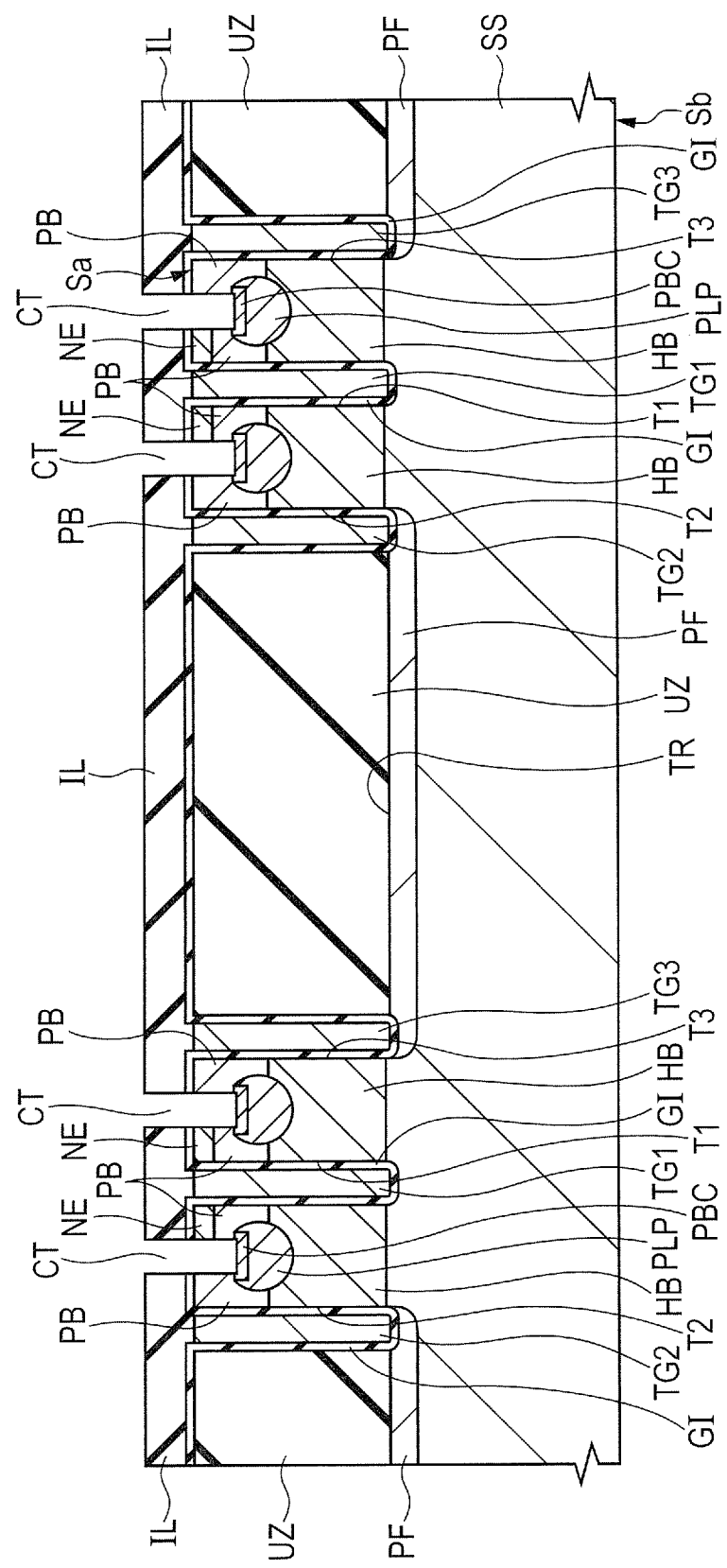
FIG. 27 is a fragmentary sectional diagram following FIG. 26 in the manufacturing process of the semiconductor device.

Next, as shown in FIG. 27, for example, a p-type impurity (e.g., boron (B)) is ion-implanted into the semiconductor substrate SS exposed at the bottom of the contact trench CT through the contact trench CT to thereby form a $p^+$-type body contact region PBC. Similarly, for example, a p-type impurity (e.g., boron (B)) is ion-implanted into the semiconductor substrate SS exposed at the bottom of the contact trench CT through the contact trench CT to thereby form a $p^+$-type latch-up preventing region PLP. The $p^+$-type body contact region PBC is formed in a region adjacent to the bottom face of the contact trench CT in the p-type body region PB. The $p^+$-type latch-up preventing region PLP is formed over both regions of the p-type body region PB and the n-type hole barrier region HB and adjacent to the $p^+$-type body contact region PBC, and reaches the n-type hole barrier region HB.

Figure 28:
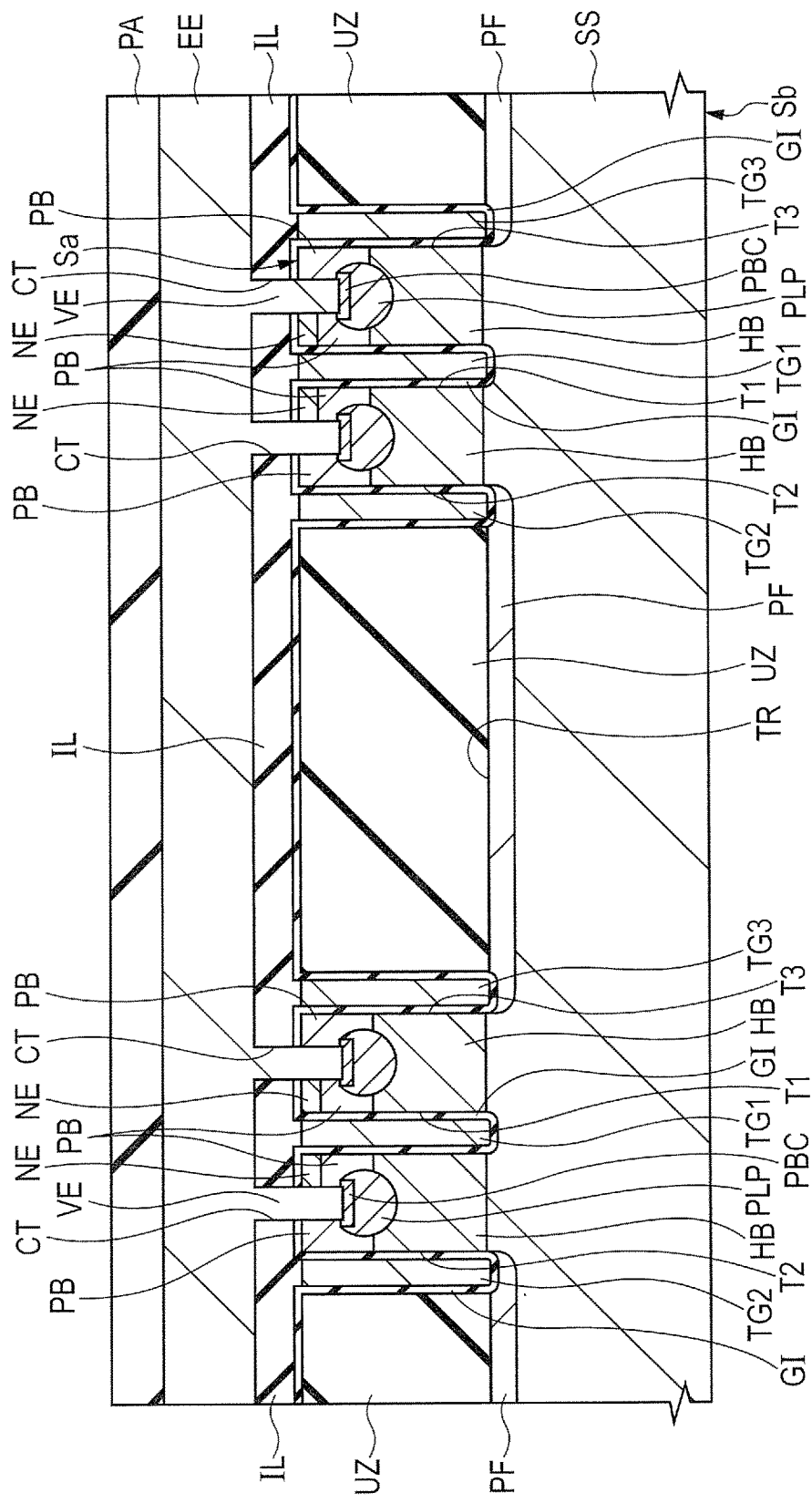
FIG. 28 is a fragmentary sectional diagram following FIG. 27 in the manufacturing process of the semiconductor device.

Next, as shown in FIG. 28, an emitter electrode EE is formed. Specifically, the formation thereof is performed by the following procedure, for example.

First, a TiW (titanium tungsten) film is formed over the interlayer insulating film IL including within the inner surfaces (bottom face and side surfaces) of the contact trench CT as a barrier metal film by, for example, sputtering. Most of titanium in the TiW film is shifted to the silicon interface by subsequent heat treatment to form silicide, and contributes to an improvement in contact characteristics.

Since, however, these processes are complicated, they are not shown in the drawing. If unnecessary, the formation of the TiW film and its subsequent silicide anneal can also be omitted.

Next, after the silicide anneal (heat treatment for silicidation) is executed in a nitrogen atmosphere, an aluminum-based metal film is formed over the entire surface of the barrier metal film by, for example, a sputtering method so as to fill each contact trench CT. The aluminum-based metal film is comprised principally of aluminum (Al). The aluminum-based metal film is added with silicon (Si) by a few atomic percent or so, and comprised of the balance aluminum (Al).

Next, a resist pattern (not shown) is formed over the aluminum-based metal film by the photolithography technique. Then, the aluminum-based metal film and the barrier metal film are etched (dry-etched, for example) using the resist pattern as an etching mask to thereby form the emitter electrode EE, the gate electrode GE, and the gate wiring GL. Any of the emitter electrode EE, the gate electrode GE, and the gate wiring GL is comprised of a laminated film of the aluminum-based metal film and the barrier metal film subjected to patterning. Incidentally, the gate wiring GL and the gate electrode GE are formed integrally. Thereafter, the resist pattern which becomes unnecessary is removed.

Next, as shown in FIG. 28, an insulating film PA is formed over the interlayer insulating film IL as a passivation film so as to cover the emitter electrode EE, the gate electrode GE and the gate wiring GL.

Next, a resist pattern (not shown) is formed over the insulating film PA by using the photolithography technique. Then, the insulating film PA is etched (dry-etched, for example) using the resist pattern as an etching mask to thereby form the above opening OPE and the above opening OPG in the insulating film PA. The opening OPE and the opening OPG penetrate through the insulating film PA, the above PDE is formed by the emitter electrode EE exposed from the opening OPE, and the above pad PDG is formed by the gate electrode GE exposed from the opening OPG. Thereafter, the unwanted resist pattern is removed.

Figure 29:
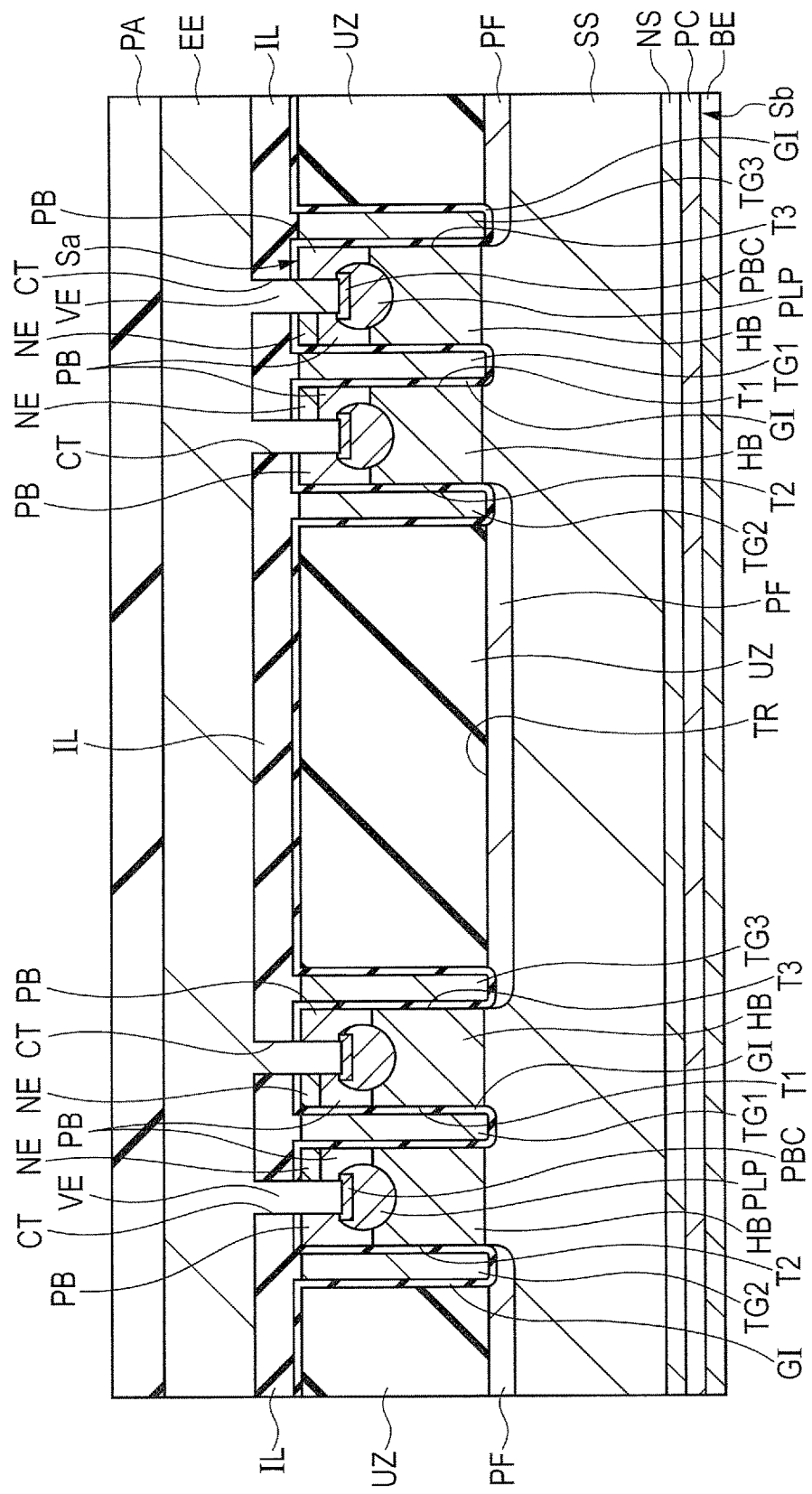
FIG. 29 is a fragmentary sectional diagram following FIG. 28 in the manufacturing process of the semiconductor device.

Next, as shown in FIG. 29, the back surface Sb of the semiconductor substrate SS is subjected to back-surface polishing processing to be made the thickness of the semiconductor substrate SS thin as needed.

Next, an n-type impurity (e.g., phosphor (P)) is introduced into the back surface Sb side of the semiconductor substrate SS by, for example, ion implantation to form an n-type field stop layer NS as shown in FIG. 29. Then, a p-type impurity (e.g., boron (B)) is introduced into the back surface Sb side of the semiconductor substrate SS by, for example, ion implantation to thereby form a $p^+$-type collector layer PC. After the ion implantation, laser anneal or the like can also be performed on the back surface Sb of the semiconductor substrate SS as needed for impurity activation.

Next, as shown in FIG. 29, a back electrode BE is formed over the back surface Sb of the semiconductor substrate SS by, for example, the sputtering method. When the back electrode BE is formed, the $p^+$-type collector layer PC is adjacent to the back electrode BE and electrically coupled thereto. The $p^+$-type collector layer PC is interposed between the n-type field stop layer NS and the back electrode BE.

Afterwards, the semiconductor substrate SS is divided (cut) into individual chip regions by dicing or the like to obtain the above semiconductor device (semiconductor chip) CP. The semiconductor device CP according to the present embodiment is manufactured in this manner. The so-obtained semiconductor device CP is packaged as needed.

<Configuration and Operation of IGBT>

Figure 30:
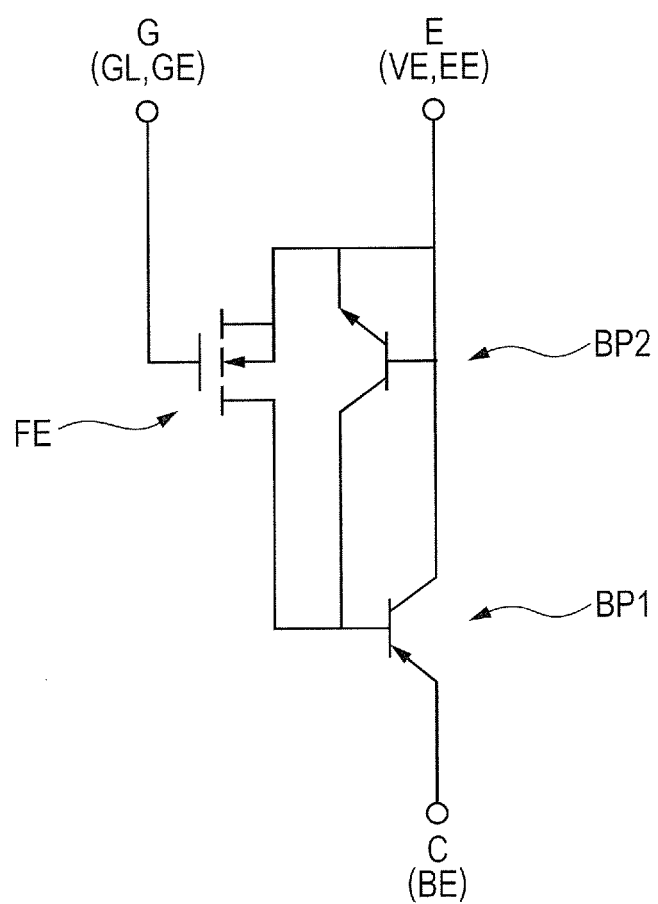
FIG. 30 is an equivalent circuit diagram of an IGBT.

FIG. 30 is an equivalent circuit diagram of the IGBT formed in the active sub cell region LCa1. Although the IGBT formed in the active sub cell region LCa1 will be described here, the IGBT formed in the active sub cell region LCa2 is also similar thereto.

A circuit configuration of the IGBT formed in the semiconductor substrate SS will be described while referring to FIG. 30 and FIG. 6 described above. Incidentally, reference symbol E in FIG. 30 is an emitter electrode. The coupling electrode VE formed in the active sub cell region LCa1 in FIG. 6 described above, or the emitter electrode EE electrically coupled to the coupling electrode VE corresponds to the emitter electrode E. Also, reference symbol C in FIG. 30 is a collector electrode. The above back electrode BE corresponds to the collector electrode C. Further, reference symbol G in FIG. 30 is an electrode for a gate. The above gate wiring GL or the above gate electrode GE electrically coupled to the gate wiring GL corresponds to the electrode G for the gate.

The IGBT formed in the active sub cell region LCa1 has a pnp bipolar transistor BP1, an npn bipolar transistor BP2, and a field effect transistor FE as shown in FIG. 30. Here, the IGBT is configured by the pnp bipolar transistor BP1 and the field effect transistor FE. The npn bipolar transistor BP2 is a parasitic transistor parasitically formed in terms of a device structure.

The pnp bipolar transistor BP1 is comprised of a p-type semiconductor region (p-type emitter region) comprised of a p-type body region PB, a $p^+$-type body contact region PBC, and a $p^+$-type latch-up preventing region PLP, an n-type semiconductor region (n-type base region) comprised of an n-type hole barrier region HB, an $n^-$-type drift region ND, and an n-type field stop layer NS, and a p-type semiconductor region (p-type collector region) comprised of a $p^+$-type collector layer PC.

Also, the npn bipolar transistor BP2 which is a parasitic component is comprised of an n-type semiconductor region (n-type emitter region) comprised of an $n^+$-type emitter region NE, a p-type semiconductor region (p-type base region) comprised of a p-type body region PB, a $p^+$-type body contact region PBC, and a $p^+$-type latch-up preventing region PLP, and an n-type semiconductor region (n-type collector region) comprised of an n-type hole barrier region HB, an $n^-$-type drift region ND, and an n-type field stop layer NS.

Further, the field effect transistor FE is comprised of an $n^+$-type emitter region NE to be a source region, an n-type hole barrier region HB to be a drain region, a gate insulating film (insulating film GI) formed at the side surface of a trench T1, and a trench gate electrode TG1 embedded into the trench T1 through the gate insulating film (insulating film GI). A gate electrode of the field effect transistor FE is configured by the trench gate electrode TG1. The p-type body region PB to be a portion positioned between the $n^+$-type emitter region NE and the n-type hole barrier region HB and opposite to the trench gate electrode TG1 through the gate insulating film (insulating film GI) becomes a channel forming region of the field effect transistor FE. Therefore, the p-type body region PB can be assumed to be a p-type semiconductor region (channel forming region) for channel formation.

A description will next be made about a coupling relation between the pnp bipolar transistor BP1, the npn bipolar transistor BP2, and the field effect transistor FE.

The pnp bipolar transistor BP1 is coupled between the emitter electrode E and the collector electrode C. Further, an n-type base of the pnp bipolar transistor BP1 is coupled to the drain region of the field effect transistor FE. The source region of the field effect transistor FE is coupled to the emitter electrode E. At this time, an n-type collector of the npn bipolar transistor BP2 formed parasitically is coupled to the n-type base of the pnp bipolar transistor BP1. An n-type emitter of the npn bipolar transistor BP2 is coupled to the emitter electrode E. A p-type base of the npn bipolar transistor BP2 is coupled to the emitter electrode E.

The operation of the IGBT will next be described with reference to FIG. 30.

A gate voltage greater than or equal to a threshold voltage is applied to the gate electrode of the field effect transistor FE through the electrode G in a state in which a higher potential than at the emitter electrode E is applied to the collector electrode C. Then, the field effect transistor FE is turned on so that a base current of the pnp bipolar transistor BP1 flows. Consequently, a current flows between the collector electrode C and the emitter electrode E to which the pnp bipolar transistor BP1 is coupled. That is, the pnp bipolar transistor BP1 is turned on (conducted). Thus, the IGBT is turned on (conducted). Subsequently, a gate voltage less than or equal to the threshold voltage is applied to the gate electrode of the field effect transistor FE. Then, the field effect transistor FE is turned off so that the base current of the pnp bipolar transistor BP1 does not flow. Therefore, the current flowing between the collector electrode C and the emitter electrode E, based on the base current does not flow. That is, as a result of turning off of the pnp bipolar transistor BP1, the IGBT is turned off. Thus, in the IGBT, the conduction and cutoff of the base current of the pnp bipolar transistor BP1 are controlled by controlling on/off of the field effect transistor FE. With the conduction and cutoff of the base current of the pnp bipolar transistor BP1, the conduction and cutoff of a collector current of the pnp bipolar transistor BP1 are controlled as a result and hence the on/off of the IGBT is controlled. Thus, the IGBT is a semiconductor element which combines a high-speed switching characteristic and a voltage drive characteristic of the field effect transistor FE, and a low on-voltage characteristic of the pnp bipolar transistor BP1.

The operation of the IGBT in the device structure will next be described with reference to FIG. 6.

A gate voltage greater than or equal to a threshold voltage is applied to the trench gate electrode TG1 through the gate electrode GE and the gate wiring GL in a state in which a higher potential than at the emitter electrode EE is applied to the back electrode BE. Then, an inversion layer (channel) comprised of an n-type semiconductor layer is formed in the p-type body region PB opposite to the trench gate electrode TG1 through the insulating film GI. Thus, the n$^+$-type emitter region NE and the n-type hole barrier region HB are electrically coupled by the inversion layer, so that electrons flow from the n$^+$-type emitter region NE to the n-type base region (n-type hole barrier region HB, n$^-$-type drift region ND, and n-type field stop layer NS) through the inversion layer. On the other hand, since the n-type base region (HB, ND, NS) and the p$^+$-type collector layer PC are forward-biased therebetween, positive holes (holes) are injected from the p$^+$-type collector layer PC to the n-type base region. Therefore, the positive holes are accumulated in the n-type base region (NS, ND, HB). As a result of attraction of electrons by a positive electric charge based on the accumulated positive holes, a large quantity of electrons flow into the n-type base region (HB, ND, NS). Thus, the resistance of the n-type base region (HB, ND, NS) is lowered. This phenomenon is so-called conductivity modulation. The on voltage (difference in potential between the emitter electrode E and the collector electrode C in an on state) of the IGBT becomes low by the conductivity modulation. Further, the positive holes having flowed into the n-type base region (NS, ND, HB) flow out to the emitter electrode EE through the p-type semiconductor region (p-type body region PB, p$^+$-type latch-up preventing region PLP, and p$^+$-type body contact region PBC). Thus, with the flow of the current from the back electrode BE to the emitter electrode EE, the IGBT is turned on. At this time, it is considered that the positive holes injected from the p$^+$-type collector layer PC to the n-type base region (NS, ND, HB) are recombined with the electrons existing in the n-type base region (NS, ND, HB). However, a semiconductor material comprised principally of silicon has a property hardly causing recombination of the electrons and the positive holes as compared with a semiconductor material comprised principally of a compound semiconductor. Accordingly, most of the positive holes injected into the n-type base region (NS, ND, HB) are accumulated without being recombined with the electrons lying in the n-type base region (NS, ND, HB). As a result, the positive holes are accumulated in the n-type base region (NS, ND, HB), and the electrons made to flow in from the n$^+$-type emitter region NE are accumulated in the n-type base region (HB, ND, NS) so as to be attracted to the accumulated positive holes, so that the conductivity modulation occurs. From the above, the IGBT has a characteristic that its on voltage becomes low by the conductivity modulation.

The active cell regions LCa each comprised of the active sub cell region LCa1 and the active sub cell region LCa2 in each of which such an IGBT is formed, are formed in plural in the cell forming region CR of the semiconductor substrate SS and disposed (arranged) regularly. A plurality of unit IGBTs are in a state of being coupled in parallel between the emitter electrode EE and the back electrode BE. Here, the IGBTs respectively formed in the active sub cell region LCa1 and the active sub cell region LCa2 in each active cell region LCa are referred to as unit IGBTs. The gate electrodes (trench gate electrodes TG1) of the unit IGBTs are electrically coupled to each other through the gate wiring GL and electrically coupled to the common gate pad PDG (gate electrode GE) through the gate wiring GL. By means of the unit IGBTs coupled in parallel, one power transistor (power IGBT) is formed between the emitter electrode EE and the back electrode BE and hence between the pad PDE and the back electrode BE.

Examples to be Examined

As described above, the positive holes are accumulated in the n-type base region in the on state of the IGBT. In order to switch the IGBT from the on state to the off state, the voltage of each of the trench gate electrodes TG1 and TG2 is set to the voltage less than or equal to the threshold value. However, even though the voltage of each of the trench gate electrodes TG1 and TG2 is set to the voltage less than or equal to the threshold value, the IGBT is not turned off immediately, and is delayed in turn-off by a time required to cause the positive holes accumulated in the n-type base region to flow to the outside of the IGBT. Incidentally, a fixed time is required until the IGBT is completely turned off without immediate cutoff of the current after the off voltage is applied to the gate electrode (trench gate electrode TG1 herein). This is referred to as a turn-off loss. Therefore, it is desirable that in order to turn off the IGBT quickly to thereby prevent the current from flowing promptly when the off operation of setting the voltage of the trench gate electrode TG1 to the voltage less than or equal to the threshold value is performed, the positive holes accumulated in the n-type base region are immediately discharged to the outside of the IGBT at the off operation.

Figure 31:
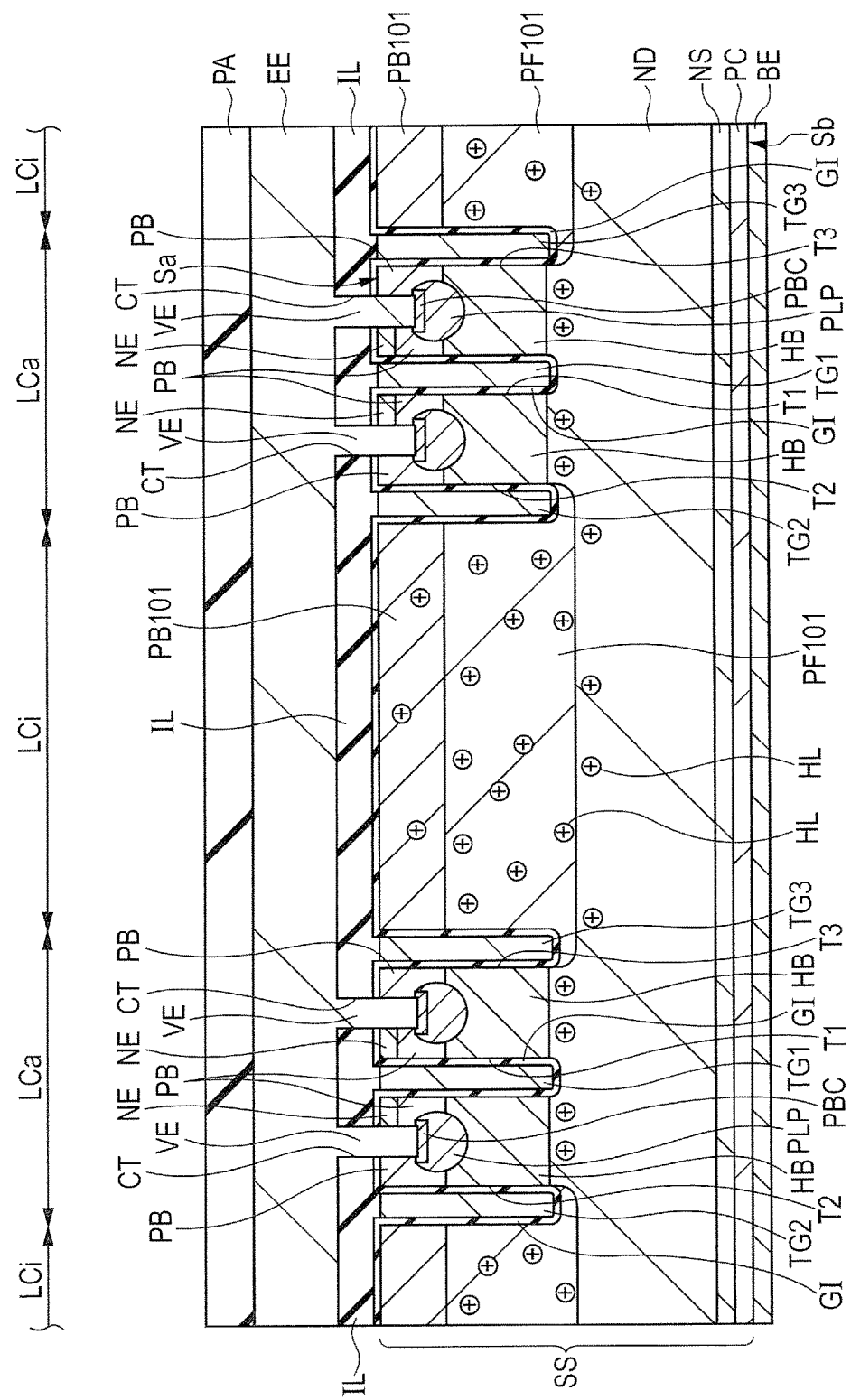
FIG. 31 is a fragmentary sectional diagram of a semiconductor device according to a first examination example.

Here, FIG. 31 is a fragmentary sectional diagram of a semiconductor device according to a first examination example examined by the present inventors. A cross section corresponding to FIG. 6 described above is shown therein. However, a state in which positive holes (holes) HL are accumulated in an on state of an IGBT is shown in FIG. 31.

In the semiconductor device according to the first examination example shown in FIG. 31, there is no formed one corresponding to an embedded insulating film UZ. Therefore, the surface of a semiconductor substrate SS in an inactive cell region LCi is at the substantially same height position as the surface of the semiconductor substrate SS in an active cell region LCa. In the semiconductor device according to the first examination example shown in FIG. 31, a p-type body region PB101 is formed at an upper layer portion of the semiconductor substrate SS, and a p-type floating region PF101 is formed below the p-type body region PB101 in an inactive cell region LCi. The p-type body region PB101 is formed in the same process as at the p-type body region PB. An $n^-$-type drift region ND exists below the p-type floating region PF101. There is provided such a structure that the depth of the bottom face of the p-type floating region PF101 is deeper than the depths of the bottom faces of trenches T1, T2, and T3, and the bottom faces of the trenches T2 and T3 are covered with the p-type floating region PF101. Thus, since the p-type floating region PF101 is interposed between the bottom faces of the trenches T2 and T3 and the $n^-$-type drift region ND low in impurity concentration, it is possible to suppress or prevent electric field concentration in the neighborhood of trench gate electrodes TG2 and TG3 when the IGBT is turned off, thereby making it possible to improve the breakdown voltage of the semiconductor device.

The semiconductor device according to the first examination example shown in FIG. 31 has a disadvantageous structure in that the positive holes accumulated at the turning-on are discharged immediately at the turning-off.

As shown in FIG. 31, in the semiconductor device according to the first examination example, the positive holes HL are accumulated in the on state of the IGBT. Main spots for accumulation of the positive holes HL include the $n^-$-type drift region ND below the n-type hole barrier region HB, the $n^-$-type drift region ND below the p-type floating region PF101, the inside of the p-type floating region PF101, and the inside of the p-type body region PB101.

Of these, the positive holes HL accumulated in the p-type floating region PF101 and the p-type body region PB101, particularly, the positive holes HL accumulated at a position shallow to a certain degree in the p-type floating region PF101, and the positive holes HL accumulated in the p-type body region PB101 are hard to be discharged to the emitter electrode EE even if the IGBT is switched from the on state to the off state. This is because in order to discharge the positive holes HL accumulated at the position shallow to the certain degree in the p-type floating region PF101, and the positive holes HL accumulated in the p-type body region PB101 to the emitter electrode EE (coupling electrode VE), the positive holes HL are required to go beyond the trench gate electrode TG2 (trench T2) or the trench gate electrode TG3 (trench T3). That is, in the semiconductor device according to the first examination example shown in FIG. 31, it takes a certain time for the positive holes HL accumulated at the upper portion of the semiconductor substrate SS in the inactive cell region LCi to go beyond the trench gate electrode TG2 (trench T2) or the trench gate electrode TG3 (trench T3) at the off operation and to be discharged to the emitter electrode EE (coupling electrode VE). It is desirable that since the time required to discharge the positive holes HL leads to a switching loss (turn-off loss), the positive holes HL are prevented from being accumulated in a spot where they are hard to be discharged upon switching from the on state to the off state, as much as possible at the turning-on.

Main Features and Effects

The semiconductor device according to the present embodiment is of the semiconductor device equipped with the IGBT. The semiconductor device according to the present embodiment has the semiconductor substrate SS having the surface Sa (first main surface) and the back surface Sb (second main surface) on the side opposite to the surface Sa, the $p^+$-type collector layer PC (collector region) formed on the back surface Sb side in the semiconductor substrate SS, and the back electrode BE (collector electrode) formed over the back surface SB of the semiconductor substrate SS and electrically coupled to the $p^+$-type collector layer PC. The semiconductor device according to the present embodiment further has, within the semiconductor substrate SS, the $n^-$-type drift region ND formed over the $p^+$-type collector layer PC, and a first IGBT cell region and a second IGBT cell region formed on the surface Sa side of the semiconductor substrate SS and disposed apart from each other in the X direction (first direction) in plan view. For example, the active cell region LCa on the right side (right side in the X direction) of FIG. 6 corresponds to the first IGBT cell region, and the active cell region LCa on the left side (left side in the X direction) of FIG. 6 corresponds to the second IGBT cell region. The semiconductor device according to the present embodiment further has the embedded insulating film UZ formed on the surface Sa side of the semiconductor substrate SS and disposed between the first IGBT cell region and the second IGBT cell region in plan view, the interlayer insulating film IL formed over the first IGBT cell region, the second IGBT cell region, and the embedded insulating film UZ, and the emitter electrode EE formed over the interlayer insulating film IL.

The configuration of the first IGBT cell region (active cell region LCa on the right side of FIG. 6, for example) will specifically be shown here as follows. The first IGBT cell region includes the trench T1 (first trench) formed on the surface side of the semiconductor substrate SS and extending in the Y direction (second direction) crossing the X direction in plan view, and the trenches T2 (second trench) and T3 (third trench) formed on the surface side of the semiconductor substrate SS, disposed on both sides with the trench T1 interposed therebetween and extending in the Y direction in plan view. The first IGBT cell region further includes the trench gate electrode TG1 (first trench gate electrode) formed within the trench T1 (first trench) through the insulating film GI (first insulating film). The first IGBT cell region furthermore includes the trench gate electrode TG2 (first trench electrode) formed within the trench T2 (second trench) through the insulating film GI (second insulating film), and the trench gate electrode TG3 (second trench electrode) formed within the trench T3 (third trench) through the insulating film GI (third insulating film).

Further, the configuration of the second IGBT cell region (active cell region LCa on the left side of FIG. 6, for example) will specifically be shown as follows. The second IGBT cell region includes the trench T1 (fourth trench) formed on the surface side of the semiconductor substrate SS and extending in the Y direction in plan view, and the trench T2 (fifth trench) and the trench T3 (sixth trench) formed on the surface side of the semiconductor substrate SS, disposed on both sides with the trench T1 interposed therebetween, and extending in the Y direction in plan view. The second IGBT cell region further includes the trench gate electrode TG1 (second trench gate electrode) formed within the trench T1 (fourth trench) through the insulating film GI (fourth insulating film). The second IGBT cell region furthermore includes the trench gate electrode TG2 (third trench electrode) formed within the trench T2 (fifth trench) through the insulating film GI (fifth insulating film), and the trench gate electrode TG3 (fourth trench electrode) formed within the trench T3 (sixth trench) through the insulating film GI (sixth insulating film). The trench gate electrodes TG2 and TG3 (first and second trench electrodes) in the first IGBT cell region and the trench gate electrodes TG2 and TG3 (third and fourth trench electrodes) in the second IGBT cell region are electrically coupled to the emitter electrode EE formed over the interlayer insulating film IL. The trench gate electrode TG1 (first trench gate electrode) in the first IGBT cell region and the trench gate electrode TG1 (second trench gate electrode) in the second IGBT cell region are electrically coupled to the gate electrode GE formed over the interlayer insulating film IL.

One of main features of the semiconductor device according to the present embodiment resides in that the embedded insulating film UZ is provided between the first IGBT cell region and the second IGBT cell region, i.e., between the active cell regions LCa adjacent to each other in the X direction.

More particularly, the embedded insulating film UZ is adjacent to the trench T2 (second trench) in the first IGBT cell region (active cell region LCa on the right side of FIG. 6, for example) in the X direction and adjacent to the trench T3 (sixth trench) in the second IGBT cell region (active cell region LCa on the left side of FIG. 6, for example) in the X direction. The substrate region comprised of the semiconductor substrate SS is not interposed between the embedded insulating film UZ and the trench gate electrode TG2 (second trench electrode) in the first IGBT cell region (active cell region LCa on the right side of FIG. 6, for example) and between the embedded insulating film UZ and the trench gate electrode TG3 (fourth trench electrode) in the second IGBT cell region (active cell region LCa on the left side of FIG. 6, for example).

Incidentally, since the embedded insulting film UZ is embedded in the semiconductor substrate SS, it has the following features. That is, the upper surface of the embedded insulating film UZ is substantially flat. Further, the upper surface of the embedded insulating film UZ is at the substantially same height position as the upper surface of the semiconductor substrate SS in the active cell region LCa. Therefore, the surface (Sa) of the semiconductor substrate SS in the first IGBT cell region, the surface (Sa) of the semiconductor substrate SS in the second IGBT cell region, and the upper surface of the embedded insulating film UZ are at the same height. Also, although the interlayer insulating film IL is formed over the embedded insulating film UZ and the emitter electrode EE is formed over the interlayer insulating film IL, the upper surface of the interlayer insulating film IL is flat above the embedded insulating film UZ. Further, the lower surface of the emitter electrode EE is flat above the embedded insulating film UZ. Furthermore, the embedded insulating film UZ and the interlayer insulating film IL are interposed between the emitter electrode EE to be a portion positioned above the embedded insulating film UZ and the semiconductor substrate SS to be a portion positioned below the embedded insulating film UZ.

Figure 32:
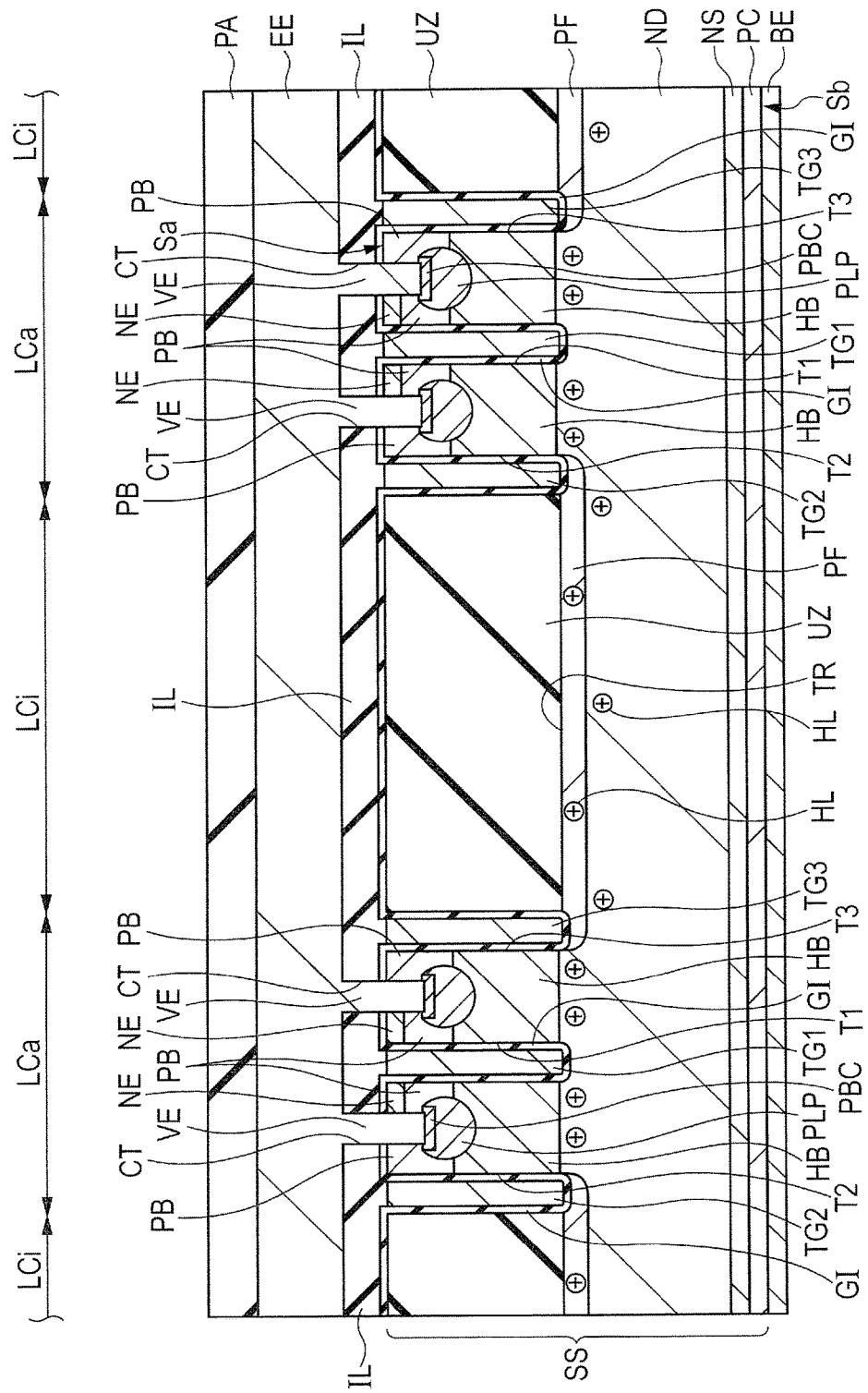
FIG. 32 is a fragmentary sectional diagram of the semiconductor device according to the one embodiment.

In the present embodiment, the turn-off loss can be improved by providing the embedded insulating film UZ between the first IGBT cell region and the second IGBT cell region, i.e., between the active cell regions LCa adjacent to each other. This will be described with reference to FIG. 32. FIG. 32 is a fragmentary sectional diagram of the semiconductor device according to the present embodiment. While the same cross section as FIG. 6 described above is shown in FIG. 32, a state in which the positive holes HL are accumulated in the on state of the IGBT is illustrated in FIG. 32.

As shown in FIG. 32, in the semiconductor device according to the present embodiment, the positive holes HL are accumulated in the on state of the IGBT. Main spots for accumulating the positive holes HL include the $n^-$-type drift region ND below the n-type hole barrier region HB, the $n^-$-type drift region ND below the p-type semiconductor region PF, and the inside of the p-type semiconductor region (p-type floating region) PF. Of these, the positive holes HL accumulated in the $n^-$-type drift region ND below the n-type hole barrier region HB are easy to be discharged to the emitter electrode EE via the n-type hole barrier region HB and the p-type semiconductor region (PB, PLP, PBC) when the IGBT is switched from the on state to the off state. Further, the positive holes HL accumulated in the $n^-$-type drift region ND below the p-type semiconductor region PF are also easy to be discharged to the emitter electrode EE (coupling electrode VE) via the $n^-$-type drift region ND, the n-type hole barrier region HB, and the p-type semiconductor region (PB, PLP, PBC) when the IGBT is switched from the on state to the off state. Furthermore, since the positive holes HL accumulated in the p-type semiconductor region PF also need not go beyond the trench gate electrodes TG2 and TG3 (trenches T2 and T3) though they are discharged to the emitter electrode EE, the positive holes HL are easy to be discharged to the emitter electrode EE (coupling electrode VE). That is, with the provision of the embedded insulating film UZ between the active cell regions LCa (IGBT cell regions) adjacent to each other, the positive holes HL accumulated in the semiconductor substrate SS in the inactive cell region LCi need not go beyond the trench gate electrodes TG2 and TG3 (trenches T2 and T3) upon discharging the positive holes HL. It is therefore possible to shorten the time required to discharge the positive holes HL at the turning-off. Therefore, the semiconductor device according to the present embodiment is capable of shortening the time required to discharge the positive holes HL accumulated at the turning-on to the emitter electrode EE at the turning-off as compared with the semiconductor device according to the first examination example.

That is, in the case of the semiconductor device according to the first examination example, the positive holes HL are accumulated even above the semiconductor substrate SS between the active cell regions LCa (i.e., inactive cell regions LCi) adjacent to each other and difficult to be discharged to the emitter electrode EE at the off operation, thereby increasing the turn-off loss of the IGBT.

On the other hand, in the case of the present embodiment, the embedded insulating film UZ is provided between the active cell regions LCa (i.e., inactive cell regions LCi) adjacent to each other. Thus, the positive holes HL are prevented from being accumulated in the spot in which the embedded insulating film UZ exits, when the IGBT is at the on operation. The region formed with the embedded insulating film UZ serves as a region hard to discharge the positive holes at the turning-off if the region is comprised of the semiconductor substrate SS and the positive holes are accumulated at the turning-on. Therefore, the embedded insulating film UZ is provided in advance at the spot where the positive holes are difficult to be discharged upon switching from the on state to the off state, to prevent the accumulation of the positive holes at the turning-on, thereby making it possible to shorten the time required to discharge the positive holes HL accumulated at the turning-on to the emitter electrode EE (coupling electrode VE) at the turning-off. That is, the time (turn-off loss) from execution of the off operation to the current ceasing to flow after the IGBT is turned off can be made to be shorter (smaller). Reducing the turn-off loss of the IGBT can lead to an improvement in switching speed of the IGBT. Thus, the performance of the semiconductor device can be improved.

Thus, in the present embodiment, the turn-off loss of the IGBT can be reduced by providing the embedded insulating film UZ, but the following advantageous effects can also be further obtained. This will be described with reference to a second examination example.

Figure 33:
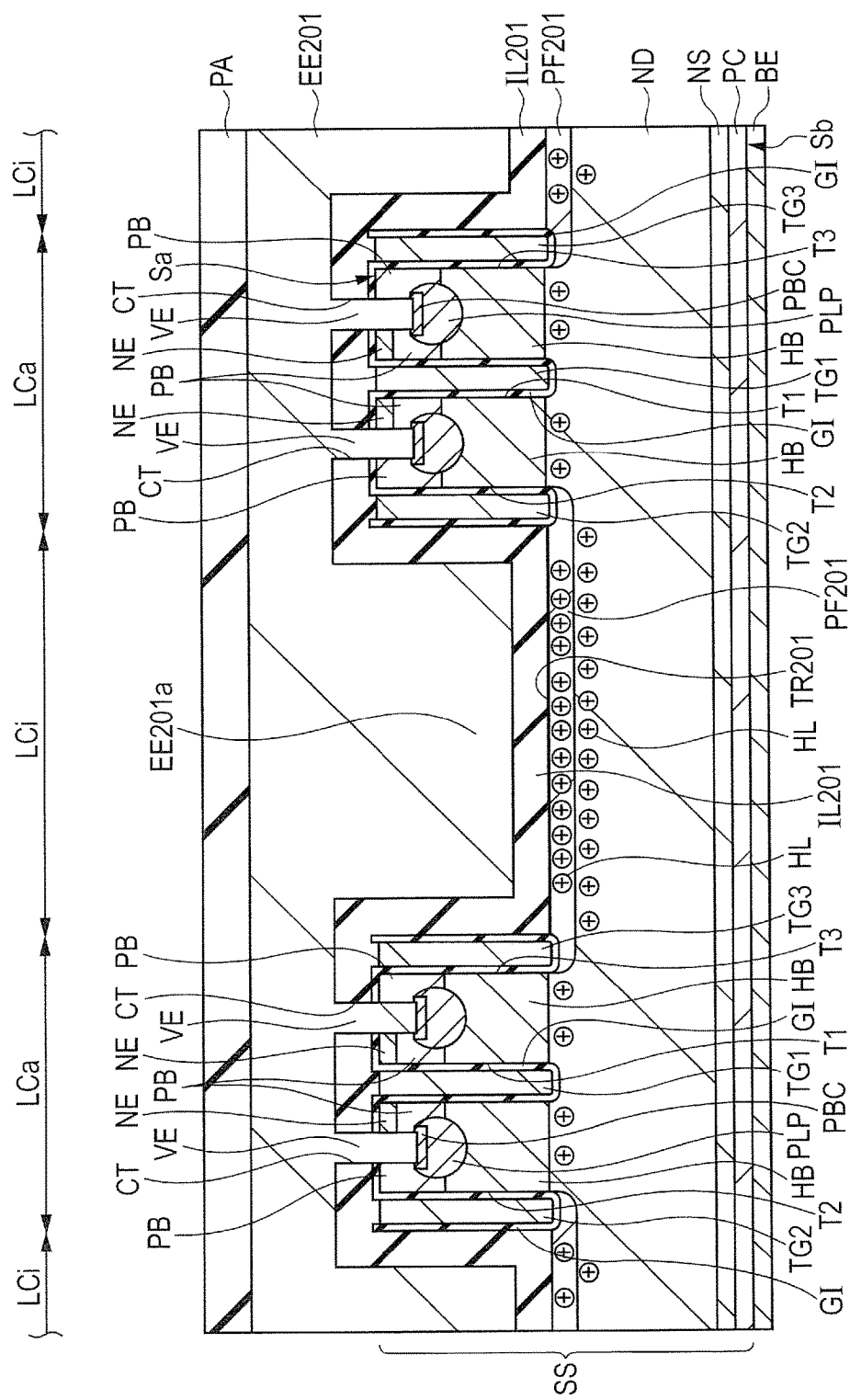
FIG. 33 is a fragmentary sectional diagram of a semiconductor device according to a second examination example.

FIG. 33 is a fragmentary sectional diagram of a semiconductor device according to the second examination example. A cross section corresponding to FIG. 31 or FIG. 32 is shown. A state in which positive holes HL are accumulated in an on state of the IGBT is shown even in FIG. 33.

In the semiconductor device according to the second examination example of FIG. 33, a trench TR201 is provided in a semiconductor substrate SS in an inactive cell region LCi. An interlayer insulating film IL201 is extended even the bottom face and side surface of the trench TR201. That is, in the semiconductor device according to the second examination example of FIG. 33, no embedded insulating film UZ is formed, and the interlayer insulating film IL201 is formed over the bottom face and side surface of the trench TR201 and the surface of the semiconductor substrate SS in an active cell region LCa. Am emitter electrode EE201 is formed over the interlayer insluting film IL201. In the semiconductor substrate SS, a p-type floating region PF201 is formed at a position adjacent to the bottom face of the trench TR201.

As shown in FIG. 33, in the semiconductor device according to the second examination example, the positive holes HL are accumulated in the on state of the IGBT. Main spots for accumulation of the positive holes HL include an n$^-$-type drift region ND below an n-type hole barrier region HB, an n$^-$-type drift region ND below the p-type floating region PF201, and the inside of the p-type floating region PF201.

In the semiconductor device according to the second examination example, the positive holes HL accumulated in the p-type floating region PF201 need not go beyond trench gate electrodes TG2 and TG3 though they are discharged to the emitter electrode EE201. Therefore, the time required to discharge the positive holes HL accumulated at the turning-on to the emitter electrode EE201 at the turning-off may be shortened as compared with the semiconductor device according to the first examination example.

The semiconductor device according to the second examination example shown in FIG. 33 will, however, cause the following problems.

That is, in the semiconductor device according to the second examination example shown in FIG. 33, the interlayer insulating film IL201 is formed over the bottom face and side surface of the trench TR201, and the emitter electrode EE201 is formed over the interlayer insulating film IL201. Therefore, the emitter electrode EE201 is in a state of being embedded into the trench TR201 through the interlayer insulating film IL201. The lower surface of the emitter electrode EE201 is not flat, and the emitter electrode EE201 (EE201a) to be a portion embedded into the trench TR201 is in a state of being projected downward (i.e., shape convex downward). Here, the emitter electrode EE201 to be the portion embedded into the trench TR201 will be referred to as an emitter electrode part EE201a with reference numeral EE201a attached thereto. The emitter electrode part EE201a exists in the inactive cell region LCi and is opposed to the semiconductor substrate SS (p-type floating region PF201) through the interlayer insulating film IL201. An interval (distance) between the emitter electrode part EE201a and the p-type floating region PF201 nearly coincides with the thickness of the interlayer insulating film IL201.

In the case of the semiconductor device according to the second examination example, since the distance between the emitter electrode part EE201a and a substrate region (p-type floating region PF201) located therebelow is short to a certain extent, the substrate region below the emitter electrode part EE201a is affected by a potential applied to the emitter electrode EE201. Since a high voltage is applied to a collector electrode (back electrode BE), and a voltage (ground potential, for example) lower than at the collector electrode (back electrode BE) is applied to the emitter electrode EE201 when the IGBT is on, the positive holes HL are attracted to the emitter electrode part EE201a side in the semiconductor substrate SS when the distance between the emitter electrode part EE201a and the substrate region (p-type floating region PF201) located therebelow is short. Therefore, the accumulated amount of positive holes HL in the substrate region (p-type floating region PF201) to be a portion opposite to the emitter electrode part EE201a through the interlayer insulating film IL201 interposed therebetween is increased as shown in FIG. 33.

When the accumulated positive holes HL are discharged to the emitter electrode EE201 (coupling electrode VE) when the IGBT is off, the time necessary for the positive holes HL accumulated in a region away from an active cell region LCa to be discharged to the emitter electrode EE201 is taken long. That is, the positive holes HL accumulated in the n$^-$-type drift region ND located below the n-type hole barrier region HB in the active cell region LCa are easy to be discharged to the emitter electrode EE201 (coupling electrode VE) upon turning-off of the IGBT because of being close to each contact trench CT. However, when the position of the accumulated positive holes HL becomes distant from the active cell region LCa, the positive holes HL become hard to be discharged to the emitter electrode EE201 (coupling electrode VE) when the IGBT is off. Therefore, the increase in the accumulated amount of positive holes HL in the substrate region (p-type floating region PF201) to be the portion opposite to the emitter electrode part EE201a through the interlayer insulating film IL201 will lead to the fact that the time required to discharge the positive holes HL accumulated at the turning-on to the emitter electrode EE201 (coupling electrode VE) at the turning-off becomes long.

Therefore, in the case of the semiconductor device according to the second examination example, there is a need to reduce the accumulated amount of positive holes HL in the substrate region (p-type floating region PF201) to be the portion opposite to the emitter electrode part EE201a through the interlayer insulating film IL201 in order to reduce the turn-off loss of the IGBT. To this end, the thickness of the interlayer insulating film IL201 must be made thick. If the interlayer insulating film IL201 is made thick, it is possible to suppress the accumulated amount of positive holes HL in the substrate region (p-type floating region PF201) to be the portion opposite to the emitter electrode part EE201a through the interlayer insulating film IL201 while suppressing the influence of the emitter electrode part EE201a.

In the semiconductor device according to the second examination example, however, it becomes hard to appropriately form each contact trench CT if the interlayer insulating film IL201 is made thick. For example, since an aspect ratio of the contact trench CT becomes large if the interlayer insulating film IL201 is made thick, it becomes hard to appropriately form the contact trench CT small in planar size. Therefore, when the interlayer insulating film IL201 is made thick, the planar size of the contact trench CT is required to be made large correspondingly. This will, however, lead to an increase in the cell size (size in the X direction of the active cell region LCa here) of the IGBT, thereby increasing the planar size (area) of the semiconductor device.

Alternatively if the interlayer insulating film IL201 is made thin in the semiconductor device according to the second examination example, the accumulated amount of positive holes HL in the substrate region (p-type floating region PF201) to be the portion opposite to the emitter electrode part EE201a through the interlayer insulating film IL201 is increased and hence the turn-off loss of the IGBT becomes large.

On the other hand, in the present embodiment, the embedded insulating film UZ is embedded into the trench TR, and the interlayer insulating film IL is formed over the embedded insulating film UZ. That is, the embedded insulating film UZ is provided in the inactive cell region LCi, and the interlayer insulating film IL is formed over the embedded insulating film UZ. That is, in the present embodiment, not only the interlayer insulating film IL but also the embedded insulating film UZ is interposed between the emitter electrode EE and the substrate region (p-type semiconductor region PF) located therebelow in the inactive cell region LCi. Therefore, in the present embodiment, the interval (distance) between the emitter electrode EE and the substrate region (p-type semiconductor region PF) located therebelow in the inactive cell region LCi substantially coincides with the sum of the thickness of the interlayer insulating film IL and the thickness of the embedded insulating film UZ. Incidentally, the substrate region corresponds to the region comprised of the part of the semiconductor substrate SS.

Therefore, the semiconductor device according to the present embodiment is capable of increasing the interval (distance) between the emitter electrode (EE, EE201a) and the substrate region (PF, PF201) located therebelow in the inactive cell region LCi as compared with the semiconductor device according to the second examination example of FIG. 33. For example, when the thickness of the interlayer insulating film IL201 and the thickness of the interlayer insulating film IL are the same, the interval (distance) between the emitter electrode EE and the substrate region located therebelow in the inactive cell region LCi can be enlarged by the thickness of the embedded insulating film UZ in the semiconductor device according to the present embodiment as compared with the semiconductor device according to the second examination example of FIG. 33.

Thus, in the present embodiment, since the interval (distance) between the emitter electrode EE and the substrate region located therebelow in the inactive cell region LCi can be made large, the accumulated amount of positive holes HL in the substrate region in the inactive cell region LCi can be suppressed while suppressing the influence of the emitter electrode EE in the substrate region in the inactive cell region LCi. That is, the semiconductor device according to the present embodiment is capable of suppressing the accumulated amount of positive holes HL in the substrate region in the inactive cell region LCi as compared with the semiconductor device according to the second examination example of FIG. 33. In the present embodiment, the accumulated amount of positive holes HL in the substrate region in the inactive cell region LCi taken in time for discharge at the turning-off can be suppressed while ensuring the accumulated amount of positive holes HL in the $n^-$-type drift region ND located below the n-type hole barrier region HB.

Thus, the semiconductor device according to the present embodiment is capable of shorting the time required to discharge the positive holes HL accumulated at the turning-on to the emitter electrode EE (coupling electrode VE) at the turning-off as compared with the semiconductor device according to the second examination example of FIG. 33 described above. That is, in the semiconductor device according to the present embodiment shown in FIG. 32 as compared with the semiconductor device according to the second examination example of FIG. 33, the time (turn-off loss) from execution of the off operation to the current ceasing to flow after the IGBT is turned off can be made to be shorter (smaller). Accordingly, the performance of the semiconductor device can be more improved.

Also, since the semiconductor device according to the second examination example of FIG. 33 and the semiconductor device according to the present embodiment of FIG. 32 are both provided with the n-type hole barrier region HB, the amount of the positive holes HL accumulated in the $n^-$-type drift region ND located below the n-type hole barrier region HB is substantially the same therebetween. Therefore, the semiconductor device according to the present embodiment of FIG. 32 is capable of obtaining an IE (Injection Enhancement) effect of the same degree as that of the semiconductor device according to the second examination example of FIG. 33 and reducing the turn-off loss more than the semiconductor device according to the second examination example of FIG. 33.

Further, in the case of the second examination example of FIG. 33, there is a need to increase the thickness of the interlayer insulating film IL201 in order to suppress the accumulated amount of positive holes HL in the substrate region in the inactive cell region LCi, whereas in the case of the present embodiment, it is not necessary to make the thickness of the interlayer insulating film IL thick because the embedded insulating film UZ is provided. Therefore, in the present embodiment, the thickness of the interlayer insulating film IL can be made thin while suppressing the accumulated amount of positive holes HL in the substrate region in the inactive cell region LCi. Since the thickness of the interlayer insulting film IL can be made thin in the present embodiment, even the contact trench CT small in planar size can be appropriately formed. Thus, it is possible to reduce the cell size (size in the X direction of the active cell region LCa herein) of the IGBT and achieve miniaturization (area reduction) of the semiconductor device.

Furthermore, in the present embodiment, the p-type semiconductor region (p-type floating region) PF is formed below the embedded insulating film UZ so as to adjoin the embedded insulating film UZ in the semiconductor substrate SS. The respective bottom faces of the trenches T2 and T3 are covered with the p-type semiconductor region PF. That is, the bottom face of the trench T2 (second trench) in the first IGBT cell region (active cell region LCa on the right side of FIG. 6, for example), and the bottom face of the trench T3 (sixth trench) in the second IGBT cell region (active cell region LCa on the left side of FIG. 6, for example) are covered with the p-type semiconductor region PF. The n⁻-type drift region ND exists below the p-type semiconductor region PF.

As a modification of the present embodiment, the p-type semiconductor region PF can also be omitted. Even in such a case, the effect of improving the turn-off loss as described above with the provision of the embedded insulating film UZ can be obtained. However, the p-type semiconductor region PF is preferably formed to achieve an improvement in breakdown voltage. Since the p-type semiconductor region PF is interposed between the bottom faces of the trenches T2 and T3 and the n⁻-type drift region ND low in impurity concentration with the formation of the p-type semiconductor region PF, it is possible to suppress or prevent electric field concentration in the neighborhood of the trench gate electrodes TG2 and TG3 when the IGBT is turned off and improve the breakdown voltage of the semiconductor device.

Figure 34:
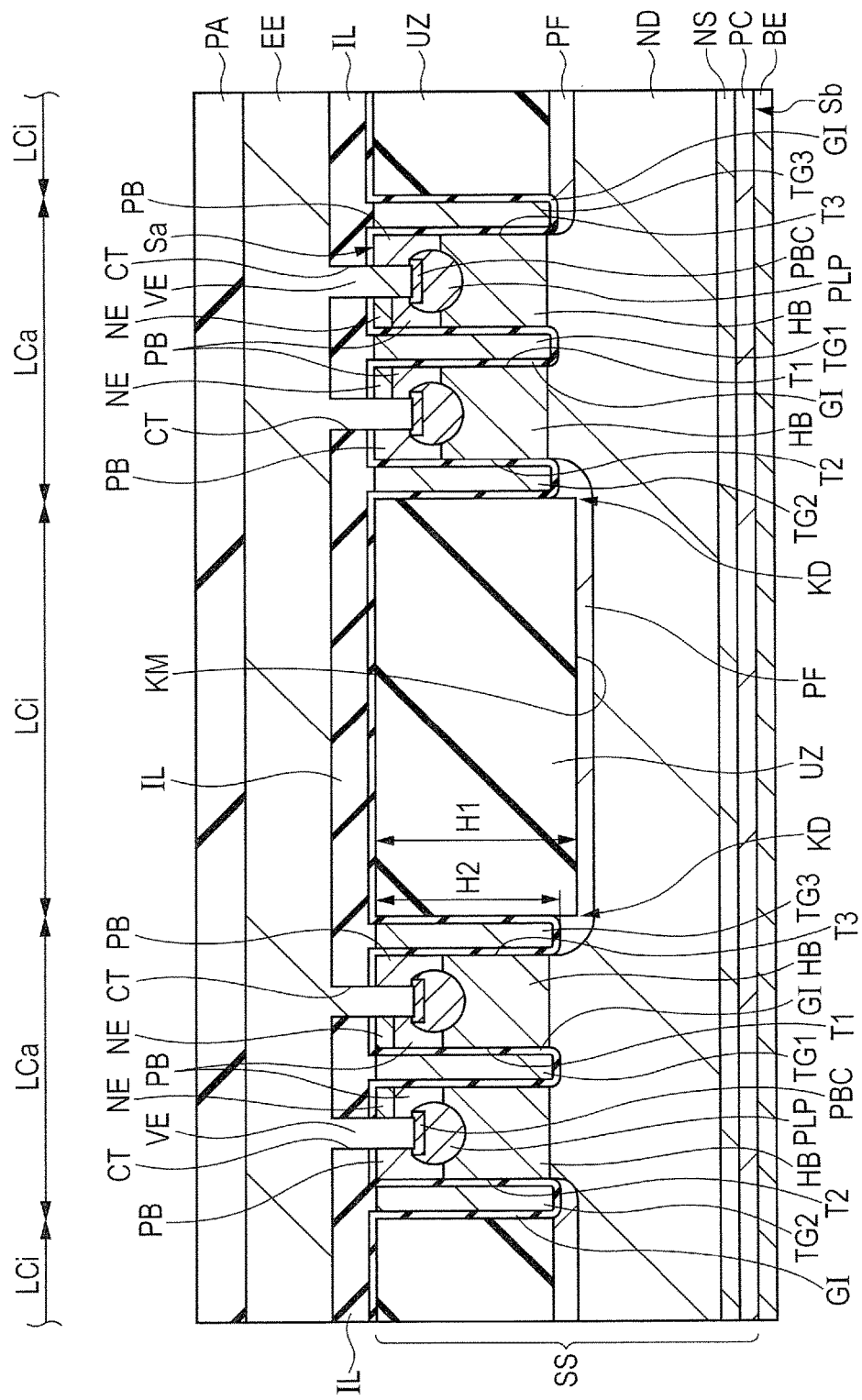
FIG. 34 is an explanatory diagram of the semiconductor device according to the one embodiment.
Figure 35:
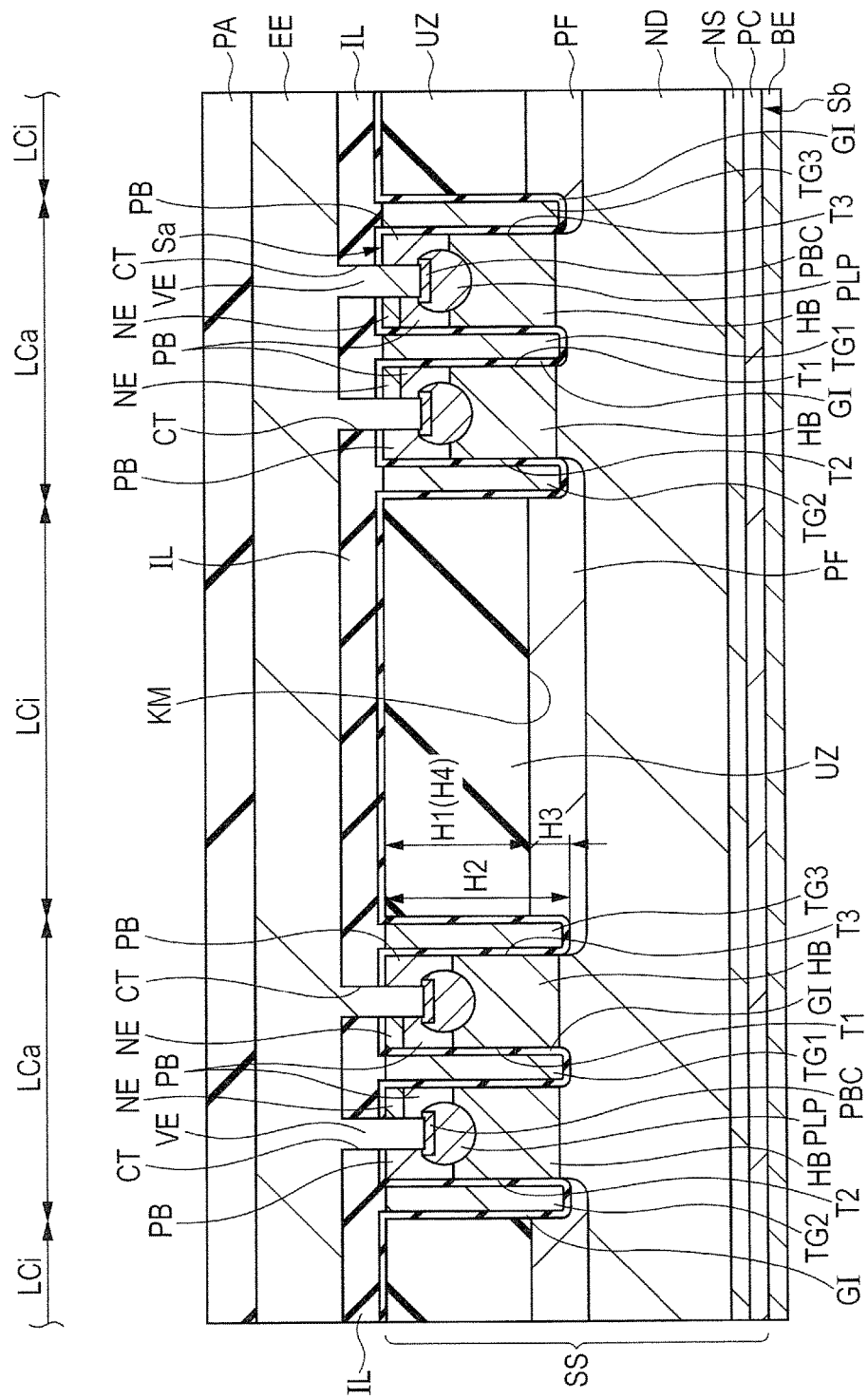
FIG. 35 is an explanatory diagram of the semiconductor device according to the one embodiment.

A preferable depth of the embedded insulating film UZ will next be described with reference to FIGS. 34 and 35. FIGS. 34 and 35 are explanatory diagrams of the semiconductor device according to the present embodiment. A cross section corresponding to FIG. 6 is shown in each figure.

In the case of FIG. 34, the depth (depth position) H1 of the bottom face (lower surface) KM of the embedded insulating film UZ is deeper than the depth (depth position) H2 of each of the bottom faces of the trenches T2 and T3 adjacent to the embedded insulating film UZ (i.e., H1>H2). In this case, the corner KD formed of the bottom face KM and side surface of the embedded insulting film UZ is surrounded by the substrate region and hence there is concern that unwanted electric field concentration will occur in the neighborhood of the corner KD of the embedded insulating film UZ. It is desirable to prevent the unwanted electric field concentration in the neighborhood of the corner KD of the embedded insulating film UZ in order to improve the reliability of the semiconductor device as much as possible.

Therefore, the depth H1 of the bottom face KM of the embedded insulating film UZ is preferably prevented from being made deeper than the depth H2 of each of the bottom faces of the trenches T2 and T3 adjacent to the embedded insulating film UZ. That is, it is preferable to avoid H1>H2. In other words, it is preferable to establish H1≤H2 as in the case of FIG. 6 and FIG. 35 described above. That is, it is preferable that the depth H1 of the bottom face KM of the embedded insulating film UZ is identical to the depth H2 of each of the bottom faces of the trenches T2 and T3 adjacent to the embedded insulating film UZ or made shallower than the depth H2. Thus, since the bottom face KM of the embedded insulating film UZ comes into contact with the substrate region but the side surface of the embedded insulating film UZ does not contact the substrate region, the corner formed of the bottom face KM and side surface of the embedded insulating film UZ is avoided from being surrounded by the substrate region, and hence the unwanted electric field concentration can be prevented from occurring in the neighborhood of the corner of the embedded insulating film UZ. Thus, it is possible to more improve the reliability of the semiconductor device.

In the case of FIG. 35, the depth (depth position) H1 of the bottom face (lower surface) KM of the embedded insulating film UZ is shallower than the depth (depth position) H2 of each of the bottom faces of the trenches T2 and T3 adjacent to the embedded insulating film UZ (i.e., H1<H2). In this case, there is a possibility of causing an increase in the turn-off loss depending on a difference H3 between the depth H1 of the bottom face KM of the embedded insulating film UZ and the depth H2 of each of the bottom faces of the trenches T2 and T3 adjacent to the embedded insulating film UZ. Here, H3=H2−H1.

That is, when the depth H1 of the bottom face KM of the embedded insulating film UZ is made shallow and the difference H3 is made large, the positive holes (HL) accumulated in the neighborhood of the bottom face KM of the embedded insulating film UZ must go beyond the trench gate electrodes TG2 and TG3 when an attempt to discharge the positive holes (HL) to the emitter electrode EE is made at the turning-off operation, so that the positive holes (HL) become hard to be discharged to the emitter electrode EE (coupling electrode VE). Therefore, the increase in the difference H3 leads to an increase in the turn-off loss.

Therefore, it is desirable that in order to achieve a reduction in the turn-off loss, the depth H1 of the bottom face KM of the embedded insulating film UZ is made deep to some extent and the difference H3 is made small to some extent. From this point of view, the difference H3 is preferably less than or equal to ¹⁄₁₀ of the thickness H4 of the embedded insulating film UZ (i.e., H3≤H4×¹⁄₁₀). Thus, even though the positive holes (HL) are accumulated in the neighborhood of the bottom face KM of the embedded insulating film UZ at the turning-on operation, the time required to discharge the positive holes (HL) to the emitter electrode EE (coupling electrode VE) at the turning-off operation can be shortened, thereby making it possible to appropriately obtain the effect of suppressing the turn-off loss by providing the embedded insulating film UZ.

Incidentally, the thickness H4 of the embedded insulating film UZ corresponds to the thickness in the direction approximately perpendicular to the upper surface of the embedded insulating film UZ and is substantially the same as the depth H1 of the embedded insulating film UZ (i.e., H4=H1).

Thus, it is preferable that the depth H1 of the bottom face (lower surface) KM of the embedded insulating film UZ is made identical to or shallower than the depth H2 of each of the bottom faces of the trenches T2 and T3 adjacent to the embedded insulating film UZ, and the difference H3 therebetween is less than or equal to ¹⁄₁₀ of the thickness H4 of the embedded insulating film UZ (i.e., H1≤H2 and H2−H1≤H4×¹⁄₁₀). Further, if the depths H1 and H2 are the same (H1=H2), i.e., H3=0, the turn-off loss can most preferably be controlled most efficiently while preventing the unwanted electric field concentration in the neighborhood of the corner of the embedded insulating film UZ.

Further, in the present embodiment, as the active cell region LCa, the so-called EGE type active cell region is adopted in which the trench gate electrode TG1 electrically coupled to the gate electrode GE is interposed by the two trench gate electrodes TG2 and TG3 electrically coupled to the emitter electrode EE. Thus, as compared with the case where the so-called GG type (gate-gate type) active cell region is adopted, it is possible to reduce an influence affecting to a gate potential by a displacement current generated in the active cell region upon a switching operation when an inductor is coupled as a load. Therefore, the performance of the semiconductor device can be more improved. Here, the GG type active cell region is comprised of two trench gate electrodes electrically coupled to a gate electrode GE, and a substrate region interposed between the two trench gate electrodes.

<Concerning Electronic System Using Semiconductor Device>

Figure 36:
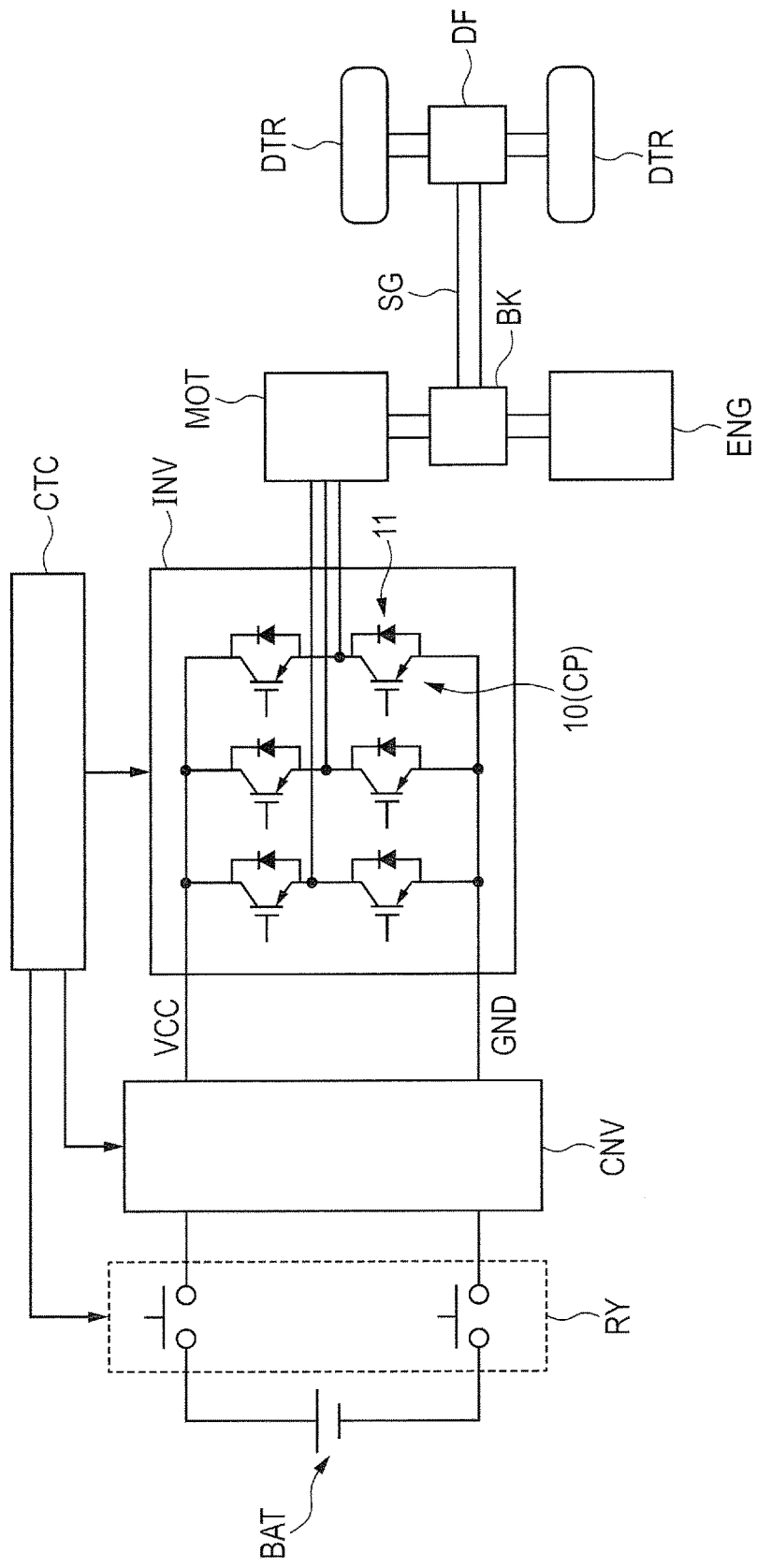
FIG. 36 is an explanatory diagram showing one example of an electronic system using the semiconductor device according to the one embodiment.

A description will next be made about one example of an electronic system (electronic apparatus) using the semiconductor device CP according to the present embodiment. FIG. 36 is an explanatory diagram (circuit block diagram) showing one example of the electronic system (electronic apparatus) using the semiconductor device CP according to the present embodiment, an electric vehicle system herein.

The electronic system shown in FIG. 36, the electric vehicle system herein has a load such as a motor MOT, an inverter (inverter circuit) INV, a power supply BAT, and a control unit (control circuit, controller) CTC. As the motor MOT, a three-phase motor is used herein. The three-phase motor is configured to be driven by three-phase voltages different in phase. The semiconductor device CP is a component of the inverter INV.

In the electronic system of FIG. 36, the power supply BAT is coupled to the inverter INV through a relay RY and a converter (boost converter) CNV to supply a voltage (power) of the power supply BAT to the inverter INV. Since the converter CNV is interposed between the power supply BAT and the inverter INV, the voltage (dc voltage) of the power supply BAT is converted (boosted) to a voltage suitable for motor driving by the converter CNV, followed by being supplied to the inverter INV. The relay RY is interposed between the power supply BAT and the converter CNV and is capable of switching whether a coupling state or a cutoff state is made between the power supply BAT and the converter CNV.

Further, the motor MOT is coupled to the inverter INV. The dc voltage (dc power) supplied from the power supply BAT to the inverter INV through the converter CNV is converted into an ac voltage (ac power) by the inverter INV, followed by being supplied to the motor MOT. The motor MOT is driven by the ac voltage (ac power) supplied from the inverter INV.

The motor MOT is capable of rotating (driving) car tires (wheels) or the like.

In the case of a hybrid vehicle, for example, an output shaft of a motor MOT and an output shaft of an engine ENG are combined by a power distribution mechanism BK, and the resultant torque is transferred to a car axle SG. The car axle SG is linked with drive wheels DTR via a differential DF. In cases such as where a large driving force is required, the motor MOT is driven with the engine ENG so that their output torques are combined by the power distribution mechanism BK. They are transferred to the drive wheels DTR via the car axle SG to enable the drive wheels DTR to be driven. In cases such as where the large driving force is not required so much (e.g., when running at a constant speed), the engine ENG is stopped and the drive wheels DTR can be driven by the motor MOT alone. Further, the hybrid vehicle needs the engine ENG in addition to the motor MOT, but an electric vehicle having no engine is capable of omitting the engine ENG.

The control unit CTC is also coupled to the inverter INV, and the inverter INV is controlled by the control unit CTC.

That is, the dc voltage (dc power) is supplied from the power supply BAT to the inverter INV and converted into the ac voltage (ac power) by the inverter INV controlled by the control unit CTC, followed by being supplied to the motor MOT, whereby the motor MOT can be driven. The control unit CTC is comprised of, for example, an ECU (Electronic Control Unit) and includes a semiconductor chip for control like an MCU (Micro Controller Unit) built therein. The relay RY and the converter CNV can also be controlled by the control unit CTC.

The inverter INV has six IGBTs 10 and six diodes (free wheel diodes) 11 in correspondence to three phases. Each IGBT 10 is comprised of the semiconductor device CP. That is, the inverter INV of FIG. 36 includes the six semiconductor devices CP. One of them configures one IGBT 10. The inverter INV includes six pairs in total, each corresponding to a pair of the IGBTs 10 and the diodes 11 because the motor MOT is of the three-phase motor. When the motor MOT is a two-phase motor, the inverter INV includes four pairs in total, each corresponding to a pair of the IGBTs 10 and the diodes 11.

That is, in each of the three phases, the IGBTs 10 and the diodes 11 are coupled in revere-parallel between a power supply potential (VCC) supplied from the power supply BAT to the inverter INV through the converter CNV and an input potential of the motor MOT. The IGBTs 10 and the diodes 11 are coupled in reverse-parallel even between the input potential of the motor MOT and the ground potential (GND). That is, the two IGBTs 10 and the two diodes 11 are provided for each phase, and the IGBTs 10 and the diodes 11 respectively corresponding to six in total are provided for the three phases. Further, the control unit CTC is coupled to a gate electrode of each individual IGBT 10, and the IGBT 10 is controlled by the control unit CTC.

A current flowing through each IGBT 10 is controlled by the control unit CTC to thereby drive (rotate) the motor MOT. That is, the motor MOT can be driven by controlling on/off of each IGBT 10 by the control unit CTC. Thus, when the motor MOT is driven, the IGBT 10 is required to be turned on/off, but the motor MOT includes inductance therein. Thus, when the IGBT 10 is turned off, a backward current in the direction opposite to the direction in which the current of the IGBT 10 flows is generated by the inductance included in the motor MOT. Since the IGBT 10 has no function of causing the backward current to flow, the backward current is fed back by providing each diode 11 in reverse parallel with the IGBT 10 to release energy accumulated in the inductance.

Thus, the electronic system or electronic apparatus according to the present embodiment has the semiconductor devices CP respectively electrically coupled to the power supply (BAT) and the load (motor MOT herein) to drive the load, and the control unit (CTC) which controls each semiconductor device CP.

In the electronic system shown in FIG. 36, the dc voltage (dc power) of the power supply BAT is converted into the ac voltage (ac power) by the inverter INV to drive the motor MOT. If the semiconductor device CP according to the present embodiment is applied to the electronic system shown in FIG. 36, it is possible to reduce the turn-off loss of the IGBT 10 configured of the semiconductor device CP and improve the switching speed of the IGBT 10 as described above. Therefore, the efficiency of the inverter INV can be improved and an improvement in the performance of the entire electronic system can be achieved. Further, a semiconductor device according to an embodiment 2 to be described later can also be applied to the electronic system of FIG. 36.

Embodiment 2

Figure 37:
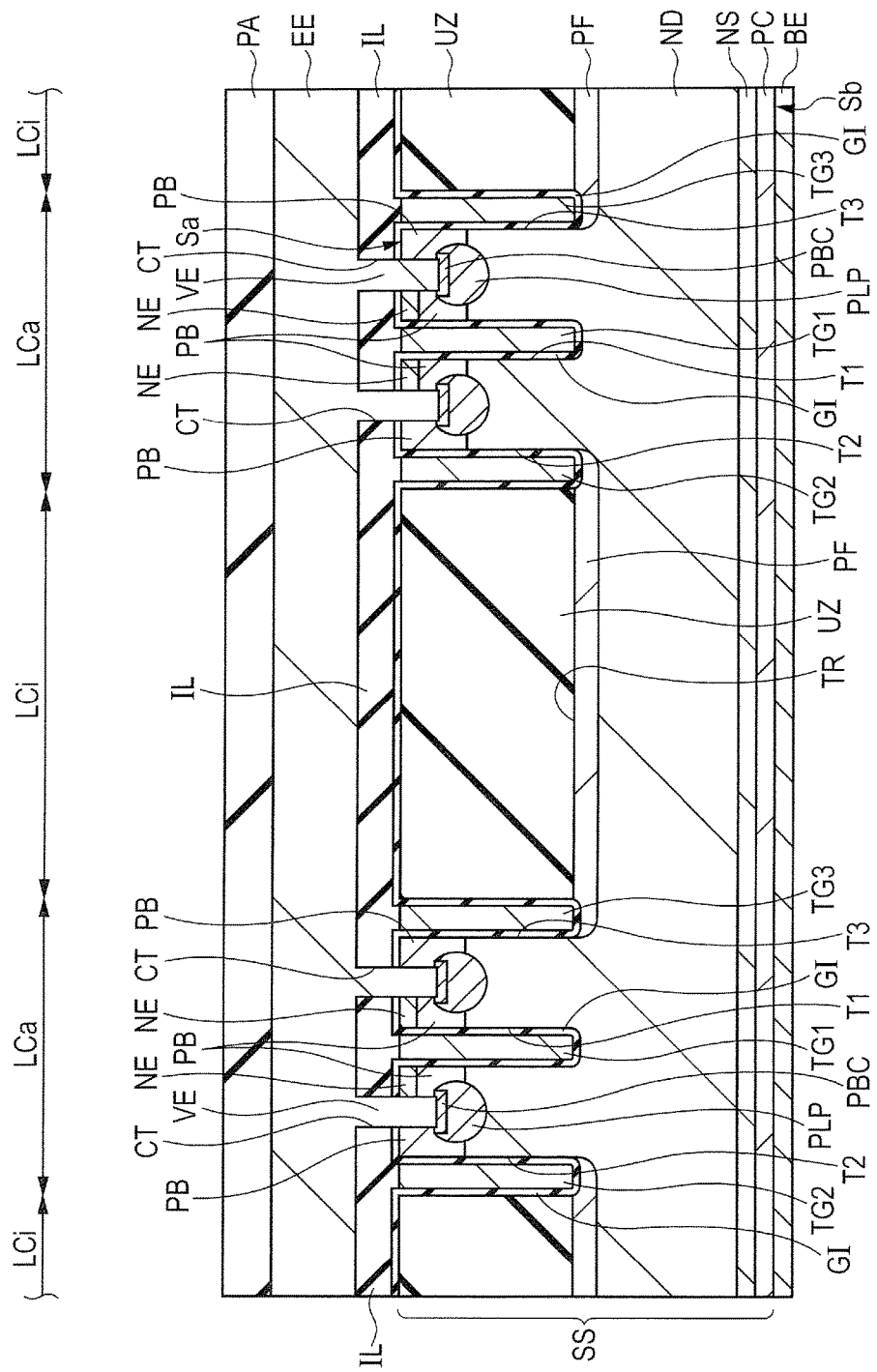
FIG. 37 is a fragmentary sectional diagram of a semiconductor device according to another embodiment.

FIG. 37 is a fragmentary sectional diagram of the semiconductor device according to the present embodiment 2. A cross section corresponding to FIG. 6 showing the embodiment 1 described above is shown.

The semiconductor device according to the present embodiment 2 shown in FIG. 37 is different from the semiconductor device according to the embodiment 1 in that no n-type hole barrier region HB is formed in the semiconductor device according to the present embodiment 2. Therefore, the region formed with the n-type hole barrier region HB in the semiconductor device (FIG. 6) according to the embodiment 1 serves as a part of an n⁻-type drift region ND in the semiconductor device (FIG. 37) according to the present embodiment. Since the semiconductor device according to the present embodiment 2 is also similar to the semiconductor device according to the embodiment 1 besides that, its repetitive description will be omitted here.

Since the n-type hole barrier region HB is not formed in the semiconductor device according to the present embodiment 2 shown in FIG. 37, it is possible to reduce the amount of positive holes accumulated in an active cell region LCa in an on state of an IGBT. Therefore, a turn-off loss can be further reduced. Accordingly, a switching speed of the IGBT can be more improved.

On the other hand, since the n-type hole barrier region HB is formed in the semiconductor device according to the embodiment 1, it is possible to accumulate the positive holes in the n⁻-type drift region ND located below the n-type hole barrier region HB in the on state of the IGBT. Thus, it is possible to enhance the IE effect and reduce the on voltage (on resistance) of the IGBT.

Thus, when priority is given to a further improvement in the switching speed of the IGBT, the semiconductor device according to the present embodiment 2 shown in FIG. 37 can be applied. On the other hand, when a reduction in the on voltage (on resistance) of the IGBT is also achieved while improving the switching speed of the IGBT, the semiconductor device according to the embodiment 1 can be applied.

Although the invention made above by the present inventors has been described specifically on the basis of the preferred embodiments, the present invention is not limited to the embodiments referred to above. It is needless to say that various changes can be made thereto within the scope not departing from the gist thereof.

What is claimed is:

1. A semiconductor device equipped with an Insulated Gate Bipolar Transistor (IGBT), the semiconductor device comprising:
    a semiconductor substrate having a first main surface and a second main surface on a side opposite to a side of the first main surface;
    a collector region of a first conductivity type formed on the second main surface side within the semiconductor substrate;
    a collector electrode formed over the second main surface of the semiconductor substrate and electrically coupled to the collector region;
    a drift region of a second conductivity type opposite to the first conductivity type, which is formed over the collector region within the semiconductor substrate;
    a first IGBT cell region and a second IGBT cell region formed on the first main surface side of the semiconductor substrate and disposed apart from each other in a first direction in a plan view;
    an embedded insulating film formed on the first main surface side of the semiconductor substrate and disposed between the first IGBT cell region and the second IGBT cell region in the plan view;
    an interlayer insulating film formed over the first IGBT cell region, the second IGBT cell region, and the embedded insulating film; and
    an emitter electrode formed over the interlayer insulting film,
    wherein, in the first direction, a width of the embedded insulating film is greater than a width of the first IGBT cell region and a width of the second IGBT cell region.

2. The semiconductor device according to claim 1, wherein the first main surface of the semiconductor substrate in the first IGBT cell region, the first main surface of the semiconductor substrate in the second IGBT cell region, and an upper surface of the embedded insulating film are at a same height.

3. The semiconductor device according to claim 1, wherein an upper surface of the interlayer insulating film is flat above the embedded insulating film.

4. The semiconductor device according to claim 3, wherein a lower surface of the emitter electrode is flat above the embedded insulating film.

5. The semiconductor device according to claim 1, wherein the embedded insulating film and the interlayer insulting film are interposed between the emitter electrode to be a portion positioned above the embedded insulating film and the semiconductor substrate to be a portion positioned below the embedded insulating film.

6. The semiconductor device according to claim 1, further comprising a gate electrode formed over the interlayer insulating film,
    wherein the first IGBT cell region includes:
        a first trench formed on the first main surface side of the semiconductor substrate and extending in a second direction crossing the first direction in the plan view;
        a second trench and a third trench formed on the first main surface side of the semiconductor substrate, disposed on both sides with the first trench interposed therebetween, and extending in the second direction in the plan view;
        a first trench gate electrode formed within the first trench through a first insulating film;
        a first trench electrode formed within the second trench through a second insulating film; and
        a second trench electrode formed within the third trench through a third insulating film,
    wherein the second IGBT cell region includes:
        a fourth trench formed on the first main surface side of the semiconductor substrate and extending in the second direction in the plan view;
        a fifth trench and a sixth trench formed on the first main surface side of the semiconductor substrate, disposed on both sides with the fourth trench interposed therebetween, and extending in the second direction in the plan view;
        a second trench gate electrode formed within the fourth trench through a fourth insulating film;
        a third trench electrode formed within the fifth trench through a fifth insulating film; and
        a fourth trench electrode formed within the sixth trench through a sixth insulating film, wherein the first trench electrode, the second trench electrode, the third trench electrode, and the fourth trench electrode are electrically coupled to the emitter electrode, wherein the first trench gate electrode and the second trench gate electrode are electrically coupled to the gate electrode, and wherein the embedded insulating film is adjacent to the second trench in the first IGBT cell region in the first direction and adjacent to the sixth trench in the second IGBT cell region in the first direction.

7. The semiconductor device according to claim 6, wherein a substrate region comprised of the semiconductor substrate is not interposed between the embedded insulating film and the second trench electrode and between the embedded insulating film and the fourth trench electrode.

8. The semiconductor device according to claim 6, wherein, in the semiconductor substrate, a first semiconductor region of the first conductivity type is formed below the embedded insulating film to be adjacent to the embedded insulating film, and wherein a bottom face of the second trench and a bottom face of the sixth trench are covered with the first semiconductor region.

9. The semiconductor device according to claim 8, wherein the drift region exists below the first semiconductor region.

10. The semiconductor device according to claim 6, wherein the first IGBT cell region further includes:
a first channel forming region of the first conductivity type formed on the first main surface side in the semiconductor substrate to be a portion interposed between the first trench and the second trench;
a first emitter region of the second conductivity type formed at an upper portion of the first channel forming region and at a position adjacent to the first trench in the semiconductor substrate to be the portion interposed between the first trench and the second trench;
a second channel forming region of the first conductivity type formed on the first main surface side in the semiconductor substrate to be a portion interposed between the first trench and the third trench; and
a second emitter region of the second conductivity type formed at an upper portion of the second channel forming region and at a position adjacent to the first trench in the semiconductor substrate to be the portion interposed between the first trench and the third trench, and wherein the second IGBT cell region further includes:
a third channel forming region of the first conductivity type formed on the first main surface side in the semiconductor substrate to be a portion interposed between the fourth trench and the fifth trench;
a third emitter region of the second conductivity type formed at an upper portion of the third channel forming region and at a position adjacent to the fourth trench in the semiconductor substrate to be the portion interposed between the fourth trench and the fifth trench;
a fourth channel forming region of the first conductivity type formed on the first main surface side in the semiconductor substrate to be a portion interposed between the fourth trench and the sixth trench; and
a fourth emitter region of the second conductivity type formed at an upper portion of the fourth channel forming region and at a position adjacent to the fourth trench in the semiconductor substrate to be the portion interposed between the fourth trench and the sixth trench.

11. The semiconductor device according to claim 10, further comprising:
a first contact trench which penetrates through the interlayer insulating film and is formed by digging in a part of the semiconductor substrate to be the portion interposed between the first trench and the second trench;
a first coupling electrode embedded into the first contact trench;
a second contact trench which penetrates through the interlayer insulating film and is formed by digging in a part of the semiconductor substrate to be the portion interposed between the first trench and the third trench;
a second coupling electrode embedded into the second contact trench;
a third contact trench which penetrates through the interlayer insulating film and is formed by digging in a part of the semiconductor substrate to be the portion interposed between the fourth trench and the fifth trench;
a third coupling electrode embedded into the third contact trench;
a fourth contact trench which penetrates through the interlayer insulating film and is formed by digging in a part of the semiconductor substrate to be the portion interposed between the fourth trench and the sixth trench; and
a fourth coupling electrode embedded into the fourth contact trench, wherein the first coupling electrode is electrically coupled to the first channel forming region and the first emitter region and electrically coupled to the emitter electrode, wherein the second coupling electrode is electrically coupled to the second channel forming region and the second emitter region and electrically coupled to the emitter electrode, wherein the third coupling electrode is electrically coupled to the third channel forming region and the third emitter region and electrically coupled to the emitter electrode, and wherein the fourth coupling electrode is electrically coupled to the fourth channel forming region and the fourth emitter region and electrically coupled to the emitter electrode.

12. The semiconductor device according to claim 11, wherein the first coupling electrode, the second coupling electrode, the third coupling electrode, and the fourth coupling electrode are formed integrally with the emitter electrode.

13. The semiconductor device according to claim 11, wherein the first IGBT cell region further includes:
a first hole barrier region of the second conductivity type formed below the first channel forming region in the semiconductor substrate to be the portion interposed between the first trench and the second trench; and
a second hole barrier region of the second conductivity type formed below the second channel forming region in the semiconductor substrate to be the portion interposed between the first trench and the third trench, wherein the second IGBT cell region further includes:
a third hole barrier region of the second conductivity type formed below the third channel forming region in the semiconductor substrate to be the portion interposed between the fourth trench and the fifth trench; and a fourth hole barrier region of the second conductivity type formed below the fourth channel forming region in the semiconductor substrate to be the portion interposed between the fourth trench and the sixth trench, wherein the drift region exists below the first hole barrier region, the second hole barrier region, the third hole barrier region, and the fourth hole barrier region, and wherein the first hole barrier region, the second hole barrier region, the third hole barrier region, and the fourth hole barrier region are respectively higher in impurity concentration than the drift region.

14. The semiconductor device according to claim 6, wherein a depth of a bottom face of the embedded insulating film is not deeper than a depth of each of the bottom faces of the second and sixth trenches.

15. The semiconductor device according to claim 14, wherein a difference between the depth of the bottom face of the embedded insulating film and the depth of each of the bottom faces of the second and sixth trenches is less than or equal to 1/10 of a thickness of the embedded insulating film.

16. The semiconductor device according to claim 6, wherein the depth of the bottom face of the embedded insulating film is the same as the depth of each of the bottom faces of the second and sixth trenches.

17. A semiconductor device equipped with an Insulated Gate Bipolar Transistor (IGBT), the semiconductor device comprising:
a semiconductor substrate having a first main surface and a second main surface on a side opposite to a side of the first main surface;
a collector region of a first conductivity type formed on the second main surface side within the semiconductor substrate;
a collector electrode formed over the second main surface of the semiconductor substrate and electrically coupled to the collector region;
a drift region of a second conductivity type opposite to the first conductivity type, which is formed over the collector region within the semiconductor substrate;
a first IGBT cell region and a second IGBT cell region formed on the first main surface side of the semiconductor substrate and disposed apart from each other in a first direction in a plan view;
an embedded insulating film formed on the first main surface side of the semiconductor substrate and disposed between the first IGBT cell region and the second IGBT cell region in the plan view;
an interlayer insulating film formed over the first IGBT cell region, the second IGBT cell region, and the embedded insulating film; and
an emitter electrode and a gate electrode formed over the interlayer insulting film,
wherein the first IGBT cell region includes:
a first trench formed on the first main surface side of the semiconductor substrate and extending in a second direction crossing the first direction in the plan view;
a second trench and a third trench formed on the first main surface side of the semiconductor substrate, disposed on both sides with the first trench interposed therebetween, and extending in the second direction in the plan view;
a first trench gate electrode formed within the first trench through a first insulating film;
a first trench electrode formed within the second trench through a second insulating film; and
a second trench electrode formed within the third trench through a third insulating film,
wherein the second IGBT cell region includes:
a fourth trench formed on the first main surface side of the semiconductor substrate and extending in the second direction in the plan view;
a fifth trench and a sixth trench formed on the first main surface side of the semiconductor substrate, disposed on both sides with the fourth trench interposed therebetween, and extending in the second direction in the plan view;
a second trench gate electrode formed within the fourth trench through a fourth insulating film;
a third trench electrode formed within the fifth trench through a fifth insulating film; and
a fourth trench electrode formed within the sixth trench through a sixth insulating film,
wherein the first trench electrode, the second trench electrode, the third trench electrode, and the fourth trench electrode are electrically coupled to the emitter electrode,
wherein the first trench gate electrode and the second trench gate electrode are electrically coupled to the gate electrode,
wherein the embedded insulating film is adjacent to the second trench in the first IGBT cell region in the first direction and adjacent to the sixth trench in the second IGBT cell region in the first direction,
wherein in the semiconductor substrate, a first semiconductor region of the first conductivity type is formed below the embedded insulating film to be adjacent to the embedded insulating film, and
wherein a bottom face of the second trench and a bottom face of the sixth trench are covered with the first semiconductor region.

18. The semiconductor device according to claim 1, further comprising a gate electrode formed over the interlayer insulating film,
wherein the first IGBT cell region includes:
a first trench formed on the first main surface side of the semiconductor substrate and extending in a second direction crossing the first direction in the plan view; and
a second trench and a third trench formed on the first main surface side of the semiconductor substrate, disposed on both sides with the first trench interposed therebetween, and extending in the second direction in the plan view.

19. The semiconductor device according to claim 18, wherein the first IGBT cell region further includes:
a first trench gate electrode formed within the first trench through a first insulating film;
a first trench electrode formed within the second trench through a second insulating film; and
a second trench electrode formed within the third trench through a third insulating film.

20. The semiconductor device according to claim 19, wherein the second IGBT cell region includes:
a fourth trench formed on the first main surface side of the semiconductor substrate and extending in the second direction in the plan view; and
a fifth trench and a sixth trench formed on the first main surface side of the semiconductor substrate, disposed on both sides with the fourth trench interposed therebetween, and extending in the second direction in the plan view.

* * * * *